(12) United States Patent
Dolan et al.

(10) Patent No.: US 9,354,813 B1
(45) Date of Patent: May 31, 2016

(54) DATA STORAGE SYSTEM MODELING

(71) Applicants: Sean C. Dolan, Belmont, MA (US);
Sachin More, Northborough, MA (US);
Hui Wang, Upton, MA (US); Xiaomei Liu, Natick, MA (US); Marik Marshak, Newton, MA (US)

(72) Inventors: Sean C. Dolan, Belmont, MA (US);
Sachin More, Northborough, MA (US);
Hui Wang, Upton, MA (US); Xiaomei Liu, Natick, MA (US); Marik Marshak, Newton, MA (US)

(73) Assignee: EMC Corporation, Hopkinton, MA (US)

( * ) Notice: Subject to any disclaimer, the term of this patent is extended or adjusted under 35 U.S.C. 154(b) by 471 days.

(21) Appl. No.: 13/729,680

(22) Filed: Dec. 28, 2012

(51) Int. Cl.
*G06F 3/06* (2006.01)
*G06F 17/50* (2006.01)
*G06F 11/34* (2006.01)

(52) U.S. Cl.
CPC .............. *G06F 3/061* (2013.01); *G06F 3/0655* (2013.01); *G06F 3/0631* (2013.01); *G06F 3/0653* (2013.01); *G06F 11/3466* (2013.01); *G06F 11/3485* (2013.01); *G06F 17/5009* (2013.01)

(58) Field of Classification Search
None
See application file for complete search history.

(56) References Cited

U.S. PATENT DOCUMENTS

| | | | |
|---|---|---|---|
| 5,325,505 A * | 6/1994 | Hoffecker et al. | |
| 6,311,144 B1 * | 10/2001 | Abu El Ata | 703/2 |
| 7,389,379 B1 * | 6/2008 | Goel et al. | 711/112 |
| 7,757,013 B1 * | 7/2010 | Lawson et al. | 710/15 |
| 7,822,939 B1 | 10/2010 | Veprinsky et al. | |
| 7,945,657 B1 * | 5/2011 | McDougall et al. | 709/224 |
| 7,949,637 B1 * | 5/2011 | Burke | G06F 3/0605 707/655 |
| 8,074,092 B2 * | 12/2011 | Fung | 713/320 |
| 8,375,187 B1 * | 2/2013 | Chilton et al. | 711/167 |
| 8,631,280 B2 * | 1/2014 | Sankar et al. | 714/38.12 |
| 8,645,654 B1 * | 2/2014 | Bailey | G06F 3/0605 711/165 |
| 8,688,878 B1 | 4/2014 | Dolan et al. | |
| 8,838,931 B1 * | 9/2014 | Marshak | G06F 3/0605 710/74 |
| 8,843,714 B1 * | 9/2014 | Smirnov | G06F 11/3485 711/100 |
| 8,868,797 B1 * | 10/2014 | Kirac et al. | 710/15 |
| 8,868,798 B1 | 10/2014 | Marshak et al. | |
| 8,881,165 B2 * | 11/2014 | Chambliss et al. | 718/104 |
| 8,935,493 B1 | 1/2015 | Dolan et al. | |

(Continued)

*Primary Examiner* — Kibrom K Gebresilassie
(74) *Attorney, Agent, or Firm* — Muirhead and Saturnelli, LLC

(57) ABSTRACT

Described are modeling techniques. In accordance with one or more criteria, a determination may be made as to whether to use a dynamic model or a static model to model performance of components, such as storage devices, of a data storage system. A system may include first and second data storage systems where the first data storage system includes a computer readable medium with first code that performs processing in connection with data storage movement optimizations using one or more models including a dynamic model, and second code that generates and maintains the dynamic model used to model performance of storage devices. The second code may include code for performing first processing to determine device sets each of which does not share back-end resources of the second data storage system with any other device sets, and performing second processing to determine sets of performance curves corresponding to the device sets.

21 Claims, 23 Drawing Sheets

(56) References Cited

U.S. PATENT DOCUMENTS

| | | | | |
|---|---|---|---|---|
| 8,949,483 B1* | 2/2015 | Martin | | G06F 3/0653 710/15 |
| 8,949,654 B2* | 2/2015 | Hasit | | 714/4.1 |
| 8,972,694 B1* | 3/2015 | Dolan et al. | | 711/172 |
| 2002/0169932 A1* | 11/2002 | Burns | | G06F 3/0611 711/154 |
| 2004/0025162 A1* | 2/2004 | Fisk | | G06F 3/0613 718/105 |
| 2004/0054850 A1* | 3/2004 | Fisk | | H04L 41/08 711/112 |
| 2006/0095247 A1* | 5/2006 | O'Connell et al. | | 703/22 |
| 2009/0070541 A1* | 3/2009 | Yochai | | G06F 3/0605 711/165 |
| 2011/0061057 A1* | 3/2011 | Harris et al. | | 718/104 |
| 2011/0131174 A1* | 6/2011 | Birch et al. | | 707/607 |
| 2012/0047287 A1* | 2/2012 | Chiu | | G06F 3/0605 710/8 |
| 2012/0066473 A1* | 3/2012 | Tremaine et al. | | 711/206 |
| 2012/0102350 A1* | 4/2012 | Belluomini et al. | | 713/324 |
| 2012/0185736 A1* | 7/2012 | Sambamurthy et al. | | 714/47.3 |
| 2013/0036286 A1* | 2/2013 | Jin et al. | | 711/170 |
| 2013/0211809 A1* | 8/2013 | Maruyama | | 703/21 |
| 2013/0339599 A1* | 12/2013 | Sundrani | | 711/114 |
| 2014/0019701 A1* | 1/2014 | Ohira et al. | | 711/165 |
| 2014/0068582 A1* | 3/2014 | Chen et al. | | 717/149 |
| 2014/0156632 A1* | 6/2014 | Yu et al. | | 707/713 |

* cited by examiner

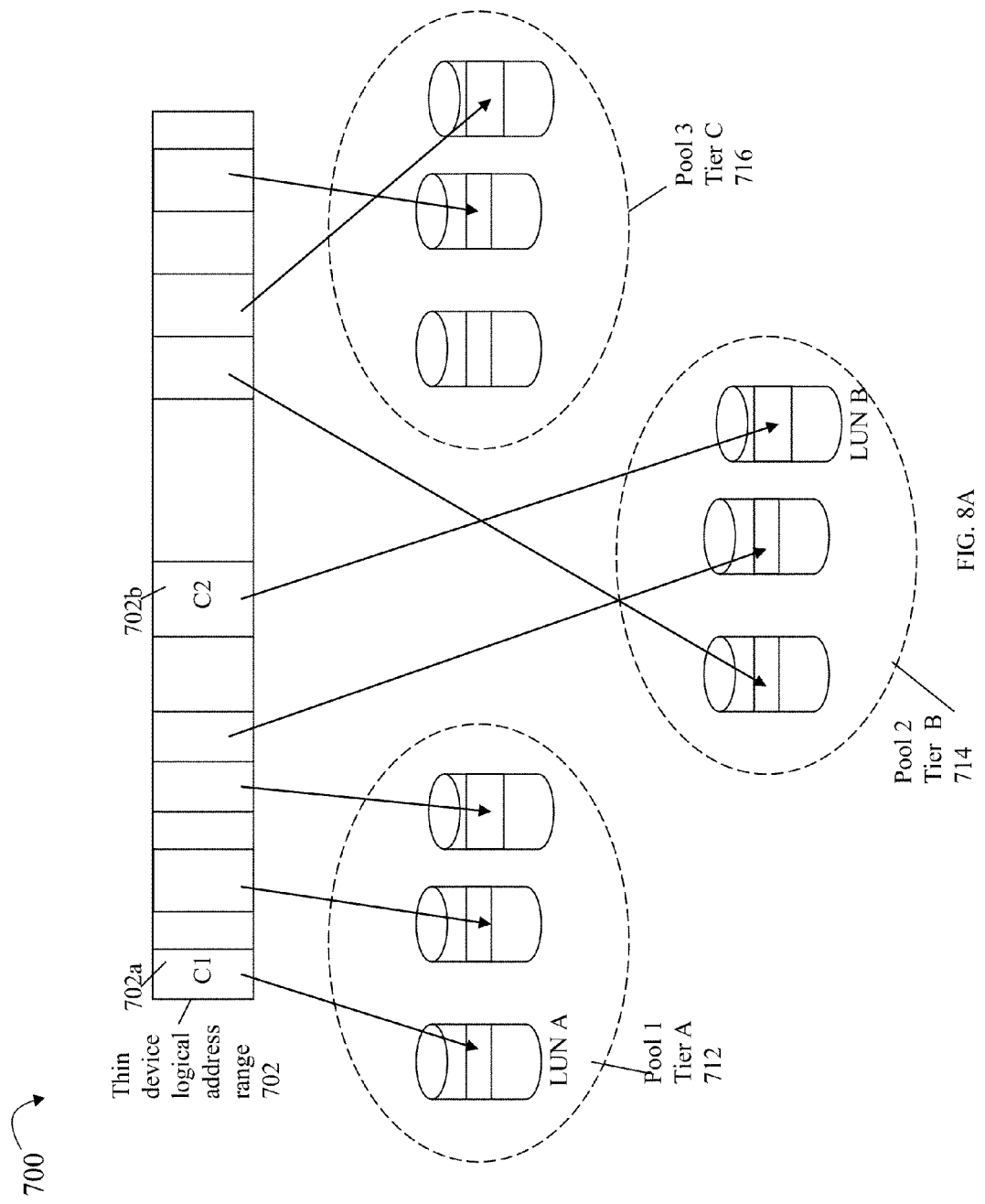

DATA STORAGE SYSTEM MODELING

BACKGROUND

1. Technical Field

This application generally relates to data storage, and more particularly to techniques used in connection with data storage system modeling.

2. Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. Such storage devices are provided, for example, by EMC Corporation of Hopkinton, Mass. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units, logical devices, or logical volumes (LVs). The logical disk units may or may not correspond to the actual disk drives. Allowing multiple host systems to access the single storage device unit allows the host systems to share data stored therein.

In connection with data storage, a variety of different technologies may be used. Data may be stored, for example, on different types of disk devices and/or flash memory devices. The data storage environment may define multiple storage tiers in which each tier includes physical devices or drives of varying technologies, performance characteristics, and the like. The physical devices of a data storage system, such as a data storage array, may be used to store data for multiple applications.

SUMMARY OF THE INVENTION

In accordance with one aspect of the invention is a method of modeling comprising determining, in accordance with one or more criteria, whether to use a dynamic model or a static model to model performance of one or more components of a data storage system; and modeling performance of the one or more components using the dynamic model if said determining indicates to use the dynamic model, and otherwise using the static model to model performance of the one or more components. The one or more components may include a first set of one or more storage devices of a data storage system, and the one or more criteria may include any of: using the dynamic model rather than the static model if calibration of the dynamic model is complete, and evaluating whether to use the dynamic model or the static model in accordance with a given workload of data operations directed to the first set of one or more of the storage devices for which performance is being modeled and in accordance with what portion of a set of one or more performance curves used by the dynamic model to model the first set of one or more storage devices has been calibrated. The steps of determining and modeling may be performed by code executing on a first data storage system that is connected to a second data storage system, and wherein the second data storage system may include the first set of one or more storage devices being modeled. The dynamic model may be generated by performing first processing, where said first processing may include generating the set of one or more performance curves to model response time of the first set of one or more storage devices for the given workload of data operations to the first set of one or more storage devices. The one or more criteria may include the status indicator and the status indicator may denote that calibration of the dynamic model is complete when the set of one or more performance curves have been generated. The first processing may include performing exploratory I/O testing for a plurality of queue depths and a plurality of I/O sizes to determine the set of one or more performance curves, wherein each of said plurality of queue depths represents an average number of I/O operations waiting to be serviced. The first processing may include determining whether the first set of one or more storage devices shares back-end resources of the second data storage system with a second set of one or more storage devices, said back-end resources including any of a same physical storage device and a same disk adapter. Determining whether the first set of one or more storage devices shares back-end resources with the second set of one or more storage devices may include issuing, for a first time period, I/O operations to the first set of one or more storage devices at a rate sufficient to maintain an average predetermined queue depth; obtaining a first average observed response time representing an average response time for I/O operations directed to the first set of one or more storage devices for the first time period; issuing, for a second time period, I/O operations to the first set of one or more storage devices and the second set of one or more storage devices at a rate sufficient to maintain the average predetermined queue depth for each of the first set of one or more storage devices and the second set of one or more storage devices; obtaining for the second period of time a second average observed response time representing an average response time for I/O operations directed to the first set of one or more storage devices for the second time period; determining a first quantity that is a mathematical product of the average predetermined queue depth multiplied by the first average observed response time, said first quantity represented modeled I/O throughput for the first time period for the first set of one or more storage devices; determining a second quantity that is a mathematical product of the average predetermined queue depth multiplied by the second average observed response time, said second quantity represented modeled I/O throughput for the second time period for the first set of one or more storage devices; and determining whether a difference between the first quantity and the second quantity is less than a predetermined threshold. If the difference is less than the predetermined threshold, it may be determined that the first set of one or more storage devices does not share back-end resources of the second data storage system with the second set of one or more storage devices. If the difference is not less than the predetermined threshold, it may be determined that the first set of one or more storage devices does share back-end resources of the second data storage system with the second set of one or more storage devices. A plurality of sets of one or more performance curves may be generated corresponding to a plurality of device sets, each of the device sets including one or more storage devices of the second data storage system, each of the plurality of sets representing performance curves modeling performance for a different one of the plurality of device sets, wherein each of the plurality of device sets is determined as not sharing back-end resources of the second data storage system with any other of the plurality of device sets. The set of one or more performance curves may be used to predict a response time for a given workload. Any of interpolation and extrapolation may be performed using the set of one or more performance curves to predict the response time for the given workload. Validation testing may be performed periodically to determine whether any adjustments to the set of one or more performance curves are needed. A different unreported workload estimate may be maintained for each of the plurality of sets of performance curves.

In accordance with another aspect of the invention is a system comprising: a first data storage system; a set of one or more hosts issuing data operations to the first data storage system; a second data storage system connected to the first data storage system, wherein the second data storage system includes a plurality of storage devices; and wherein the first data storage system includes a computer readable medium, the computer readable medium including first code stored thereon and second code stored thereon, said first code including code that performs processing in connection with data storage movement optimizations using one or more models including a dynamic model, and wherein said second code includes code that generates and maintains the dynamic model used to model performance of storage devices, the second code comprising code for: performing first processing to determine a plurality of device sets, each of the device sets including one or more of the plurality of storage devices of the second data storage system, wherein each of the plurality of device sets is determined as not sharing back-end resources of the second data storage system with any other of the plurality of device sets; and performing second processing to determine a plurality of sets of performance curves corresponding to the plurality of device sets, each of the plurality of sets of performance curves representing performance curves modeling performance for a different one of the plurality of device sets, wherein each of the plurality of device sets is determined as not sharing back-end resources of the second data storage system with any other of the plurality of device sets. The back-end resources may include any of a same physical storage device and a same disk adapter and wherein the first processing may include issuing, for a first time period, I/O operations to a first of the plurality of device sets at a rate sufficient to maintain an average predetermined queue depth; obtaining a first average observed response time representing an average response time for I/O operations directed to the first device set of one or more storage devices for the first time period; issuing, for a second time period, I/O operations to the first device set and a second of the plurality of device sets at a rate sufficient to maintain the average predetermined queue depth for each of the first device set and the second device set; obtaining for the second period of time a second average observed response time representing an average response time for I/O operations directed to the first device set for the second time period; determining a first quantity that is a mathematical product of the average predetermined queue depth multiplied by the first average observed response time, said first quantity represented modeled I/O throughput for the first time period for the first device set; determining a second quantity that is a mathematical product of the average predetermined queue depth multiplied by the second average observed response time, said second quantity represented modeled I/O throughput for the second time period for the first device set; determining whether a difference between the first quantity and the second quantity is less than a predetermined threshold; and determining that the difference is less than the predetermined threshold thereby indicating that the first device set does not share back-end resources of the second data storage system with the second device set of one or more storage devices. The second processing may include performing exploratory I/O testing for a plurality of queue depths and a plurality of I/O sizes to determine to the plurality of sets of performance curves, wherein each of said plurality of queue depths represents an average number of I/O operations waiting to be serviced. The second processing may include generating a first of the plurality of sets of performance curves for a first of the plurality of device sets, said generating comprising: issuing, for a plurality of time periods, I/O operations to the first device set, wherein for each of the plurality of time periods, I/O operations are issued at a rate sufficient to maintain a different average queue depth; obtaining, for each of the plurality of time periods, an average observed response time representing an average response time for I/O operations directed to the first device set for said each time period; determining, for each of the plurality of time periods, a first quantity that is a mathematical product of the average queue depth maintained while issuing I/O operations during said each time period multiplied by the average observed response time for said each time period, said first quantity representing modeled I/O throughput for said each time period for the first device set; determining a plurality of data points, each of said plurality of data points representing the average observed response time and the first quantity for one of the plurality of time periods; and producing one of the performance curves of the first set using the plurality of data points, wherein the I/O operations issued during said issuing are read operations expected to cause a cache miss and each of the I/O operations are of a same size.

In accordance with another aspect of the invention is a computer readable medium comprising code stored thereon for modeling, the computer readable medium comprising code for: determining, in accordance with one or more criteria, whether to use a dynamic model or a static model to model performance of one or more components of a data storage system; and modeling performance of the one or more components using the dynamic model if said determining indicates to use the dynamic model, and otherwise using the static model to model performance of the one or more components.

BRIEF DESCRIPTION OF THE DRAWINGS

Features and advantages of the present invention will become more apparent from the following detailed description of exemplary embodiments thereof taken in conjunction with the accompanying drawings in which:

FIGS. 8A and 8B are examples illustrating use of a virtually provisioned device in an embodiment in accordance with techniques herein;

DETAILED DESCRIPTION OF EMBODIMENT(S)

Figure 1:
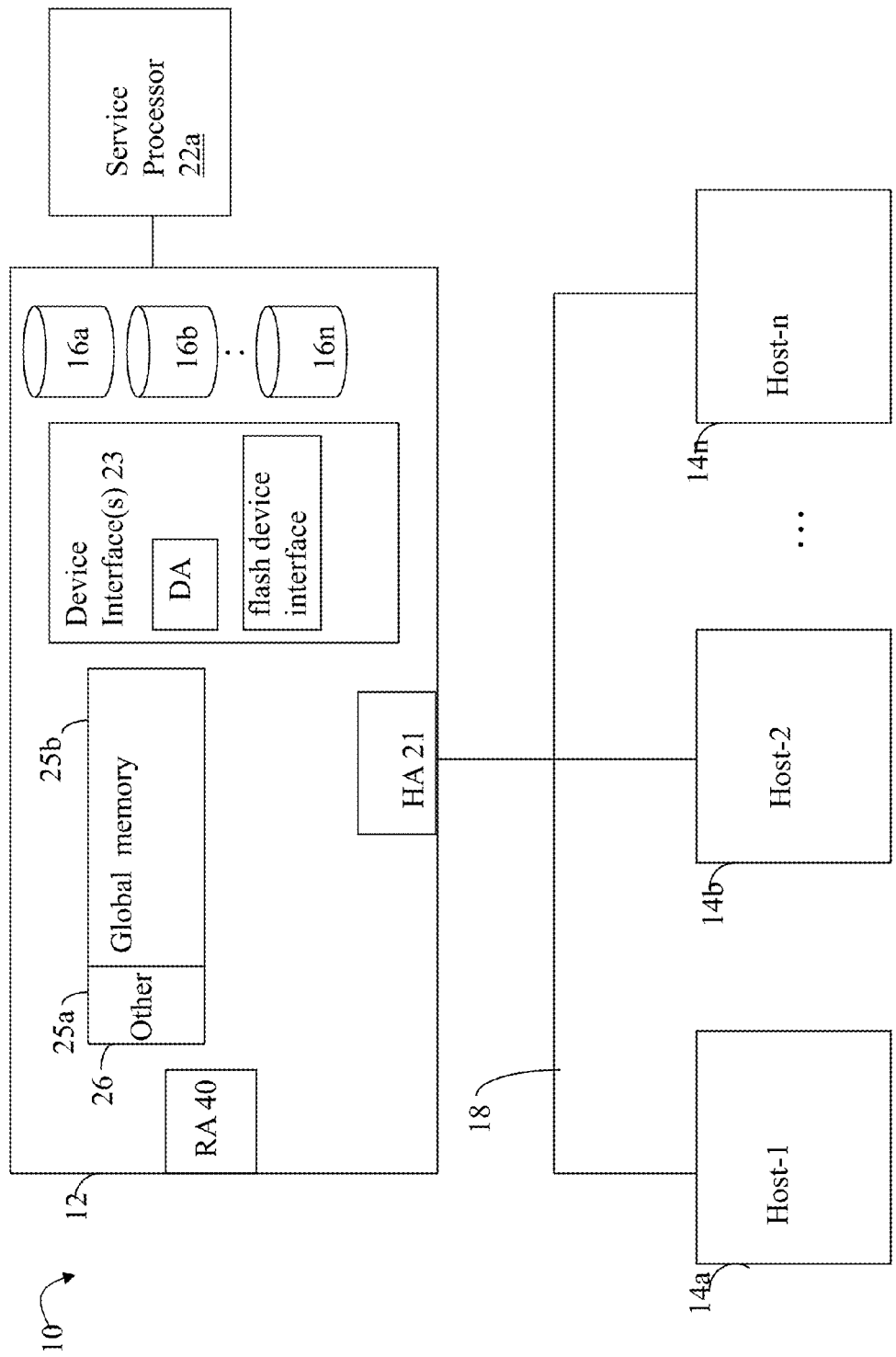
FIG. 1 is an example of an embodiment of a system that may utilize the techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as SCSI, Fibre Channel, iSCSI, and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the techniques herein. It should also be noted that an embodiment may include data storage arrays or other components from one or more vendors. In subsequent examples illustrated the techniques herein, reference may be made to a single data storage array by a vendor, such as by EMC Corporation of Hopkinton, Mass. However, as will be appreciated by those skilled in the art, the techniques herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving parts. As described in more detail in following paragraphs, the techniques herein may be used in an embodiment in which one or more of the devices 16a-16n are flash drives or devices. More generally, the techniques herein may also be used with any type of SSD although following paragraphs may make reference to a particular type such as a flash device or flash memory device.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel of other front-end adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment. Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices or logical volumes (LVs) which are sometimes also referred to as logical units (e.g., LUNs). The LVs may or may not correspond to the actual physical devices or drives 16a-16n. For example, one or more LVs may reside on a single physical drive or multiple drives. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LV(s) residing thereon. A flash device interface may be another type of device interface used in connection with facilitating data transfers to/from the associated flash devices and LV(s) residing thereon. It should be noted that an embodiment may use the same or a different device interface for one or more different types of devices than as described herein.

The device interface, such as a DA, performs I/O operations on a drive 16a-16n. In the following description, data residing on an LV may be accessed by the device interface following a data request in connection with I/O operations that other directors originate. Data may be accessed by LV in which a single device interface manages data requests in connection with the different one or more LVs that may reside on a drive 16a-16n. For example, a device interface may be a DA that accomplishes the foregoing by creating job records for the different LVs associated with a particular device. These different job records may be associated with the different LVs in a data structure stored and managed by each device interface.

Also shown in FIG. 1 is a service processor 22a that may be used to manage and monitor the system 12. In one embodiment, the service processor 22a may be used in collecting performance data, for example, regarding the I/O performance in connection with data storage system 12. This performance data may relate to, for example, performance measurements in connection with a data request as may be made from the different host computer systems 14a 14n. This performance data may be gathered and stored in a storage area. Additional detail regarding the service processor 22a is described in following paragraphs.

It should be noted that a service processor 22a may exist external to the data storage system 12 and may communicate with the data storage system 12 using any one of a variety of communication connections. In one embodiment, the service processor 22a may communicate with the data storage system 12 through three different connections, a serial port, a parallel port and using a network interface card, for example, with an Ethernet connection. Using the Ethernet connection, for example, a service processor may communicate directly with DAs and HAs within the data storage system 12.

Figure 2:
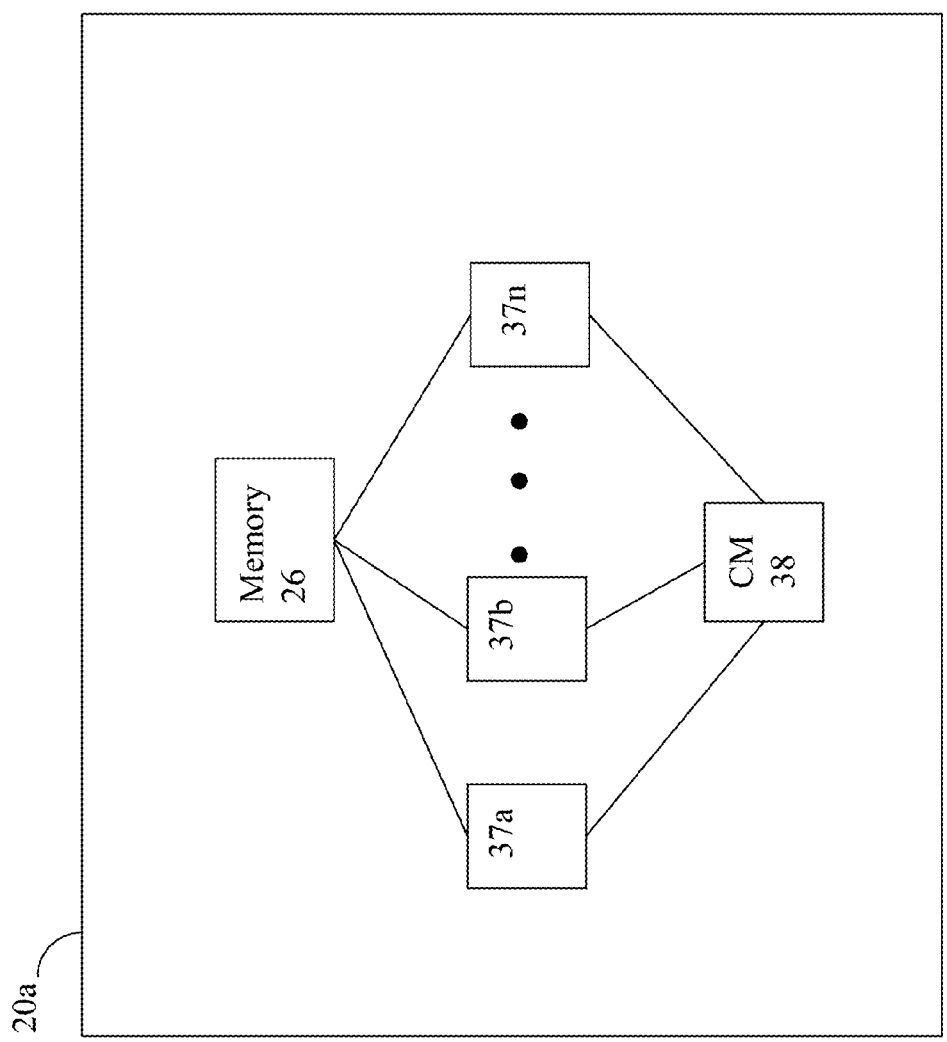
FIG. 2 is a representation of the logical internal communications between the directors and memory included in one embodiment of a data storage system of FIG. 1.

Referring to FIG. 2, shown is a representation of the logical internal communications between the directors and memory included in a data storage system. Included in FIG. 2 is a plurality of directors 37a-37n coupled to the memory 26. Each of the directors 37a-37n represents one of the HAs, RAs, or device interfaces that may be included in a data storage system. In an embodiment disclosed herein, there may be up to sixteen directors coupled to the memory 26. Other embodiments may allow a maximum number of directors other than sixteen as just described and the maximum number may vary with embodiment.

The representation of FIG. 2 also includes an optional communication module (CM) 38 that provides an alternative communication path between the directors 37a-37n. Each of the directors 37a-37n may be coupled to the CM 38 so that any one of the directors 37a-37n may send a message and/or data to any other one of the directors 37a-37n without needing to go through the memory 26. The CM 38 may be implemented using conventional MUX/router technology where a sending one of the directors 37a-37n provides an appropriate address to cause a message and/or data to be received by an intended receiving one of the directors 37a-37n. In addition, a sending one of the directors 37a-37n may be able to broadcast a message to all of the other directors 37a-37n at the same time.

With reference back to FIG. 1, components of the data storage system may communicate using GM 25b. For example, in connection with a write operation, an embodiment may first store the data in cache included in a portion of GM 25b, mark the cache slot including the write operation data as write pending (WP), and then later de-stage the WP data from cache to one of the devices 16a-16n. In this manner, a write operation may be deemed sufficiently complete to return an acknowledge to the host after the write data has been stored in cache rather than wait until the data has been actually destaged and written to the physical device such as disk drive or flash drive. Alternatively, depending on the embodiment, an acknowledgement may be returned to the host that the write operation is complete after other processing has been completed on the data storage system (e.g., may return acknowledgement after the data has been destaged in embodiments using write back caching, may return acknowledgement after data has been copied to a remote data storage system, and the like). In connection with returning data to a host from one of the devices as part of a read operation, the data may be copied from the device by the appropriate device interface, such as a DA servicing the device. The device interface may copy the data read into a cache slot included in GM which is, in turn, communicated to the appropriate HA in communication with the host.

As described above, the data storage system 12 may be a data storage array including a plurality of data storage devices 16a-16n in which one or more of the devices 16a-16n are flash memory devices employing one or more different flash memory technologies. In one embodiment, the data storage system 12 may be a Symmetrix® DMX™ or VMAX™ data storage array by EMC Corporation of Hopkinton, Mass. In the foregoing data storage array, the data storage devices 16a-16n may include a combination of disk devices and flash devices in which the flash devices may appear as standard Fibre Channel (FC) drives to the various software tools used in connection with the data storage array. The flash devices may be constructed using nonvolatile semiconductor NAND flash memory. The flash devices may include one or more SLC (single level cell) devices and/or MLC (multi level cell) devices.

It should be noted that the techniques herein may be used in connection with flash devices comprising what may be characterized as enterprise-grade or enterprise-class flash drives (EFDs) with an expected lifetime (e.g., as measured in an amount of actual elapsed time such as a number of years, months, and/or days) based on a number of guaranteed write cycles, or program cycles, and a rate or frequency at which the writes are performed. Thus, a flash device may be expected to have a usage measured in calendar or wall clock elapsed time based on the amount of time it takes to perform the number of guaranteed write cycles. The techniques herein may also be used with other flash devices, more generally referred to as non-enterprise class flash devices, which, when performing writes at a same rate as for enterprise class drives, may have a lower expected lifetime based on a lower number of guaranteed write cycles.

The techniques herein may be generally used in connection with any type of flash device, or more generally, any SSD technology. The flash device may be, for example, a flash device which is a NAND gate flash device, NOR gate flash device, flash device that uses SLC or MLC technology, and the like, as known in the art. In one embodiment, the one or more flash devices may include MLC flash memory devices although an embodiment may utilize MLC, alone or in combination with, other types of flash memory devices or other suitable memory and data storage technologies. More generally, the techniques herein may be used in connection with other SSD technologies although particular flash memory technologies may be described herein for purposes of illustration.

An embodiment in accordance with techniques herein may have one or more defined storage tiers. Each tier may generally include physical storage devices or drives having one or more attributes associated with a definition for that tier. For example, one embodiment may provide a tier definition based on a set of one or more attributes. The attributes may include any one or more of a storage type or storage technology, a type of data protection, device performance characteristic(s), storage capacity, and the like. The storage type or technology may specify whether a physical storage device is an SSD drive (such as a flash drive), a particular type of SSD drive (such using flash or a form of RAM), a type of magnetic disk or other non-SSD drive (such as an FC disk drive, a SATA (Serial Advanced Technology Attachment) drive), and the like. Data protection may specify a type or level of data storage protection such, for example, as a particular RAID level (e.g., RAID1, RAID-5 3+1, RAIDS 7+1, and the like). Performance characteristics may relate to different performance aspects of the physical storage devices of a particular type or technology. For example, there may be multiple types of FC disk drives based on the RPM characteristics of the FC disk drives (e.g., 10K RPM FC drives and 15K RPM FC drives) and FC disk drives having different RPM characteristics may be included in different storage tiers. Storage capacity may specify the amount of data, such as in bytes, that may be stored on the drives. An embodiment may allow a user to define one or more such storage tiers. For example, an embodiment in accordance with techniques herein may define two storage tiers including a first tier of all SSD drives and a second tier of all non-SSD drives. As another example, an embodiment in accordance with techniques herein may define three storage tiers including a first tier of all SSD drives which are flash drives, a second tier of all FC drives, and a third tier of all SATA drives. The foregoing are some examples of tier definitions and other tier definitions may be specified in accordance with techniques herein.

Figure 3:
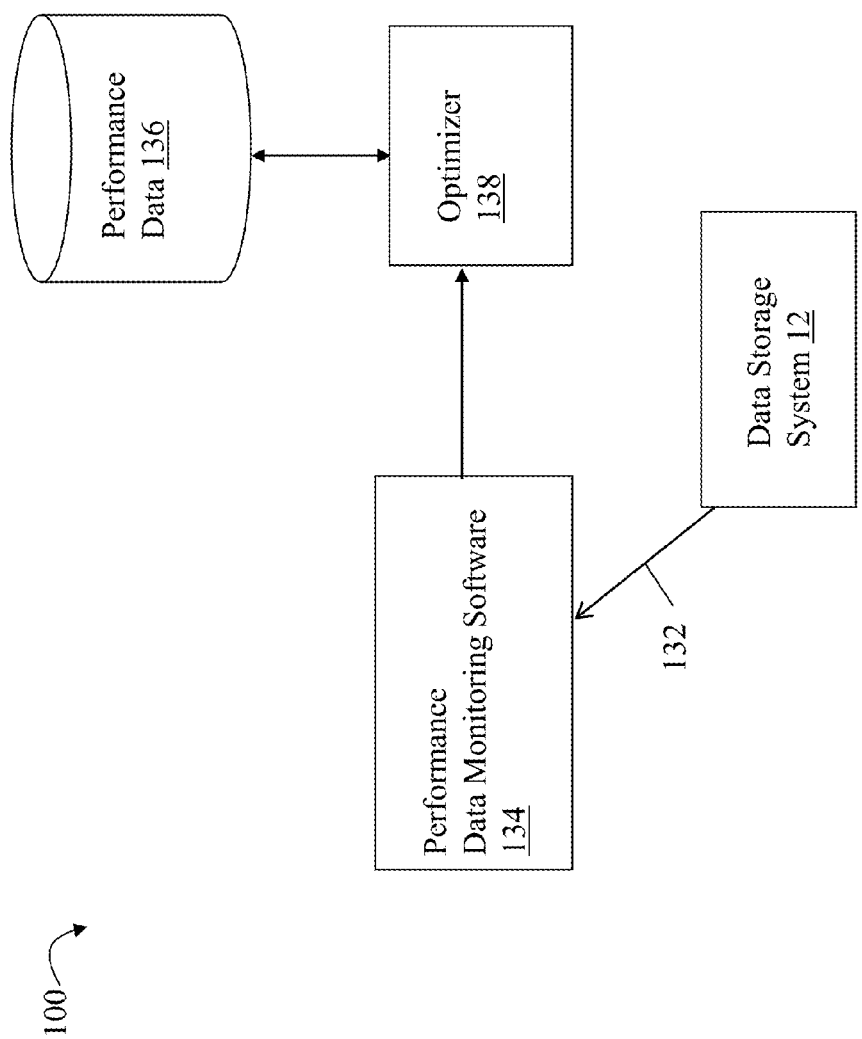
FIG. 3 is an example representing components that may be included in a service processor in an embodiment in accordance with techniques herein.

Referring to FIG. 3, shown is an example 100 of software that may be included in a service processor such as 22a. It should be noted that the service processor may be any one of a variety of commercially available processors, such as an Intel-based processor, and the like. Although what is described herein shows details of software that may reside in the service processor 22a, all or portions of the illustrated components may also reside elsewhere such as, for example, on any of the host systems 14a 14n.

Included in the service processor 22a is performance data monitoring software 134 which gathers performance data about the data storage system 12 through the connection 132. The performance data monitoring software 134 gathers and stores performance data and forwards this to the optimizer 138 which further stores the data in the performance data file 136. This performance data 136 may also serve as an input to the optimizer 138 which attempts to enhance the performance of I/O operations, such as those I/O operations associated with data storage devices 16a-16n of the system 12. The optimizer 138 may take into consideration various types of parameters and performance data 136 in an attempt to optimize particular metrics associated with performance of the data storage system 12. The performance data 136 may be used by the optimizer to determine metrics described and used in connection with techniques herein. The optimizer may access the performance data, for example, collected for a plurality of LVs when performing a data storage optimization. The performance data 136 may be used in determining a workload for one or more physical devices, logical devices or volumes (LVs) serving as data devices, thin or virtually provisioned devices, portions of devices, and the like. The workload may also be a measurement or level of "how busy" a device is, for example, in terms of I/O operations (e.g., I/O throughput such as number of I/Os/second (IOPS), response time (RT), and the like).

The response time for a storage device or volume may be based on a response time associated with the a physical storage device, LV, or other data portion or entity to which I/Os are directed, for a period of time. The response time may based on read and write operations directed to the storage device or volume. Response time represents the amount of time it takes the storage system to complete an I/O request (e.g., a read or write request). Response time may be characterized as including two components: service time and wait time. Service time is the actual amount of time spent servicing or completing an I/O request after receiving the request from a host via an HA 21, or after the storage system 12 generates the I/O request internally. The wait time is the amount of time the I/O request spends waiting in line or queue waiting for service (e.g., prior to executing the I/O operation).

It should be noted that the operations of read and write with respect to an LV having its data stored on one or more physical devices may be viewed as "back end" read and write requests or commands from the DA 23, controller or other backend physical device interface. Thus, these are operations may also be characterized as a number of operations with respect to the physical storage device (e.g., number of physical device reads, writes, and the like, based on physical device accesses). This is in contrast to observing or counting a number of particular types of I/O requests (e.g., "front end" reads or writes) as issued from the host and received by a front end component such as an HA 21. To illustrate, a host read request (also characterized as a front end I/O request) may not result in a read request or command issued to the DA if there is a cache hit and the requested data is in cache. The host read request results in a read request or command issued to the DA 23 to retrieve data from the physical drive only if there is a read miss. Furthermore, when writing data of a received host I/O request to the physical device, the host write request may result in multiple "back end" reads and/or writes by the DA 23 in addition to writing out the host or user data of the request. For example, if the data storage system implements a RAID data protection technique, such as RAID-5, additional reads and writes may be performed such as in connection with writing out additional parity information for the user data. Thus, observed data gathered to determine workload, such as observed numbers of reads and writes, may refer to the read and write requests or commands performed by the DA (e.g., backend request or I/Os). Such read and write commands may correspond, respectively, to physical device accesses such as disk reads and writes that may result from a host I/O request received by an HA 21.

Consistent with the above, workload data such as related to incoming I/Os may be characterized in terms of a front end data storage system perspective and also from a back end data storage system perspective. From the front end perspective, a workload may be expressed in terms of I/Os per second (IOPS), read operations/second, write operations/second, and the like, based on logical I/Os as received by the front end and host perspective. The front end workload (also referred to herein as logical data operations) generally may be mapped or translated into back end workload or physical data operations such as described above where a single front end or host I/O may result in a different number and/or type of back end I/Os (e.g., based on RAID level of the physical storage for an LV to which the single front end or host I/O is directed). The optimizer may perform evaluations, such as in connection with data movement optimizations described elsewhere herein, using workload and performance information expressed in terms of back end I/Os or physical data operations.

The optimizer 138 may perform processing to determine how to allocate or partition physical storage in a multi-tiered environment for use by multiple applications. The optimizer 138 may also perform other processing such as, for example, to determine what particular portions of devices to store on physical devices of a particular tier, evaluate when to migrate or move data between physical drives of different tiers, and the like. It should be noted that the optimizer 138 may generally represent one or more components that perform processing as described herein as well as one or more other optimizations and other processing that may be performed in an embodiment.

The data storage optimizer may automatically place particular data portions in different storage tiers where it has determined such placement or movement will improve data storage system performance. The data portions may be automatically relocated or migrated to a different storage tier as the work load and observed performance characteristics for the data portions change over time. In accordance with techniques herein, analysis of performance data for data portions of thin devices may be performed in order to determine whether particular data portions should have their data contents stored on physical devices located in a particular storage tier. The techniques herein may take into account how "busy" the data portions are (e.g., such as I/O throughput or I/Os per unit of time, response time, utilization, and the like) in combination with storage tier capacities in order to evaluate which data to store on drives of the storage tiers.

Promotion may refer to movement of data from a first storage tier to a second storage tier where the second storage tier is characterized as having devices of higher performance than devices of the first storage tier. Demotion may refer generally to movement of data from a first storage tier to a second storage tier where the first storage tier is characterized as having devices of higher performance than devices of the second storage tier. As such, movement of data from a first tier of flash devices to a second tier of FC devices and/or SATA devices may be characterized as a demotion and movement of data from the foregoing second tier to the first tier a promotion. The promotion and demotion thresholds refer to thresholds used in connection with data movement.

As an example, the techniques herein may be described with reference to a storage environment having three storage tiers—a first tier of only flash drives in the data storage system, a second tier of only FC disk drives, and a third tier of only SATA disk drives. In terms of performance, the foregoing three tiers may be ranked from highest to lowest as follows: first, second, and then third. The lower the tier ranking, the lower the tier's performance characteristics (e.g., longer latency times, capable of less I/O throughput/second/GB (or other storage unit), and the like). Generally, different types of physical devices or physical drives have different types of characteristics. There are different reasons why one may want to use one storage tier and type of drive over another depending on criteria, goals and the current performance characteristics exhibited in connection with performing I/O operations. For example, flash drives of the first tier may be a best choice or candidate for storing data which may be characterized as I/O intensive or "busy" thereby experiencing a high rate of I/Os to frequently access the physical storage device containing the LV's data. However, flash drives tend to be expensive in terms of storage capacity. SATA drives may be a best choice or candidate for storing data of devices requiring a large storage capacity and which are not I/O intensive with respect to access and retrieval from the physical storage device. The second tier of FC disk drives may be characterized as "in between" flash drives and SATA drives in terms of cost/GB and I/O performance. Thus, in terms of relative performance characteristics, flash drives may be characterized as having higher performance than both FC and SATA disks, and FC disks may be characterized as having a higher performance than SATA.

Since flash drives of the first tier are the best suited for high throughput/sec/GB, processing may be performed to determine which of the devices, and portions thereof, are characterized as most I/O intensive and therefore may be good candidates to have their data stored on flash drives. Similarly, the second most I/O intensive devices, and portions thereof, may be good candidates to store on FC disk drives of the second tier and the least I/O intensive devices may be good candidates to store on SATA drives of the third tier. As such, workload for an application may be determined using some measure of I/O intensity, performance or activity (e.g., I/O throughput/second, percentage of read operation, percentage of write operations, response time, etc.) of each device used for the application's data. Some measure of workload may be used as a factor or criterion in combination with possibly others for determining what data portions are located on the physical storage devices of each of the different storage tiers.

Figure 4:
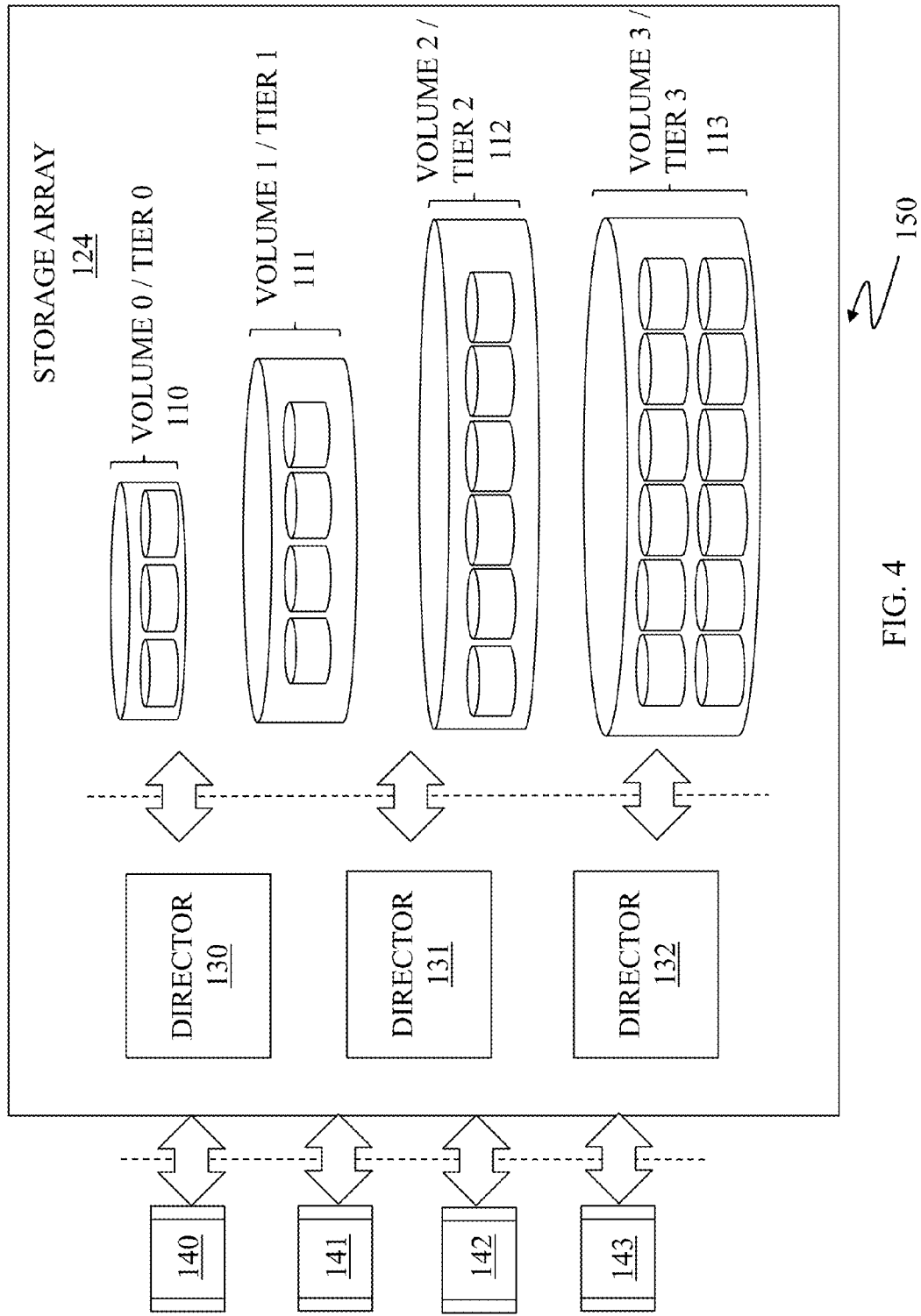
FIG. 4 is an example illustrating a data storage system, such as data storage array, including a plurality of storage tiers in an embodiment in accordance with techniques herein.

FIG. 4 is a schematic illustration showing a storage system 150 that may be used in connection with an embodiment of the system described herein. The storage system 150 may include a storage array 124 having multiple directors 130-132 and multiple storage volumes (LVs, logical devices or VOLUMES 0-3) 110-113. Host applications 140-144 and/or other entities (e.g., other storage devices, SAN switches, etc.) request data writes and data reads to and from the storage array 124 that are facilitated using one or more of the directors 130-132. The storage array 124 may include similar features as that discussed above.

The volumes 110-113 may be provided in multiple storage tiers (TIERS 0-3) that may have different storage characteristics, such as speed, cost, reliability, availability, security and/or other characteristics. As described above, a tier may represent a set of storage resources, such as physical storage devices, residing in a storage platform. Examples of storage disks that may be used as storage resources within a storage array of a tier may include sets SATA disks, FC disks and/or EFDs, among other known types of storage devices.

According to various embodiments, each of the volumes 110-113 may be located in different storage tiers. Tiered storage provides that data may be initially allocated to a particular fast volume/tier, but a portion of the data that has not been used over a period of time (for example, three weeks) may be automatically moved to a slower (and perhaps less expensive) tier. For example, data that is expected to be used frequently, for example database indices, may be initially written directly to fast storage whereas data that is not expected to be accessed frequently, for example backup or archived data, may be initially written to slower storage. In an embodiment, the system described herein may be used in connection with a Fully Automated Storage Tiering (FAST) product produced by EMC Corporation of Hopkinton, Mass., that provides for the optimization of the use of different storage tiers including the ability to easily create and apply tiering policies (e.g., allocation policies, data movement policies including promotion and demotion thresholds, and the like) to transparently automate the control, placement, and movement of data within a storage system based on business needs. Various aspects of data storage optimization are described, for example, in U.S. patent application Ser. No. 13/466,775, filed May 8, 2012, PERFORMING DATA STORAGE OPTIMIZATIONS ACROSS MULTIPLE DATA STORAGE SYSTEMS, now U.S. Pat. No. 8,935,493, which is incorporated by reference herein.

Described above are different techniques that may be performed by an optimizer, for example, such as the optimizer 138 with reference back to FIG. 3. As described herein the optimizer may perform processing of the techniques herein to determine how to allocate or partition physical storage in a multi-tiered environment for use by multiple applications. The optimizer may perform processing such as, for example, to determine what particular portions of LVs to store on physical devices of a particular tier, evaluate when to migrate or move data between physical drives of different tiers, and the like. In connection with above-mentioned descriptions, embodiments are described whereby the optimizer may be included as a component of the data storage system, such as a data storage array. In such embodiments, the optimizer may perform optimizations, such as the data movement optimization, with respect to physical devices of a single data storage system such as a single data storage array. Such data movement optimizations may be performed with respect to different data storage units of granularity that may be vary with embodiment and/or type of logical devices. For example, an embodiment may provide for partitioning data of a logical device (as may be stored on one or more physical devices (PDs)) into multiple data portions of any suitable size. The data movement optimization processing may provide for evaluation and data movement of individual data portions (each of which can be much less than the size of entire LV) between storage tiers based on the workload or activity of I/Os directed to each such data portion. As the workload may change dynamically over time, the data storage optimizer may continuously evaluate and perform data movement optimizations as needed responsive to such changing workloads.

The data storage optimizer may be located in a first or primary data storage system and may perform data storage optimizations, such as data movement and other optimizations, for PDs stored on the first data storage system. Additionally, the optimizer, or more generally, the one or more components performing the optimization processing, may perform data storage optimizations with respect to externally located data storage systems and PDs. Each such externally located data storage system may also include one or more storage tiers which may be the same or different storage tiers from those of the primary data storage system and/or other external data storage systems. For example, the first data storage system may be connected, directly or through a network or other connection, to a one or more external data storage systems. The optimizer of the first data storage system may perform data storage optimizations such as data movement optimizations with respect to PDs of the first data storage system and also other PDs of the one or more other external data storage systems. In this manner, the data storage optimizer may perform data storage optimizations of its own local devices and/or other devices physically located in another component other than the data storage system. In other words, the techniques herein for performing data movement evaluation, performing the actual movement of data such as between physical devices of different storage tiers, and the like, may be performed by code executing on a component that is external with respect to the data storage system including the physical devices for which such data movement optimization is performed.

Figure 5:
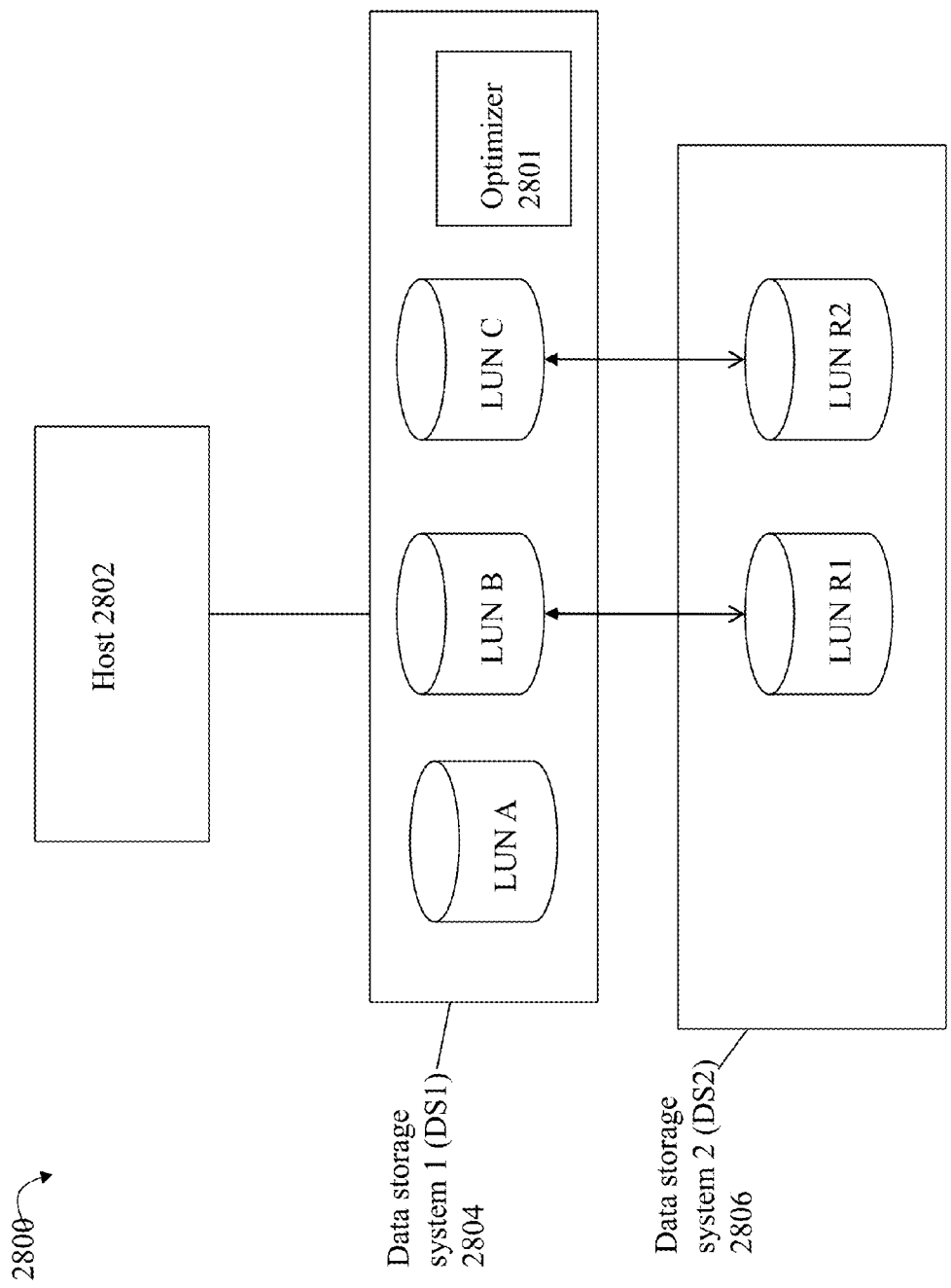
FIGS. 5 and 6 are examples of a host issuing I/Os to a primary data storage system which also performs data optimizations and stores data on external data storage system(s)

For example, with reference now to FIG. 5, shown is an example 2800 of a system and network including a host 2802, data storage system 1 (DS1) 2804 and data storage system 2 (DS2) 2806. The data storage optimizer 2801 as may be included in DS 1 2804 may perform data storage optimizations across multiple storage tiers of PDs included in DS1 2804 and also PDs of DS2 2806. The optimizer 2801 may perform optimization processing such as in connection with data movement evaluation for moving data portions of LUNs between different underlying PDs providing the physical storage for the LUNs. DS1 2806 may provide for presenting to the host 2802 storage on both DS1 and DS2. LUNs A, B and C may be presented as devices of DS1 where LUN A may have underlying storage provisioned on PDs of DS1 and LUNs B and C may have underlying storage provisioned on PDs of DS2. For example, as illustrated, DS1 may map LUNs B and C (presented to the host as devices of DS1) to LUNs R1 and R2, respectively, of DS 2.

DS1 may utilize one or more components providing a "virtualized backend" to DS2 such as, for example, where a DA of DS1 communicates with an FA of DS2 to access LUNs R1 and R2 of DS2. In connection with SCSI terminology, a port of a DA of DS1 may be an initiator and a port of an FA of DS2 may be a target forming a path over which DS1 may access a LUN of DS2 (e.g., access one of the LUNs R1, R2). Thus, the example 1000 is an illustration whereby the host 1002 communicates directly with DS1 1004 issuing commands and operations to LUNs A-C. Host 2802 is provided access to storage and devices of DS2 only indirectly through DS1. As such, DS1 may want to know different types of information about DS 2 2806 (e.g., such as regarding the underlying PD storage from which LUNs R1 and R2 of DS2 are provisioned in connection with providing data services, and other information as described elsewhere herein) in connection with performing data storage optimizations. Complete information regarding DS2, such as related to the configuration of DS2, the performance or storage tier classification and/or underlying PD technology of PDs providing storage for LUNs R1 and R2 of DS2, and the like, may not be available to DS1. Since such information is not provided to DS1, an embodiment may utilize the techniques herein to discover such information regarding DS2 and the PDs of DS 2 providing storage for the LUNs of DS2. The techniques herein may be performed by executing code on DS1 to determine such information regarding performance characteristics of the one or more storage tiers of underlying PDs providing storage for LUNs R1 and R2. The foregoing information may be used as described elsewhere herein in connection with data storage system modeling such as in connection with optimizations whereby an optimizer of DS1 does data movement and placement of LUN data of LUNs A-C. For example, DS1 may control movement and placement of data for LUNs B and C on selected ones of LUNs R1, R2 of DS2 based on particular performance characteristics of PD groups for LUNs R1 and R2. For example, LUN R1 of DS2 may be classified as having its data stored on a first group of PDs which are EFDs and LUN R2 may be classified as having its data stored on a second group of PDs which are rotating FC disk drives. Information regarding the storage tiers, technology of PDs providing physical storage for LUN R1 and R2, and the like may not be available. As such, techniques herein may be used to gather information regarding the performance of such PDs of DS2 and generate performance curves used to model performance of the PDs of the external system DS2. At a first point in time, DS1 may store data of LUN B which is frequently accessed by the host on LUN R1 and may store data of LUN C which is much less frequently accessed by the host on LUN R2 as illustrated in the example 2800. At a second point in time, the optimizer may determine that the data of LUN B is now much less frequently accessed than the data of LUN C and may relocate or move data of LUN B to LUN R2 and may move data of LUN C to LUN R1. Thus, DS1 may address each LUN of DS2 in a manner similar to one of its own PDs for placement and data movement optimizations. Using the performance curves and other techniques herein, the data storage optimizer may model proposed data movements to obtain simulated or expected performance results if such proposed data movements are performed.

It should be noted that the foregoing example describes performing data storage optimizations, such as data movement and placement, with reference to an entire LUN or logical device. However, as described elsewhere herein and also appreciated by those skilled in the art, such data movement and placement may be performed with respect to varying and different levels of storage granularity. For example, the foregoing may be used in connection with data movement and placement for a portion of a LUN such as LUN B whereby a first very active portion of LUN B may have its data stored on LUN R1 and a second much less active portion of LUN B may have its data stored on LUN R2 and yet a third portion of LUN B may have its data stored on PDs of DS1. DS1 may then perform processing to appropriately and suitably move such data portions as workload and activity for each such portion may change over time.

Figure 6:
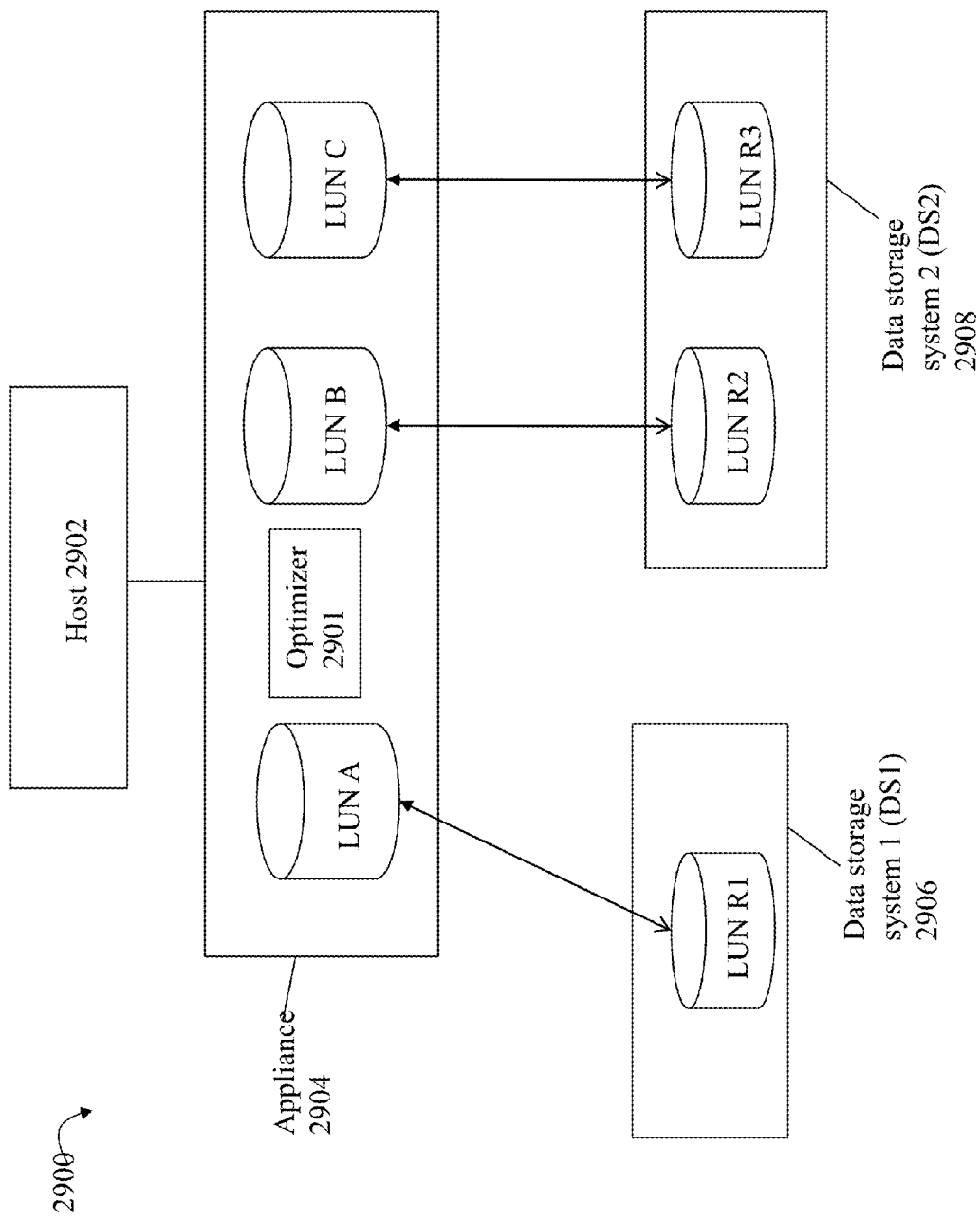

With reference now to FIG. 6, shown is another example of another embodiment that may utilize the techniques herein. The example 2900 includes a host 2902, appliance 2904 and DS1 2906 and DS2 2908. The appliance 2904 may be a data storage virtualization appliance such as an EMC® VPLEX™ appliance which accesses and aggregates storage from multiple data storage systems DS1 and DS2 whereby each such data storage system may be of the same or different types (e.g., same or different manufacturers as well as different array types that may be from a same manufacturer). In this manner, the appliance 2904 may present storage of DS1 and DS2 in an aggregated virtualized environment to the host 2902 and other clients. The host 2902 communicates with the appliance 2904 to access data on any one of the virtualized storage devices LUNs A-C exposed to the client and each such virtualized storage device of the appliance may be mapped to one or more other LUNs R1-R3 of one or more other data storage systems such as DS1 2906 and DS2 2908. To illustrate, the appliance 2904 may expose or present to the host LUNs A-C. As such, the appliance 2904 may want to know information about DS1 2906, DS2 2908 and the underlying PD storage from which LUNs R1, R2, and R3 are provisioned in connection with providing data services, performing optimizations such as data movement as described elsewhere herein, and the like. Such information regarding the configuration and performance classification of LUNs R1, R2 and R3 may not be available to the appliance 2904 (e.g. the appliance may not be provided with information regarding the storage tier classification of the underlying PDs from which storage is configured for storing data of LUNs R1, R2, and R3). Since such information is not provided to the appliance, an embodiment may utilize the techniques herein to discover such information regarding the DSs 2906, 2908 and the PDs provisioned for LUNs R1-R3 of DS1 and DS2. The techniques herein may be performed by executing code on the appliance to determine information regarding performance characteristics of the one or more underlying PDs providing storage for LUNs R1, R2 and R3. The foregoing information may be used as described elsewhere herein in connection with optimizations whereby an optimizer of the appliance may perform data movement of LUN data of LUNs A-C. For example, the appliance may at a first point in time map LUN A, or a portion thereof, to LUN R1 of DS1 determined to have its data stored on PDs of the EFD storage tier. Such mapping may be performed when the host is frequently accessing LUN A's data (e.g., when LUN A, or portion thereof, has a high workload and the optimizer determines to place such a highly active portion of data on the highest EFD storage tier). At a later point in time, assume the workload to LUN A, or the portion thereof, mapped to the LUN R1 of DS1 greatly decreases. The appliance may now determine that LUN A, or the portion thereof, has its data relocated or moved from the EFD storage tier of LUN R1 to LUN R2 of DS2 (whereby LUN R2 is determined to be of a lower performing tier than EFD (e.g., LUN R2 may be classified as having underlying PDs which are FC or SATA rotational disk drives rather than EFD drives). Using the performance curves and other techniques described herein, the data storage optimizer may model proposed data movements to obtain simulated or expected performance results if such proposed data movements are performed.

In connection with a data storage system, such as DS 1 2084 of FIG. 5, or an appliance 2904 of FIG. 6, including the data storage optimizer, it is desirable for the data storage optimizer to have information about the external data storage system and its PDs. As described elsewhere herein in more detail, such information may include performance characteristics (e.g., RT characteristics for given workloads such as may be embodied in performance curves) of the external data storage systems PDs and configuration information regarding the external data storage system. In connection with description herein in some contexts, the PDs of the external data storage system may be referred to as virtual drives from the perspective of a first or primary data storage system (e.g., DS 1 2804) including the data storage optimizer. More generally, a virtual drive is a unit of storage that a storage system (such as DS 1 2804) can use to provide storage services to its clients, but which may be embodied as a unit of logical storage presented to the storage system, such as over a storage network, from a separate data storage system. The former storage system including the data optimizer may also be referred to as the primary data storage system and the latter may be referred to as the external data storage system. In contrast with internal drives of the primary storage system, the physical storage media resources underlying a virtual drive do not reside within the primary storage system. The primary storage system delivers storage accesses to the storage media underlying a virtual drive or volume using standard storage network protocols. Examples of such external storage embodied as virtual volumes or drives are described, for example, in connection with LUN R1, R2 of DS 2 2806 of FIG. 5 and LUNs R1, R2 and R3 of DSs 2906, 2908 of FIG. 6. It should be noted that in description herein external LUN may be used to refer to a LUN located on such an external data storage system and external PD may be used to refer to a PD located on such an external data storage system.

In connection with the data storage optimizer having knowledge regarding the performance characteristics of virtual drives, the optimizer on the primary storage system should be able to predict, for a given candidate workload on a given set of drives (whether internal or virtual with respect to the primary storage system), what the resulting utilization and/or response time will be. In this manner, the primary storage system may avoid drive overload missing RT goals. One challenge of the primary storage system related to automating the optimization of a storage configuration that includes virtual drives is the fact that the primary storage system may not have access to explicit, quantitative information needed for modeling the virtual drives and/or external data storage system such as, for example, configuration and performance capabilities of the underlying external storage hardware, information regarding the RAID type in use in the external storage system, the extent to which a given virtual drive may be competing for external storage system resources with other virtual drives or with other activity on the external storage system, and the like. This challenge exists because, in practice, many candidate external storage systems may not support mechanisms, such as APIs (application programming interfaces), that may be used for exporting the needed information to the primary storage system without requiring significant involvement by human storage administrators, or without requiring the configuration of new reporting infrastructure. In some instances, the invasiveness and cost of such storage administration overhead and of implementing such reporting infrastructure can negate the benefits of using virtual drives in the first place.

The use of exploratory I/O, depending on the type and amount of exploratory I/O permitted, may provide for accurate and rapid determination of performance characteristics of the virtual or externally located drives. The term 'exploratory I/O operation' refers to an I/O operation that is internally generated by a storage system specifically for the purpose of identifying performance characteristics of the targeted storage resource. The exploratory I/O may be contrasted with a non-exploratory I/O which may be characterized as an I/O operation issued by a client that is received at the data storage system. The non-exploratory I/O operation is issued in connection with performing some typical processing, such as by an application, executing on the client.

Described in following paragraphs are techniques that may be used in connection with building a model for predicting how virtual drives will perform with a given workload. As described, such techniques for modeling the virtual drives or external storage devices may use a static model and also a dynamic model. The static model may be used for an amount of time while the dynamic model performs processing to calibrate its performance curves used for dynamic modeling of the virtual drives. Exploratory I/Os may be issued in connection with determining and maintaining the dynamic model. As described in more detail below, exploratory I/Os may be issuance of I/Os in a controlled manner where the I/Os are generated solely for the purpose of testing to obtain performance information regarding the virtual drives. The exploratory I/Os may have a predefined type or set of characteristics such as random read-only operations expected to generate a read miss whereby the requested data is not stored in cache of the external data storage system. The exploratory I/Os may also be of a predetermined I/O size for controlled testing with particular queue depths. Queue depth may be characterized as a number of outstanding (e.g, incomplete or pending) I/O requests. In connection with techniques herein as described in more detail below, an I/O rate for a LUN (e.g., or more generally any device, physical or logical) may be determined with respect to an average queue depth for the LUN whereby the average queue depth for the LUN represents, on average, how many outstanding I/Os are allowed at any point in time for the particular LUN. Exploratory I/Os may be issued at a rate which maintains an average queue depth of a particular size in such testing. Once the dynamic model calibration is complete by having generated an initial set of performance curves, the dynamic modeling may be used in place of the static model. Generally, as noted above, the dynamic modeling may use performance discovery techniques to determine performance models of the virtual drives without use of input from human storage administrators, and without having configuration or activity level information reporting capability on the part of the external storage system. In an embodiment in accordance with techniques herein, the primary storage system dynamically creates and updates a dynamic model of the performance of virtual drives by observing the throughput and response time of storage access requests delivered by the primary storage system to the virtual drives. Furthermore, the performance model may be developed using exploratory I/O operations.

An embodiment may include a primary storage system that executes a performance model-building algorithm to maintain performance models for virtual drives (or for groups thereof). The techniques herein provide for dynamic model building of the external data storage system and its virtual drives without being provided with explicit configuration-specific information regarding the external storage system and its drives. In some embodiments, the model-building techniques may additionally use information about a virtual drive, or group or virtual drives, in combination with other information it acquires using exploratory I/Os that may facilitate the model building process.

An embodiment in accordance with techniques herein may provide a data storage system model as may be used to model the external storage system whereby the model may provide predictions about RM (read miss) RT as a function of workload. An embodiment may also provide estimates of utilization from an operation processing standpoint (e.g., IOPS) and/or a data transfer processing standpoint (e.g. data transfer throughput limits such as bytes/second or megabytes (MB)/second). As known in the art and also described herein, utilization is a percentage of a certain resource or resources with 100% being the maximum possible or saturation level such as with respect to a maximum limit or upper bound with respect to IOPS and/or data transfer.

To accurately calculate predict response time for a given external storage system configuration for a given workload, information that may be used includes external data storage system configuration information, external data storage system performance characterization information by component, knowledge of how the workload will map to various physical components in the external system for processing and additional information regarding the state of the external system. For example, information regarding the external data storage system configuration may include front end configuration information (e.g., mapping of external LUNs (LUNs having data storage on the external system) to front-end ports, mapping of external LUNs to front-end processors, detailed cache configuration information (e.g., including information about cache partitioning, size, prefetching policies, etc.), back end configuration information (e.g., mapping of external LUNs to PDs and back-end processors (e.g., DAs) of the external system, exact type and size of each PD of the external system, RAID type in use for each PD or set of PDs) and configuration information regarding advanced features in the external system (e.g., local and/or remote replication, data storage optimization such as data storage movement for automated tiering), de-duplication or compression, reduced power consumption modes). Information regarding the external system performance characterization by component may include IOP and data transfer limits for front end CPUs and ports, RT contribution due to front end CPUs and ports, IOP and data transfer limits for backend CPUs and ports, IOP and data transfer limits for backend CPUs, RT contribution by backend CPUs, a RT/utilization mode for each drive type or technology of the external system, information about performance of any special processing algorithms (e.g., pre-fetch, post-fetch, read-end-of-track, replication operating within external array, dynamic mapping algorithms, automated tiering, external storage, etc). Information about the external system state may include information about the state of the cache, pending write requests, and state and nature of replication relationships within the external system. Knowledge of how the workload in question will map to the various physical components of the external system may include information about the I/O path that will be traversed through which backend and front end components when servicing the workload I/Os.

To make an accurate prediction of RT for a given workload for a given configuration, the model may also use the following to obtain complete knowledge of the workload: estimate of total load on external system front end components, estimate of total load on external system back end components, and an estimate of amount of advanced functionality performed on the external data storage system. It may however, not be practical or feasible to discover sufficient detail regarding all such aspects of performance characterization, workload and configuration for the external data storage system. Thus, techniques herein may use a generalized and simplified data storage system model as may be used to model the external data storage system.

The techniques herein may use a generalized model that provides a simplified yet suitable model. The model may be simplified by viewing components in the aggregate such as all front end components, all backend components other than PDs, groups of one or more PDs, and the like. The techniques herein may use a major/minor measurement scheme to facilitate and reduce the overhead of maintaining observations of response time vs. workload and approximating an estimate of the back-end write load.

Figure 7:
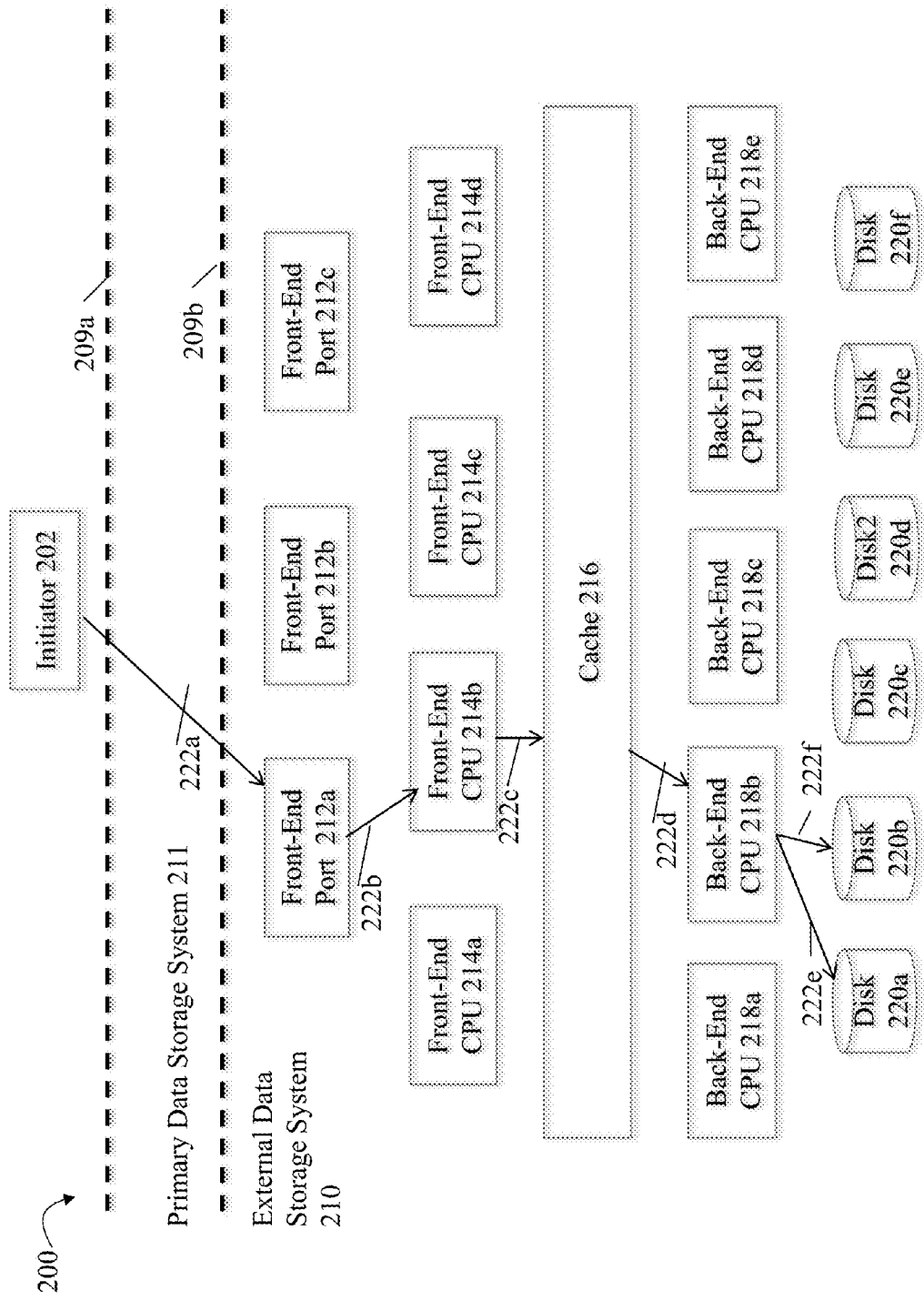
FIG. 7 is an example of a generalized data storage system configuration model that may be used in connection with techniques herein.

Referring to FIG. 7, shown is an example illustrating a generalized data storage system model as may be used in an embodiment in connection with techniques herein. The example 200 provides a generalized illustration of components that may assumed included in the external data storage system being modeled. It should be noted that an embodiment may include additional components or level of granularity than as illustrated in 200 depending on the particular data storage system, level of desired detail and/or availability of information for the model. The dashed lines 209a,209b represent a partitioning of components whereby elements above dashed line 209a are included in the client such as a host, elements between dashed lines 209a and 209b are included in the primary data storage system 211, and elements below dashed line 209b are included in the external data storage system 210. The initiator 202 may be, for example, a host issuing an I/O request received by the primary data storage system 211 which is then forwarded to the external data storage system 210 through/by the primary system 211. The example 200 provides a general view of components of the external data storage system 210. It should be noted that element 202 represents the initiator which sends an I/O request directed to a LUN whereby the request is first received by the primary data storage system 211. System 211 then forwards the request to the external system 210 since the request is directed to the LUN having is data stored on PDs of the external system 210. The elements below the dashed line 209b illustrate those components of the model of the external system 210 and include front end (FE) ports 212a-c, FE CPUs 214a-d, cache 216, backend (BE) CPUs 218a-e, and disks (or more generally PDs) 220a-f. The initiator 202 may access an external LUN having its data storage on one or more of 220a-f and the path of components traversed in connection with servicing a particular LUN's I/O may include an FE port, a FE CPU, cache, a BE CPU, one or more PDs 220a-f.

Thus, the generalized external data storage configuration may include a FE configuration consistent with the above and FIG. 7 with a specified mapping of external LUNs to FE ports, mapping of external LUNs to FE CPUs, and a simplified cache configuration which may include a generalized estimate regarding a typical cache size and associated performance. The generalized external data storage configuration may include a BE configuration consistent with the above and FIG. 7 with a specified mapping of external LUNs to external PDs, a mapping of external LUNs to BE CPUs, and a drive technology or performance classification for each drive.

The model may assume that there are no advanced features on the external data storage system such as noted above. In developing the generalized model, it is noted that data storage systems tend to be BE-performance limited rather than FE performance limited. In this manner, a simplified or generalized model such as illustrated in FIG. 7 and described herein may attach less priority to developing a detailed FE model and greater priority to developing a BE model.

In the example 200, arrows 222a-f illustrate the data flow of an I/O path through components where the I/O is issued from the initiator 202 of the primary storage system to a LUN of the external system 210 having its data stored on PDs 220a, b. The I/O may be transmitted to the FE port 212a (as illustrated by 222a), to FE CPU 214b (as illustrated by 222b), to cache 216 (as illustrated by 222c), to BE CPU 218b (as illustrated by 222d), to one of the PDs 220a or 220b (as illustrated respectively by 222e and 222f). The foregoing arrows illustrate an example of how the mappings may be exist between components of the external data system and its external LUNs as exposed to the primary data storage system including initiator 202.

As described herein and with reference back to FIGS. 5 and 6, the discovery processing for discovering aspects of the modeled external system (such as DS2 2806 of FIG. 6) may use exploratory I/Os issued by the primary system (such as 2904 of FIG. 6 or 2804 of FIG. 5) to the external data storage systems. Thus, discovery processing uses these exploratory I/Os which may be generated in a controlled manner in accordance with a predetermined pattern or set of characteristics where the I/O are generated purposefully based on a predetermined set of characteristics desirable for testing purposes.

Techniques herein may be used in connection with an existing storage configuration. One or more storage pools (SPs) may already be in existence and configured having physical storage provisioned from external PDs and associated external LUNs and external PDs. Techniques herein may be used after such SP configuration has been performed to model the external LUNs and external PDs as may be included in external data storage system(s). General information regarding what external LUNs are included in the different SPs may be obtained from reading a configuration file. However, existing configuration information may not provide further information regarding the underlying PDs of the external data storage system used to provide the backing physical storage for the external LUNs.

Figure 8:
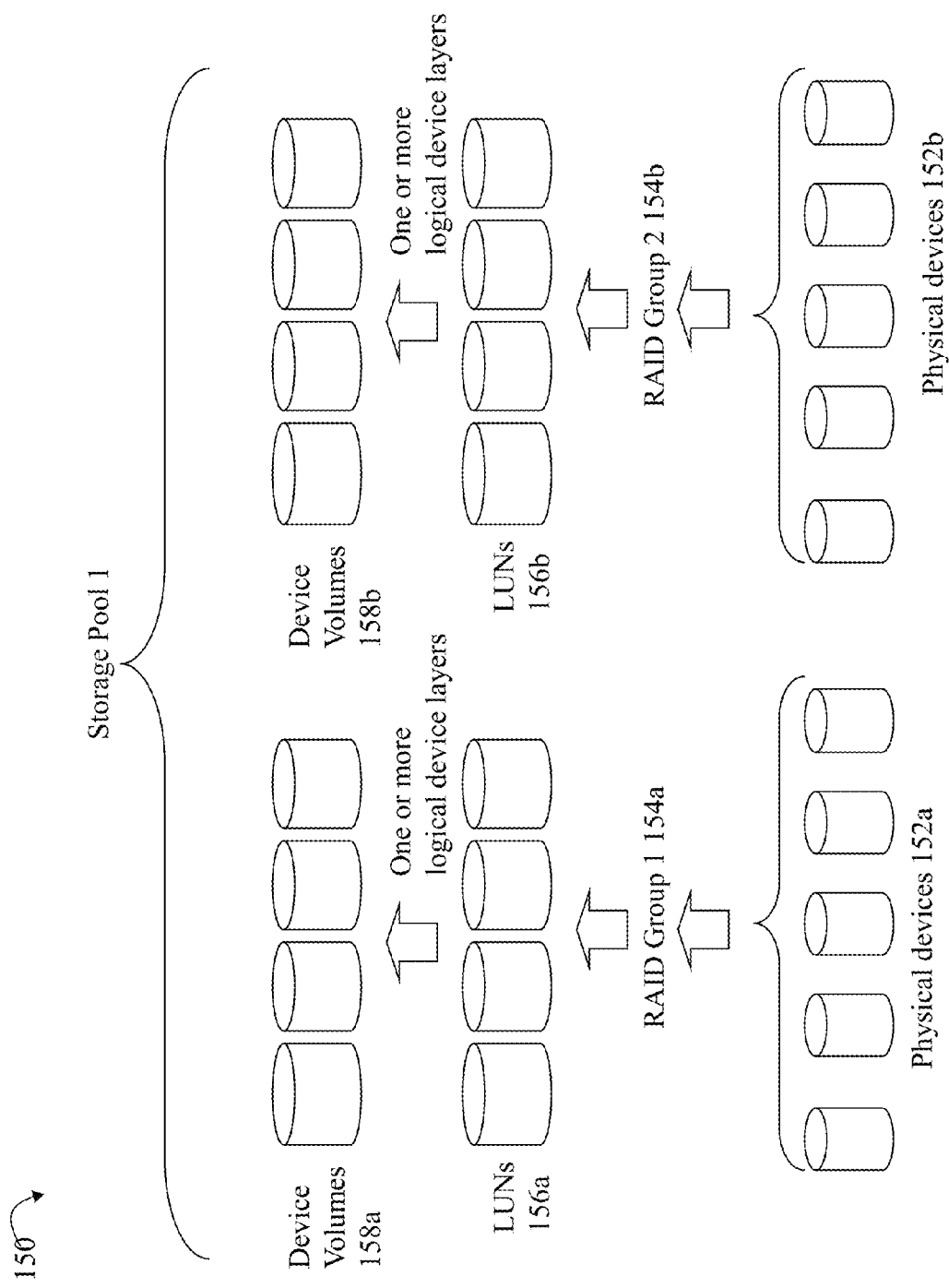
FIG. 8 is an example illustrating different logical constructs of physical devices that may be used in connection with a storage pool in an embodiment using techniques herein.

Referring to FIG. 8, shown is an example representing generally how storage pools may be formed from physical devices in an embodiment in accordance with techniques herein. The example 150 illustrates how storage pools may be constructed from groups of physical devices in connection with both the primary and external data storage systems. For example, RAID Group1 154a may be formed from physical devices (PDs) 152a. A storage pool may have a particular RAID level and RAID configuration or layout for the type of storage pool being formed. For example, for physical devices 152a on a first data storage system type when forming a storage Pool, RAID-5 may be used in a 3+1 configuration (e.g., 4 data drives and 1 parity drive). The RAID Group 1 154a may provide a number of data storage LUNs 156a. An embodiment may also utilize one or more additional logical device layers on top of the LUNs 156a to form one or more logical device volumes 158a. The particular additional logical device layers used, if any, may vary with the data storage system. It should be noted that there may not be a 1-1 correspondence between the LUNs of 156a and the volumes of 158a. In a similar manner, device volumes 158b may be formed or configured from physical devices 152b. The storage pool 1 of the example 150 illustrates two RAID groups being used to define a single storage pool although, more generally, one or more RAID groups may be used to form a storage pool in an embodiment using RAID techniques.

LUNs such as those represented by elements 156a, 156b may correspond to external LUNs of the external DS having PDs 152a, 152b included in the external DS. Device volumes 158a, 158b may represent one or more logical devices such as presented to the host to which I/Os may be issued whereby the underlying PDs providing the physical storage may be included in the external DS. Thus, FIG. 8 illustrates more specifically how an SP with logical device volumes 158a, 158b may be configured using external LUNs and associated PDs of the external DS. One type of logical device represented by 158a and 158b which may have storage provisioned from one or more SPs such as illustrated in FIG. 8 is a thin or virtually provisioned device. A thin device presents a logical storage space to one or more applications running on a host where different portions of the logical storage space may or may not have corresponding physical storage space associated therewith. Thus, an access of the logical storage space of the thin device results in either a null pointer (or equivalent) indicating that no corresponding physical storage space has yet been allocated, or results in a reference to a data device which in turn references the underlying physical storage space. With thin or virtually provisioned devices having a logical storage space/range, associated physical storage may not be allocated for the entire logical storage space when created. Rather, portions of physical storage may be allocated/deallocated and mapped/unmapped with respect to the thin device's logical storage space as needed.

Thin devices and thin provisioning are described in more detail in U.S. patent application Ser. No. 11/726,831, filed Mar. 23, 2007 (U.S. Patent App. Pub. No. 2009/0070541 A1), AUTOMATED INFORMATION LIFE-CYCLE MANAGEMENT WITH THIN PROVISIONING, Yochai, and U.S. patent application Ser. No. 11/903,869, filed Sep. 25, 2007, DATA DE-DUPLICATION USING THIN PROVISIONING, Veprinsky et al., now U.S. Pat. No. 7,822,939, both of which are incorporated by reference herein.

As described above, a thin device (also referred to as a virtual provision device) is a device that represents a certain capacity having an associated address range. Storage may be allocated for thin devices in chunks or data portions of a particular size as needed rather than allocate all storage necessary for the thin device's entire capacity. Therefore, it may be the case that at any point in time, only a small number of portions or chunks of the thin device actually are allocated and consume physical storage on the back end (on physical disks, flash or other physical storage devices). A thin device may be constructed of chunks having a size that may vary with embodiment. For example, in one embodiment, a chunk may correspond to a group of 12 tracks (e.g., 12 tracks*64 Kbytes/track=768 Kbytes/chunk). As also noted with a thin device, the different chunks may reside on different data devices in one or more storage tiers. In one embodiment, as will be described below, a storage tier may consist of one or more storage pools. Each storage pool may include multiple LUNs and their associated physical devices with thin devices then configured as a layer on top of the LUNs of the SPs. With thin devices, a system in accordance with techniques herein has flexibility to relocate individual chunks as desired to different devices in the same as well as different pools or storage tiers. For example, a system may relocate a chunk from a flash storage pool to a SATA storage pool. In one embodiment using techniques herein, a thin device can be bound to a particular storage pool of a storage tier at a point in time so that any chunks requiring allocation of additional storage, such as may occur when writing data to the thin device, result in allocating storage from this storage pool. Such binding may change over time for a thin device.

A thin device may contain thousands and even hundreds of thousands of such chunks. As such, tracking and managing performance data such as one or more performance statistics for each chunk, across all such chunks, for a storage group of thin devices can be cumbersome and consume an excessive amount of resources. In connection with performing data movement optimizations, performance data about thin devices may be collected where such information may be used to determine which chunks of thin devices are most active relative to others. Such evaluation may be performed in connection with determining where to locate and/or move data of the different chunks with respect to the different storage tiers in a multi-storage tier environment. In connection with examples in following paragraphs, details such as having a single storage pool in each storage tier, a single storage group, and the like, are provided for purposes of illustration. Those of ordinary skill in the art will readily appreciate the more general applicability of techniques herein in other embodiments such as, for example, having a storage group include a plurality of storage pools, and the like.

Referring to FIG. 8A, shown is an example 700 illustrating use of a thin device in an embodiment in accordance with techniques herein. The example 700 includes three storage pools 712, 714 and 716 with each such pool representing a storage pool of a different storage tier. For example, pool 712 may represent a storage pool of tier A of flash storage devices, pool 714 may represent a storage pool of tier B of FC storage devices, and pool 716 may represent a storage pool of tier C of SATA storage devices. Each storage pool may include a plurality of logical devices and associated physical devices (or portions thereof) to which the logical devices are mapped. Element 702 represents the thin device address space or range including chunks which are mapped to different storage pools. For example, element 702a denotes a chunk C1 which is mapped to storage pool 712 and element 702b denotes a chunk C2 which is mapped to storage pool 714. Element 702 may be a representation for a first thin device which is included in a storage group of one or more thin devices.

It should be noted that although the example 700 illustrates only a single storage pool per storage tier, an embodiment may also have multiple storage pools per tier. In connection with techniques herein, any one or more of the pools 712, 714 and 716 may have physical storage provided by external PDs of one or more external data storage system whereby the particular performance classifications and underlying PD technology is unknown to the primary data storage system performing data storage modeling and data storage movement and optimizations.

Figure 8B:
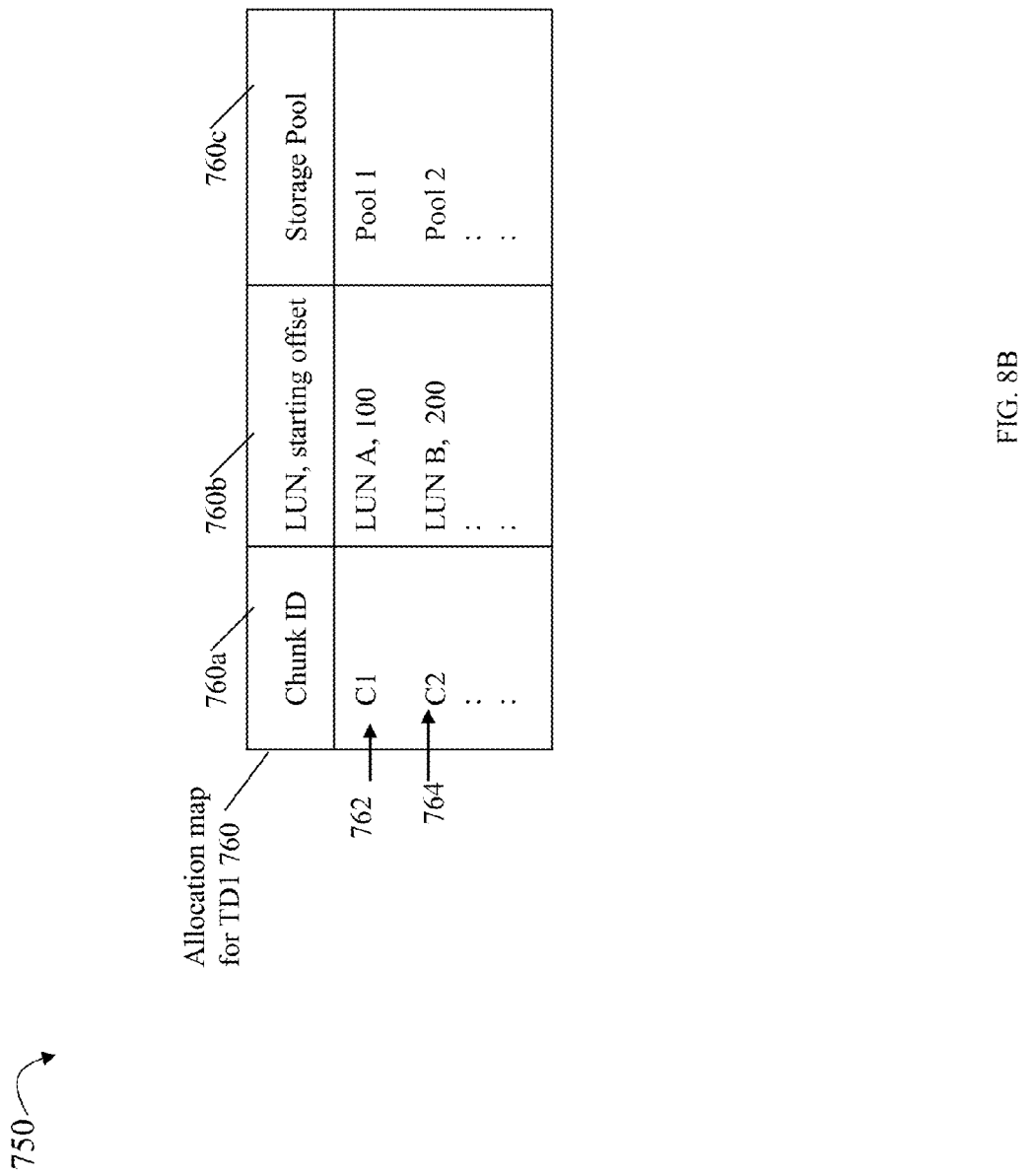

Referring to FIG. 8B, shown is an example representation of information that may be included in an allocation map in an embodiment in accordance with techniques herein. An allocation map may be used to identify the mapping for each thin device (TD) chunk (e.g. where each chunk is physically located). Element 760 represents an allocation map that may be maintained for each TD. In this example, element 760 represents information as may be maintained for a single TD although another allocation map may be similarly used and maintained for each other TD in a storage group. Element 760 may represent mapping information as illustrated in FIG. 8A such as in connection the mapping of 702 to different storage pool devices. The allocation map 760 may contain an entry for each chunk and identify which LUN and associated physical storage is mapped to the chunk. For each entry or row of the map 760 corresponding to a chunk, a first column 760a, Chunk ID, denotes an identifier to uniquely identify the chunk of the TD, a second column 760b, indicates information about the external LUN and offset to which the chunk is mapped, and a third column storage pool 760c denotes the storage pool including the external LUN of 760b. For example, entry 762 represents chunk C1 illustrated in FIG. 8A as 702a and entry 764 represents chunk C2 illustrated in FIG. 8A as 702b. It should be noted that although not illustrated, the allocation map may include or otherwise use other tables and structures which identify a further mapping for each LUN such as which physical device locations map to which LUN. Such information as illustrated and described in connection with FIG. 8B may be maintained for each thin device in an embodiment in accordance with techniques herein.

A thin or virtually provisioned device is one type of device that may have storage configured from SPs whereby techniques herein may be used in connection with modeling performance of the PDs included in external data storage systems providing physical storage for such thin devices based on a specified workload of portions of such devices.

Figure 9:
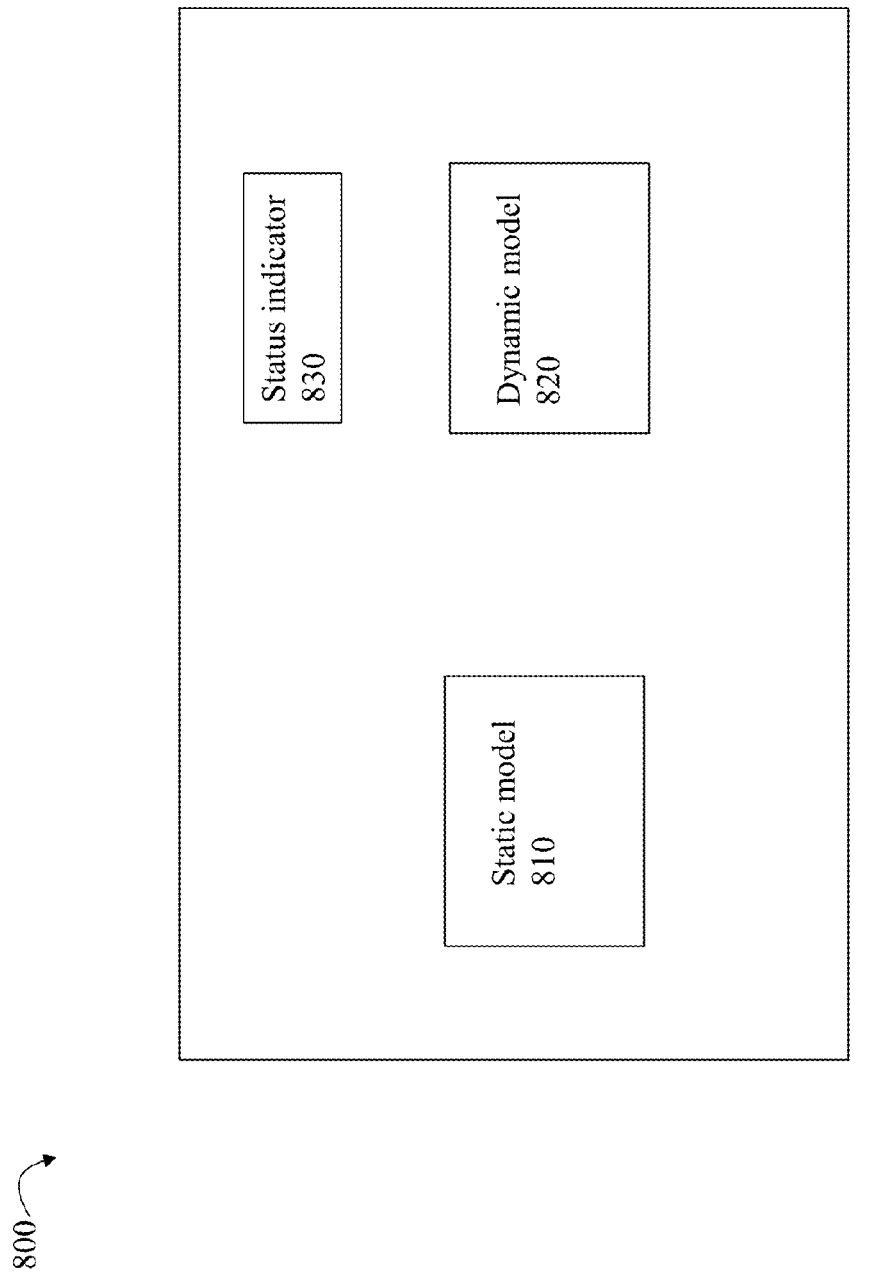
FIG. 9 is an example of models and a status indicator that may be used in an embodiment in accordance with techniques herein.

Referring to FIG. 9, shown is an example of components and data that may be used in an embodiment in accordance with techniques herein. The example 800 includes a static model 810, a dynamic model 820 and a status indicator 830. In connection with techniques herein, the static model 810 and dynamic model 820 may be used to generally model storage whose performance capabilities are unknown or incomplete, such as may the case with the external LUNs and backing PDs located on one or more external data storage systems. In one aspect, the static model 810 does not account for the element of time, while the dynamic model 820 does. Dynamic models such as 820 may change with reference to time. Static models such as 810 may be characterized as at equilibrium or in a steady state providing a time independent view of a system which may not change or adapt over time. The static model 810 may be initially used for a time period. During this time period, data collection and processing may be performed to build and calibrate an initial set of performance curves of the dynamic model 820 for the storage whose performance capabilities are unknown or incomplete. Such performance curves may be used to predict or model a RT for a given workload. Thus a component such as the data storage optimizer described elsewhere herein may initially use the static model 810 and then switch to use of the dynamic model 820 once calibration of an initial set of the performance curves used for modeling is complete. The status indicator 830 may be denote a state regarding the calibration of the performance curves and availability of the dynamic model 820 for use. For example, the status indicator 830 may denote a state of incomplete or unavailable prior to completing calibration of the performance curves. Once the initial set of performance curves has been calibrated and are available for use in modeling, the status indicator 830 may be accordingly updated to complete or available thereby denoting completion of the calibration curves and that the dynamic model 820 may be used rather than the static model 810. The data storage optimizer may examine the status indicator 830 to determine which of the static and dynamic models 810, 820 to use at a point in time. The data storage optimizer may use the static model when the dynamic model is otherwise not available for use as denoted by the status indicator 830.

The static model 810 may perform modeling of external LUNs of the external data storage system using information supplied by a user. The static model may run immediately without requiring discovery of any information about the external DS. The static model may not provide high confidence in modeled performance predictions such as modeled RT, since such predictions are not based on actual or observed information about the external DS. Thus, it may be preferable to use the dynamic model 820, when available, rather than the static model 810.

The status indicator 830 reflecting whether the performance curves of the dynamic model have completed calibration, such as have been generated to a maximum or "wall" queue depth value described elsewhere herein, may more generally be characterized as one criteria used in connection with determining whether the use the static model 810 or dynamic model 820 for modeling or predicting performance given a particular workload specified as an input. Additional variations and examples of criteria are described elsewhere herein.

One embodiment of the static model 810 may obtain user-supplied and configuration specified inputs. A first of the inputs may be a user input identifying a PD drive technology of the external storage. For example, the first input may identify the PD drive technology for each of the storage tiers of the external DS having external LUNs managed using techniques herein. The logical configuration information available such as from a configuration file may identify the number and types of storage tiers of the external DSs and the particular external LUNs included in each tier. However, the available configuration information may not denote the particular drive technology of each such tier used in the external DS thereby omitting more detailed information about the external PDs providing the underlying physical storage for the external LUNs. In this manner, the user may be asked to identify a drive technology for each tier in the external DS such as, for example, EFD or flash-based storage, one or more rotating disk drive types, and the like. The particular drive technology identified for a tier may be used to select a set of existing generic performance curves to model the RT for the tier. For example, an embodiment may have a generic set of performance curves for one or more drive technologies such as EFD, rotating FC disk drive, rotating SATA disk drive, and the like. Examples of performance curves are described elsewhere herein. Such generic performance curves may be used to model performance, such as RT, for a single PD of that particular technology type. The static model 810 may use a fixed predetermined ratio regarding how many PDs are mapped to each external LUN of the external DS. This may be used to estimate the number of PDs in each tier for modeling purposes. For example, one embodiment may use a 1:1 ratio where it is a modeling assumption that each external LUN corresponds to a single PD of the storage tier identified for the external LUN. In this manner, the static model 810 may operate based on the foregoing until the dynamic model becomes available for use to model the external DS and its PDs such as in connection with performing processing and evaluations for data movement optimizations.

Based on the user input about drive technology for a given storage tier, a model for the generic drive technology expressed in terms of performance curves per PD may be selected and used to model RT for a given workload (e.g., IOPS of a particular size, R/W mix, and the like). In this manner, the generic model performance curves for a particular drive technology may be used to make predictions about RT. For example, to model the workload of an SP including a number of LUNs of a particular tier, a number of underlying PDs in the SP and tier may be determined. For purposes of simplification in illustration, assume that the user-supplied input identified PDs of a tier as EFD and the SP includes only PDs of this tier. An embodiment may use a set of performance generic performance curves for EFD to model performance of a single PD (e.g. to predict performance in term of a modeled RT for given workload). Thus, to model SP performance including N LUNs and thus N EFD PDs, assume the workload is evenly distributed across PDs of the SP and the modeled workload may be accordingly distributed evenly across all N PDs each having performance capabilities as modeled using the performance curves of the EFD technology type.

Modeling techniques herein such as those noted above with the static model may use characteristic or modeled performance curves for different drive technologies. In connection with techniques herein as mentioned above, response time may be considered as performance criteria alone, or in combination with other performance criteria. The techniques herein may consider different performance characteristic information and curves that may vary with each storage tier, type of physical device, device vendor, and the like. In particular, performance curves for the different storage tiers may be determined and used to model or characterize a target tier of a particular technology. As an example, consider an input workload of N I/O operations/second. The resulting response time experienced for the same workload varies with storage tier due to the underlying capabilities of each tier's technology. As such, performance curves may be used in connection with techniques herein to model expected response times if a particular data movement is performed in accordance with candidate promotion and demotion thresholds.

Figure 10:
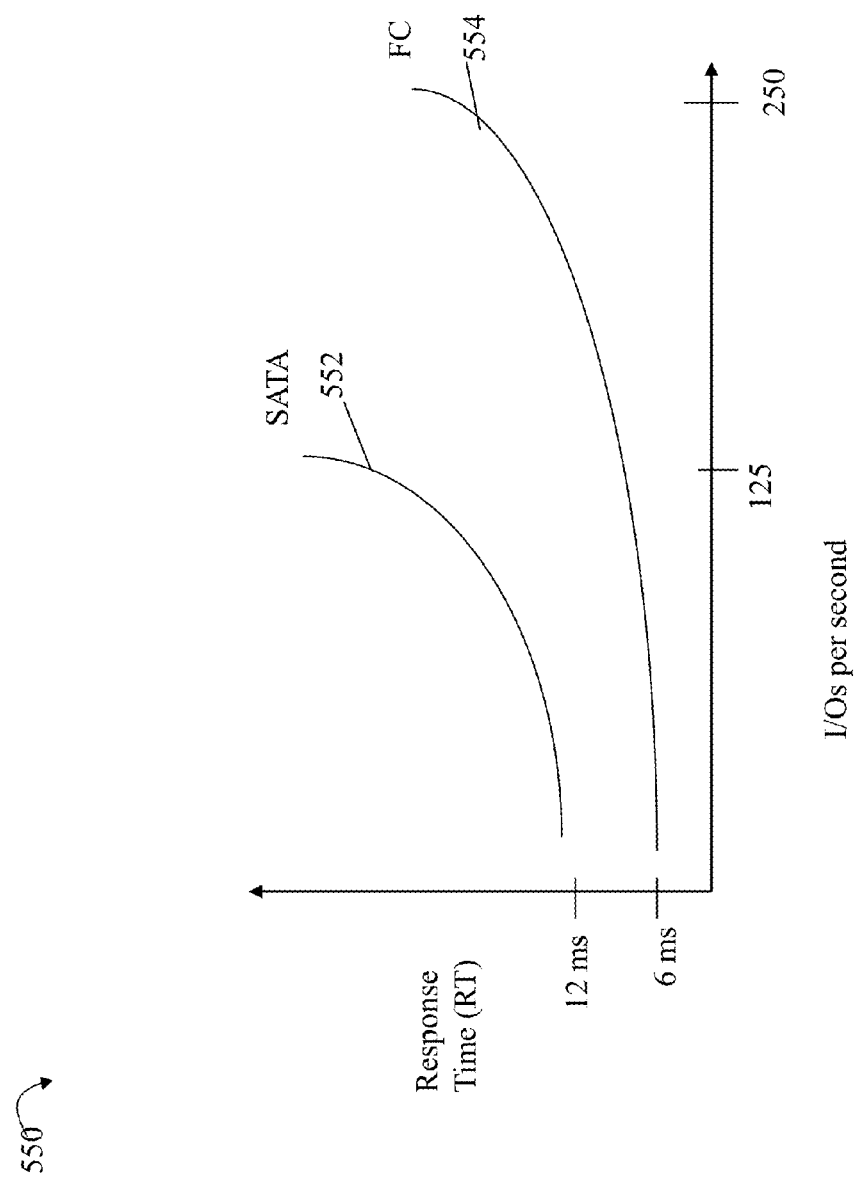
FIGS. 10, 13 and 14 are examples of performance curves that may be used in an embodiment in accordance with techniques herein.

Referring to FIG. 10, shown is an example of performance characteristic information illustrated in the form of curves for different storage tiers such as may be based on different disk drive types or technologies. The example 550 illustrates general curve shapes as may be associated with a SATA disk drive (as represented by 552) and an FC disk drive (as represented by 554) in connection with processing rate (X-axis in terms of IOs/second) vs. response time (Y-axis). Thus, the example 550 is an example of generic performance curves such as may be used with static modeling for a single PD of a particular technology. As may be seen from the illustration 550, for a same processing rate of I/Os/second, different RTs are obtained for each of a SATA disk drive and an FC disk drive. As such, when moving data storage tier of SATA drives to a storage tier of FC drives, differences in performance characteristics such as response times are taken into consideration in accordance with techniques herein. An embodiment may store data as represented by the curves of FIG. 10 in one or more tables having rows and columns of data point values (e.g., X and Y coordinates for a plurality of points). When stored in tabular form, interpolation, curve fitting techniques, and the like, may be used in connection with determining values of X and Y coordinates lying between two existing points stored in the table. When considering moving data between devices of different types or more generally having different device characteristics, such tables of performance characteristic information may be used to determine, for a given processing rate of I/Os per second, a modeled RT for each of the different device types. For example, consider a first storage tier of SATA drives and a second storage tier of FC disk drives. In modeling performance based on a proposed data movement, an aggregated or total processing rate for each target tier may be determined, for example, using performance data collected. For such a total processing rate on the X-axis, a corresponding modeled RT value (Y-axis) may be obtained for each storage tier using tables or curves, such as illustrated in FIG. 10. An embodiment may use appropriate performance curves for each of the different storage tiers and associated technologies of the tiers. The performance curves may be obtained for each storage tier based on observed or collected data through experimentation. The particular parameters or metrics of collected data used to obtain performance curves to model expected RT may vary with storage tier and underlying technology. For example, as described in U.S. patent application Ser. No. 12/924,361, filed Sep. 24, 2010, TECHNIQUES FOR MODELING DISK PERFORMANCE, now U.S. Pat. No. 8,868,798, which is incorporated by reference herein, performance curves for modeling response times for disk drives is described using total number of I/Os and I/O size. Other technologies such as flash-based drives may use other parameters in modeling to determine the appropriate performance curve. For example, one approach to modeling flash-based drives may utilize observed performance data related to total number of I/Os, I/O size, and a ratio of read operations/write operations. Additionally, data modeling for different storage drives may utilize a feedback process. At a point in time, there is a set of data representing the performance curve for a particular drive. The actual measured RT of the drive for a given workload in terms of I/Os per second, for example, may be compared to a modeled RT value determined using the performance curve for similar model parameter values. Adjustments may be made to the modeled performance curve based on differences between the measured RT and modeled RT.

In connection with FIG. 10, it should be noted that the performance curve of modeled response time is a function of I/O rate or throughput (e.g. IOPS or I/Os per second). Performance curves may also be modeled for response time as a function of IOPS and also I/O size for the different storage tiers (e.g., physical device characteristics of physical devices in a particular tier). As discussed elsewhere herein, a given set of performance curves may exist for a particular I/O size, read/write mixture or ratio, and the like. Such curves may also be used to model performance at other I/O sizes and read/write mixtures using techniques such as interpolation, extrapolation, converting a hypothetical workload having one read/write mixture into an equivalent workload having a second read/write mixture as used in the performance curves, and the like.

Thus, FIG. 10 is an example of performance curves such as may be used in connection with the static model for each supported generic drive technology.

What will now be described in more detail is processing performed in connection with the dynamic model 820. Generally, the dynamic model may use a simplified model of the external data storage system, for example, such as generally described above in connection with FIG. 7. It is also assumed that the external LUNs being modeled are included in SPs as also described above where the workload directed to external LUNs in an SP is approximately equally distributed across all external LUNs, and thus external PDs, of the SP. The dynamic model has an initial phase of building or calibrating the performance curves used for modeling and then ongoing processing may be performed for validation and any suitable continual adjustments to such performance curves. Exploratory I/Os may be issued to increase the speed and accuracy of performance discovery process using fixed queue depths providing insights into performance characteristics of the PDs of the external DS. As described herein, techniques may be used so that such exploratory I/O testing may be performed without requiring dedicated, exclusive access to the external DS for testing purposes. Additionally, techniques for dynamic modeling may also leverage observations of non-exploratory I/Os from the host to estimate the unreported workload of the external DS.

External storage with the dynamic model may be modeled at the level of aggregates of external LUNs (and associated external PDs providing the provisioned physical storage). As described in more detail below, a set of one or more external LUNs may be modeled as a single group or dynamic model instance. Collectively, all such groups may be used to model the overall performance. Separate dynamic model instances (each having a different set of performance curves for modeling external LUNs and backing PDs thereof) may be created and maintained for each group of external LUNs determined to share data storage system back-end resources. For example, a first group of external LUNs may share a first set of back-end resources and a second group of external LUNs may share a second different set of back-end resources. Using testing techniques herein, it may be determined that each LUN in the first group does not share any back end resources with any LUN of the second group, and each LUN in the second group does not share any back end resources with any LUN of the first group. For each of the first and second groups of LUNs, a different dynamic model instance having its own set of performance curves may be created and maintained.

Back-end resource sharing with respect to a data storage system may be characterized with respect to back-end resources such as the same PD, the same DA or disk controller, and the like. Thus, two sets of external LUNs may be characterized as not sharing back-end resources if, for example, the two sets do not include any of the same PDs, do not use the same DA, and the like. With reference back to FIG. 7, for example, back-end resources may refer to those resources (e.g., backend CPUs and PDs) used in the I/O path which are below the cache 216 in this illustrated embodiment. Back-end resource sharing relationships may be determined by structural performance tests (also referred to as share testing or back-end resource share testing) and, when available, by examining the serial numbers of the external storage systems underlying the external LUNs. It may be assumed that no external data storage system back-end resource sharing exists between two external LUNs derived from external storage systems with different serial numbers.

As noted above, two external LUNs are in separate groups if they do not share back-end resources. Determination of whether external LUNs share BE resources may be determined through exploratory I/O testing techniques described below and/or, when available, by examining the serial numbers of the external DSs including the external LUNs. More generally, the serial numbers may be used as information identifying different data storage systems under the assumption that each external DS has a different or unique serial number or other form of unique DS identifier. Therefore, if a first external LUN is included in a first DS having a first serial number or ID and a second external LUN is included in a second DS having a second serial number or ID different from the first serial number or ID, it may be assumed that the first and second external LUNs are in different data storage systems and therefore do not share backend resources thereby each being included in different groups of external LUNs. In instances where DS serial numbers are available and two LUNs being evaluated are each included in external DSs with different serial numbers, it may be assumed that the two LUNs do not share BE resources without utilizing other techniques such as exploratory I/O testing to determine whether the external LUNs share BE resources.

It should be noted that if DS serial numbers are not available or if two external LUNs are in the same external DS, further testing may be performed to determine whether the two external LUNs share back end resources. External LUNs that share back end resources may be included in a same modeled group whereby such groups may be determined through exploratory I/O testing. With exploratory I/O testing described in more detail below using fixed queue depths, I/Os may be issued to determine LUN back end resource dependency. Testing may include issuing I/Os to a first of the LUN groups at a first point in time, and then issuing I/Os at a second point in time to both of the LUN groups in parallel and observing whether I/O throughput of the first LUN group at the second point in time is adversely affected in comparison to that of the first point in time. If the two LUN groups share back end resources, the I/O throughput when I/Os are issued to both LUN groups at the same time (e.g. in parallel) will be significantly less (e.g., as determined by a threshold or predetermined amount) than when I/Os are issued to either of the LUN groups separately.

An end result or output generated and used in connection with dynamic modeling is to determine LUN groups where each group includes one or more external LUNs which have been determined through testing to share back-end resources and which also do not share back end resources with LUNs from other groups. For each such independent LUN group, a separate dynamic model instance is created. In other words, for each such LUN group, techniques herein create and maintain a separate model instance that models the aggregate performance of the LUNs in the group. Thus, for each LUN group, a set of one or more performance curves may be created and maintained in accordance with techniques herein. For a workload such as a number of IOPs, the model of the external LUN group determines or models the RT. As described below in more detail, the dynamic model may include performance curves of IOPS vs RT at different IO sizes where the performance curve represents average performance for a single PD in the group for a given workload. The model may provide an estimate of the unreported workload for the external LUNs of the modeled LUN group, and the model supports predicting RT for a given hypothetical workload directed and spread over the LUNs of the group that may function as a pool having storage provisioned therefrom for storing data.

As a first step in determining the groups of external LUNs which share back end resources, SPs having external LUNs from one or more external DS are selected. If available, the data storage system serial number that may be identified for each such SP and used to determine whether particular LUNs are from different data storage systems and therefore do not share back end resources. This information may be used to reduce the number of LUN groups (or more generally different LUN combinations) to be tested using exploratory I/Os. It should be noted that an SP may be configured using storage from multiple different external LUN groups having storage provisioned across multiple different data storage systems. Thus, two SPs may have storage provisioned from one or more of the same PD or same external LUNs of an external data storage system.

As a second step in connection with determining the groups of external LUNs which share back end resources, logical load partitioning (LLP) groups may be created by partitioning external LUNs (and thus external PDs provisioned for such external LUNs) according to common SP membership. An LLP group may be defined as a set of external LUNs (and backing PDs) providing provisioned storage for the same set of one or more SPs. In this manner, modeling techniques herein may assume that workload directed to the set of external LUNs or external PDs in the same LLP is spread approximately evenly across all external LUNs and external PDs in the same LLP. In connection with modeling SPs from which thin devices are provisioned, it may be assumed that the workload is spread evenly across all external LUNs (and backing PDs) in the SP. Thus, for a set of external LUNs or external PDs common to more than one SP, the same assumption is also made.

Figure 11:
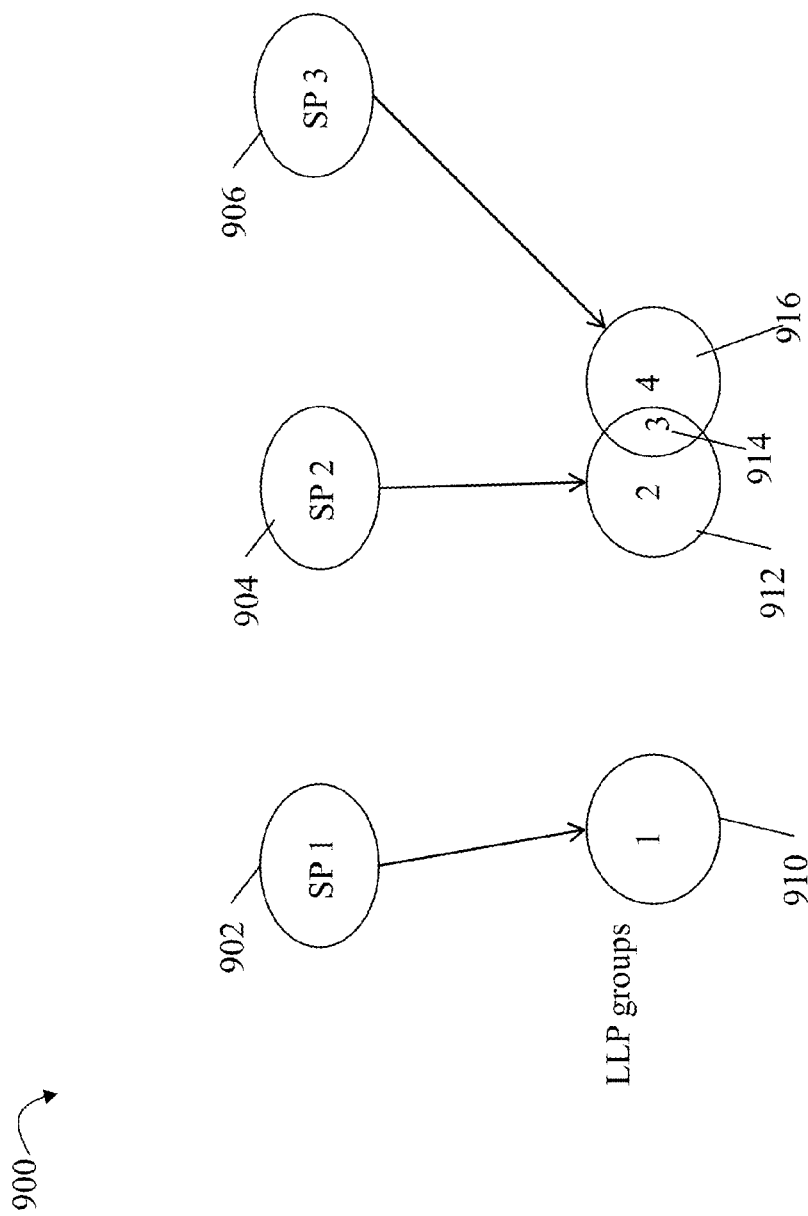
FIGS. 11 and 12 illustrate processing performed in connection with identifying groups of devices for share testing in accordance with techniques herein.

For example, reference is made to FIG. 11 including three SPs 902, 904 and 906 and four LLPs 910, 912, 914 and 916. For the three SPs 902, 904 and 906, 4 LLPs may be identified where LLP group 1 910 contains external LUNs (and backing external PDs) providing storage for only SP1 902, LLP group 2 912 contains external LUNs (and backing PDs) providing storage exclusively or only for SP2 but not SP3 (e.g. portion denoted by 912 less 914), LLP group 3 914 contains external LUNs (and backing PDs) underlying or providing storage for both SP2 and SP3 (e.g., with LLP group 3, the set of external PDs in LLP 3 gets some portion of workload from SP2 and SP3 which is assumed evenly spread across external PDs in LLP3), and LLP group 4 916 contains external LUNs (and backing PDs) providing storage for only SP3 and not SP2.

Figure 12:
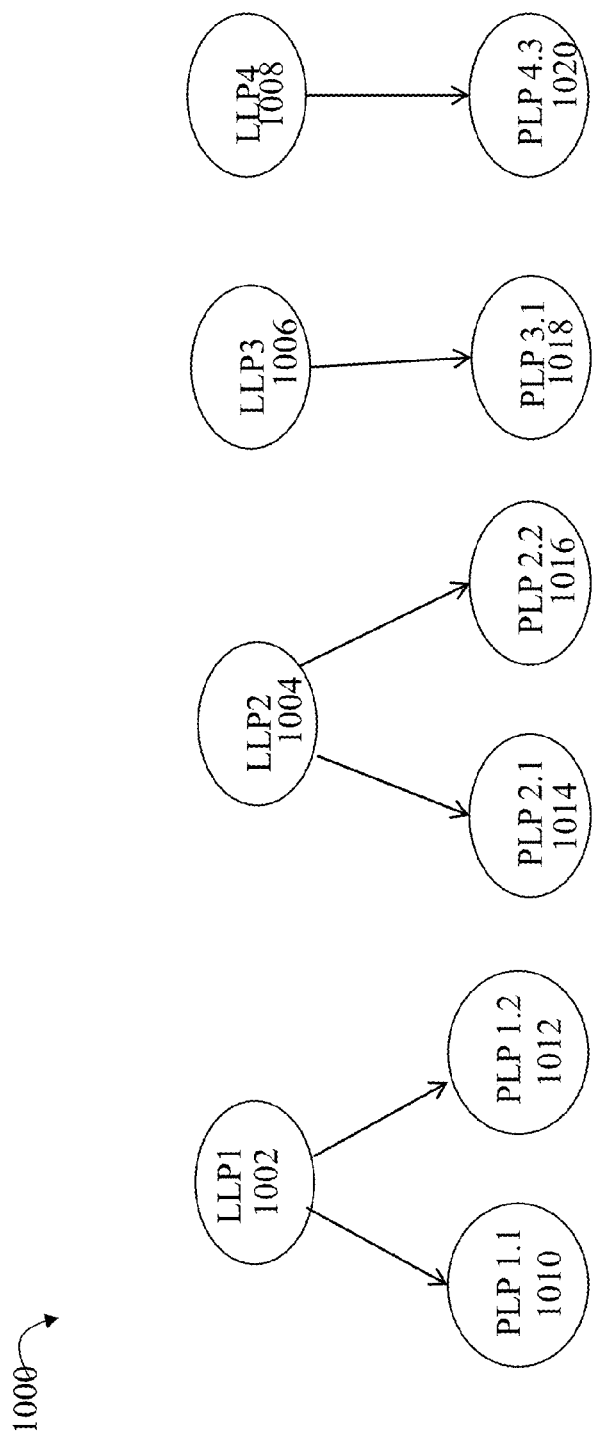

As a third step in determining the groups of external LUNs which share back end resources, each LLP group may be partitioned into one or more PLP (physical load partitioning) groups. A PLP group includes the external LUNs (and thus such external LUNs backing PDs) within an LLP group which are in the same external DS. Such a determination may be made using data storage system serial numbers or other unique data storage system identifiers that may be available in an embodiment. For example, reference is made to FIG. 12 illustrating how the 4 LLP groups from FIG. 11 may be partitioned into PLP groups. Assume that there are 4 different external data storage systems from which external LUNs may be included. In this example, the 4 LLP groups LLP1 through LLP4 (denoted by 1002, 1004, 1006 and 1008 respectively) may be partitioned into 6 PLPs identified as follows:

PLP group 1.1 1010 includes external LUNs from LLP1 included in data storage system 1;

PLP group 1.2 1012 includes external LUNs from LLP1 included in data storage system 2;

PLP group 2.1 1014 includes external LUNs from LLP2 included in data storage system 1;

PLP group 2.2 1016 includes external LUNs from LLP2 included in data storage system 2;

PLP group 3.1 1018 includes external LUNs from LLP3 included in data storage system 1; and PLP group 4.3.1 1020 includes external LUNs from LLP4 included in data storage system 3.

As a fourth step in determining the groups of external LUNs which share back end resources, processing may be performed to determine which PLP groups of a given data storage system share back-end resources. For those external LUNs which are included in two or more different PLPs and also included in the same external DS, exploratory I/O testing may be performed to determine whether such PLPs in the same external DS share back end resources. Such exploratory I/O testing between such groups of external LUNs may be also referred to herein as share testing or structural testing.

For example, with reference to FIG. 12, PLP 1.1 1010, PLP 2.1 1014 and PLP 3.1 1018 are included in the same data storage system 1 and exploratory I/O testing may be used to determine whether any of these PLP groups share back end resources of data storage system 1. It should be noted that the more PLPs in the same data storage system, the greater the number of PLP pairs to test (e.g. number of possible PLP permutations or distinct PLP pairs evaluated). Generally, if there are N PLPs from the same external data storage system, then the number of pairs of PLPs for which exploratory I/O testing may be performed may be as high as, for example, (N*N−1))/2. To further illustrate with respect to data storage system 1 and PLP groups 1.1, 2.1 and 3.1 of FIG. 12, exploratory I/O testing for determining whether back-end resource sharing exists may include testing the following 3 PLP pair combinations: 1.1 and 2.1, 1.1 and 3.1, 2.1 and 3.1. The particulars of exploratory I/O testing to determine whether any such pairs of PLPs share backend resources of the data storage system are described in more detail below.

If exploratory I/O testing may not be performed (e.g., since it may not be feasible to perform such processing) to further determine whether any pairs of PLPs on the same data storage system share back end resources, then a modeling assumption may be made that sharing may exist among any/all PLPs of the same such data storage system and may therefore model all PLPs of the same external data storage system as one group of devices (e.g., single dynamic modeling instance) having a single set of performance curves.

It should be noted that there may be a limit in the number of LUNs that can be tested simultaneously using exploratory I/Os. If this limit is less than the number of LUNs in a PLP being evaluated using exploratory I/Os, the PLP may be further partitioned and evaluated against other PLPs in portions.

As a fifth step in determining the groups of external LUNs which share back end resources, dynamic model groupings are formed of PLP groups that have been determined to share back end data storage system resources. It should be noted that, as a result of testing and processing described herein, a determination is made as to what one or more LUNs belong in each external LUN group whereby each resulting group of one or more LUNs may share back end resources with each other but each LUN in the same group does not share back end resources with any LUN in another different LUN group. To further illustrate continuing with the above-mentioned example, PLP groups 1.1 and 2.1 may be determined to share back end resources of the first data storage system with each other and PLP group 3.1 may be determined as not sharing back end resources of the first data storage system with PLP groups 1.1 and 2.1. In this case, a first dynamic model instance may be used to represent performance modeling for PLP groups 1.1 and 2.1 and a second different dynamic model instance may be used to represent performance modeling for PLP group 3.1 alone. Each of the forgoing dynamic model instances may have its own set of performance curves also constructed using exploratory I/O testing. This is also described in more detail below along with the exploratory I/O testing in connection with share testing or structural testing. In connection with techniques herein, the exploratory I/Os may be of selected fixed I/O sized and may also include only read operations expected to cause a read miss (e.g., random read miss or RRMs).

It should be noted that the workload considered for a single group of external LUNs forming a dynamic model grouping may be modeled as distributed evenly across all LUNs of the group based on provided storage capacity of the LUN.

In connection with mathematical queuing theory expressed in the context of a storage request processing system, Little's theorem or law states generally that the long-term average number of requests in a stable system L is equal to the long-term average effective arrival rate, λ, multiplied by the average time a request spends in the system, W; or expressed algebraically: $L=\lambda W$. In connection with techniques herein, Little's Law may be applied and expressed as follows:

$$QD=RT*IOPS \qquad \text{EQUATION 1}$$

where QD=queue (Q) depth, RT=response time (such as in seconds) and IOPS is an I/O throughput rate at which I/Os are issued such as in I/Os per second. In accordance with Little's law as in EQUATION 1 and performing exploratory I/O testing, if testing issues I/Os at a given rate denoted by IOPS as in EQUATION 1 sufficient to maintain an average fixed Q depth as also in EQUATION 1, the observed IOPS should approximately equal QD/RT (within some threshold or acceptable error rate) if the external LUNs or external PDs being modeled are servicing only I/Os (workload) as reported or attributed to in EQUATION 1. However, if the external PDs of the external DS being modeled are also servicing other I/Os (unreported workload) from other sources, then EQUATION 1 will not be true. Rather, in such a case if there is unreported additional workload contributing to the observed RT, then QD>RT observed*IOPSobserved. Additionally, if QD<RTobserved*IOPS observed (by more than the allowable threshold or acceptable amount of error), then there is an error in the way the exploratory testing is performed or otherwise related to the manner in which the observed RT and observed IOPS are reported.

Little's law as expressed in EQUATION 1 may be used in connection with techniques herein to estimate the total number of IOPS that would have been possible had there been no unreported workload. In other words, EQUATION 1 may be used to estimate a maximum number of IOPS that can be performed for a particular combination of Q depth and observed RT.

In connection with performing share testing or structural testing to determine whether two PLPs share back end data storage system resources, consider the following using PLP1 and PLP2 in the same external DS. The values of IOPS and Q depth may be average values for the observed time period across all LUNs in a PLP group. A first average observed RT may be obtained by issuing RRM exploratory I/Os of a fixed size to PLP1 (e.g., external LUNs in PLP1) for a first time period without also issuing exploratory I/Os to PLP2. The rate at which I/Os are issued may be sufficient to maintain an average Q depth for the first time period. The average Q depth may be a predetermined Q-depth such as 4 which is expected to denote a significant workload on most systems. A first projected or estimated I/O throughput (e.g., I/O rate in terms of IOPS) may be calculated using EQUATION 1 for the first time period by multiplying the average Q depth of 4 by the first average observed RT. In a second step for a second time period, I/Os are issued to both PLP1 and PLP2 simultaneously at a rate sufficient to obtain the same average Q-depth of 4 for both PLP1 and PLP2. A second average observed RT may be obtained for PLP1 when issuing I/Os to both PLP1 and PLP2 simultaneously for the second time period. A second projected or estimated I/O rate or throughput in terms of IOPS for PLP1 may be calculated using EQUATION 1 thereby representing the maximum expected number of IOPS possible for PLP1 when issuing I/Os to both PLP1 and PLP2 simultaneously. The second projected or estimated I/O rate for PLP1 may be determined by multiplying the average Q depth of 4 by the second average observed RT. If the first and second estimated or projected IOPS for PLP1 are approximately the same (e.g., within some specified threshold), then it may be determined that PLP1 is independent from, and does not share back end resources (such as PDs) with, PLP2. Otherwise, PLP1 and PLP2 are dependent and share back end resources such as PDs. Such testing may be repeatedly performed for pairs of PLPs in the same external DS. If two PLPs are dependent in terms of back end resource sharing, then the PLPs may be merged or combined into a single PLP group for further share testing. For example, if PLP1 and PLP2 are dependent, then PLP1 and PLP2 may be combined into a single revised PLP group (PLP2-1) for further share testing against other PLPs in the same external DS. At the end of share testing, all PLPs which are dependent have been accordingly grouped together in the same group/set of modeled PLPs (e.g., same group of modeled PDs for which a set of performance curves may be determined in the aggregate).

It should be noted that the particular single fixed Q depth used for share testing may vary with embodiment and system. The selected value may be adjusted using information available to guide the decision. The selected value may also be validated or adjusted based on a measurement of the Q depth wall or maximum Q depth determined for performance curves as described elsewhere herein. For example, the Q depth for share testing may be at least ½ of the Q depth wall.

In calibrating the performance curves for each dynamic model instance representing a group of external LUNs which share back end data storage system resources, exploratory I/O testing may be performed at a range of fixed Q depths and a number of different I/O sizes. For example, an embodiment may issue RRM I/Os of a first small block size such as 8K bytes at a range of fixed queue depths. Similarly, RRM I/Os of a larger block size such as 64K bytes may also be issued at the same range of fixed queue depths. A first performance curve may be obtained for the I/O size of 8K bytes and a second performance curve may be obtained for the I/O size of 64K bytes. More generally, the I/O sizes should be chosen to maximize the chances of capturing the full range of performance capabilities. One approach is to include at least one I/O size that is small enough for performance is dominated by the compute capabilities of the underlying storage, and at least one I/O size that is large enough to be dominated by the data transfer capabilities of the underlying storage.

Little's law as expressed in EQUATION 1 may be used with such exploratory I/O testing at various Q depths to produce performance curves used for dynamic modeling. In connection with producing the performance curves used to model each group of sharing (dependent) external LUNs of the external DS, an embodiment may estimate the number of IOPS included in the performance curves used for modeling as QD/RTobserved. In other words, the performance curves may denote IOPs vs RT. For a first Q depth value, RRM I/Os may be issued at a rate sufficient to maintain the first Q depth as an average Q depth for a time period. For the time period, an average RT may be observed (RTobserved). The number of IOPS plotted on the performance curve for the RTobserved may be projected or estimated using EQUATION 1 as the mathematical product of RTobserved multiplied by the first Q depth value. In this manner, the techniques herein may be used to obtain performance curves without requiring exclusive use of the external DS for testing purposes and whereby the external DS and external LUNs being modeled may be used for servicing I/Os other than those associated with devices under management or reporting using techniques herein. In other words, Little's law as expressed in EQUATION 1 may be used to compensate or adjust IOPS values, as needed, where the IOPS values are used in the modeled performance curves for different Q depths and observed RT values. Thus, the performance curves may represent the capability of the IOPS that may be performed.

From these performance curves such as the two mentioned above obtained for I/O sizes of 8K bytes and 64K bytes, an embodiment may perform interpolation and/or extrapolation to determine a modeled performance RT for an arbitrary workload. For example, if an I/O size for the arbitrary workload (in terms of IOPS) is between 8K and 64K, interpolation may be used to determine the RT. If the I/O size is larger than the large I/O size of 64K, extrapolation may be performed.

What will now be described are further details regarding how an embodiment may perform interpolation and extrapolation using obtained performance curves. Once the performance curves comprising a model have been calibrated, the system is able to make predictions about what the utilization and random read response time would be for an arbitrary hypothetical logical workload, specified in terms of the average logical read and write I/O rates and the average logical read and write I/O sizes for each external LUN comprising the model. Since the model may not treat external LUNs comprising the model individually (only the aggregate performance is modeled such as for a group of devices), the specified per-device hypothetical workload may be translated into an average workload per device. For example, a group of devices modeled by a dynamic model instance with a set of performance curves may include multiple LUNs and associated backing PDs. For example, consider a group of LUNs being modeled as LUN A and LUN B and the hypothetical workload include a first workload W1 directed to LUN A and a second workload W2 directed to LUN B. The performance curves may express an average performance per LUN across all LUNs. In connection with modeling, the hypothetical workload per LUN used with the performance curves for modeling may take the average of the specified workload for the LUNs in the group. To further illustrate with the above example, the model may use a hypothetical workload of (W1+W2)/2, assuming LUN A and LUN B have the same storage capacity. If no workload is supplied for a LUN of a single group or for an entire group of LUNs, that workload is counted as a zero workload. However, when the hypothetical workload for each LUN within a single group varies, modeling may further use a modeling average workload that is higher than the computed average workload based on the hypothetically supplied workload(s). In other words, the average value that is used to model performance from the performance curves may be increased by an amount that depends on the standard deviation or variance of the hypothetical workloads supplied for all the LUNs in the group. The underlying modeling assumption or rationale is based upon the presumption that if some LUNs are loaded more heavily than others in the same group, actual response time and utilization may be under-estimated if only the average is used. To make the estimate tend to be more accurate, the effective average workload used by the model may be elevated.

Next, the average specified hypothetical workload is mapped into an approximately equivalent average pure physical read workload of a single average I/O size. To do this, the logical write component of the hypothetical load is translated into an equivalent number of physical read operations (of the same size as the logical writes). If the RAID type of the external storage is known, the translation into the equivalent number of read operations is performed according to that RAID type (e.g., a single 32 KB write to RAID1 would translate to two 32 KB reads). If the RAID type of the external storage is not known, then an assumption must be made about the RAID type, the most conservative approach being to assume the most costly RAID type, which is (currently) RAID. Once the logical write component of the hypothetical workload has been translated into an equivalent number of physical reads, the total equivalent read workload is calculated as follows:

1. The total equivalent read operation rate equals the actual hypothetical read rate plus the read-rate corresponding to the writes plus the read rate corresponding to the current unreported work load estimate. Techniques that may be used to determine the unreported workload estimate for a set of performance curves (or dynamic model instance) are described elsewhere herein.

2. The total equivalent read transfer rate equals the actual read transfer rate plus the read transfer-rate corresponding to the writes plus the read transfer rate corresponding to the unreported work load estimate.

At this point, the workload to be modeled includes both reported and unreported workload where the reported workload is that as specified as the hypothetical workload initially input. The total hypothetical workload to be modeled is characterized in terms of an approximately equivalent pure read workload with single average I/O size. It should be noted that the average I/O size may be determined using a read transfer rate and a read operation rate. For example, a read transfer rate may be 500 bytes/second and a read operation rate may be 10 reads/second and the average I/O size may be determined as 50 bytes (e.g., 500/10). The foregoing values for the total workload to be modeled (including reported and unreported workloads) may then be used with the performance curves to determine a modeled RT. In this manner, the expected performance for the total load is found by using the performance curves from the model, and linearly interpolating (or extrapolating) as needed based in relation of the total hypothetical workload I/O size and I/O rate to the I/O sizes of the performance curves and the I/O rates present in the performance curves.

In connection with an embodiment as described herein, two performance curves for small and large block I/O sizes (e.g., 8K and 64K bytes) may be used for each group of external LUNs being modeled. For a total hypothetical workload being modeled, either one or both of the performance curves may be used. The two performance curves may be used if the I/O size of the total hypothetical workload is within the range of I/O sizes (e.g., within the range of 8K-64K bytes) associated with the two performance curves. Alternatively, if the total hypothetical workload I/O size is less than the smallest I/O size (e.g. <8 Kbytes) for which there is a performance curve, then just the performance curve with the smallest I/O size is used. Response times modeled when using the performance curve with the smallest I/O size such as 8K bytes may not be further interpolated downwards to reflect a yet smaller I/O size than 8K bytes. It may be assumed for modeling purposes that any correction for an I/O size less than 8K bytes would be insignificant. Yet, as another alternative, if the hypothetical I/O size (e.g. of the total hypothetical workload) is greater than the largest I/O size for which there is a performance curve available (e.g., >64K bytes if this is the large block I/O size performance curve), then just the single performance curve with the largest I/O size is used to model performance. Modeled response times may be extrapolated upwards using the large block I/O size performance curve in a linear manner according to the relation of the hypothetical I/O size to the I/O size of the performance curve. The I/O curve with the largest I/O size is intended to measure large block performance, where the data transfer element is large compared to the compute element. It is therefore reasonable to linearly extrapolate response time and utilization by multiplying by the corresponding I/O rate on the curve by the ratio of the hypothetical I/O size to the I/O size of the curve.

Once the one or more performance curves have been selected from those associated with the appropriate dynamic model instance, the points on each curve with I/O rates that bracket the I/O rate of the hypothetical workload (e.g., define a range of I/O rates including the I/O rate of the hypothetical workload) are identified. For each curve, linear interpolation over I/O rate is used to calculate the response time and utilization from the curve for the hypothetical workload. If two bracketing curves of different I/O sizes are identified, then linear interpolation over I/O size is further applied to the two pairs of response times and utilizations arrived at by interpolation over I/O rate in the step above for both curves.

Figure 13:
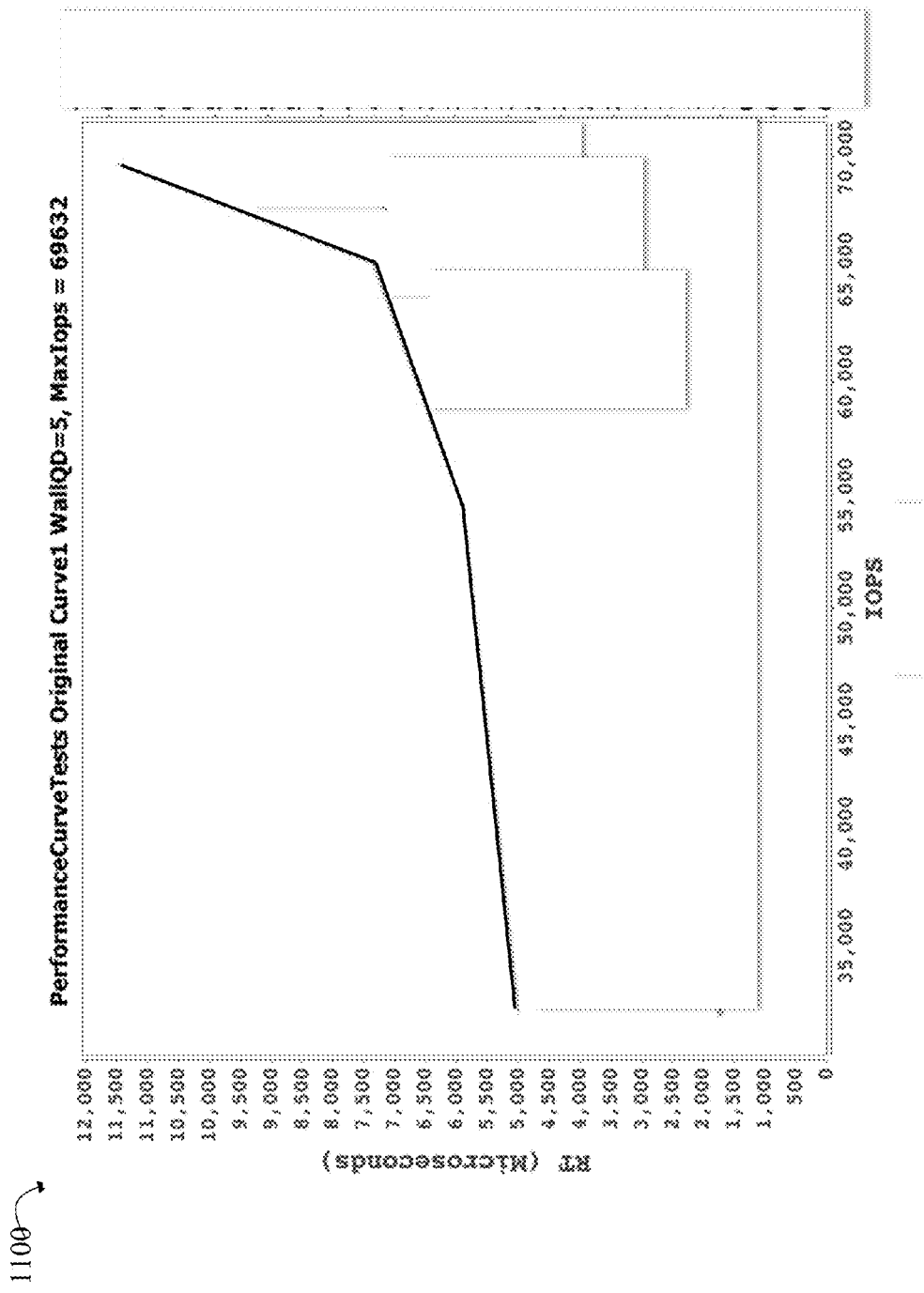

Referring to FIG. 13, shown is an example of a performance curve as may be obtained as a result of performing exploratory I/O testing at a range of fixed Q depths as described above. Each point on the curve may be determined as having a Y coordinate that is an observed average RT while issuing I/Os to maintain a particular average Q depth, and having an X coordinate of IOPS determined using EQUATION 1 (e.g., product of the observed average RT multiplied by the average Q depth).

It should be noted that the performance curves may be obtained for a range of fixed Q depths up to a maximum Q depth or Q depth "wall". The maximum Q depth for performance curves may be determined by examining the slope of the line (e.g., change in Y coordinates or RT and change in X coordinates or IOPs) when the Q depth is increased.

What will now be described is one way in which an embodiment may determine the Q depth wall when calibrating performance curves for the dynamic model. The "QDepth Wall" may be characterized as the lowest (or approximately the lowest) QDepth at which the resulting load on the underlying PDs pushes the external storage close to the edge of its performance capabilities, a region of performance that is characterized by high response times and, perhaps more significantly, very large response time increases for small increases in I/O rate. To maintain an assessment of the location of the QDepth wall, a sequence of performance measurements at different QDepths may be maintained in what will be referred to as a QDepth-curve. A separate QDepth curve is managed for each I/O size that is tested, and although the QDepth curve is built using the same type of projected performance measurement as are used for the performance curves, the QDepth-curve may be maintained separately from the performance curve for use in determining the Q depth wall. Thus, a separate Q Depth curve may be maintained for each performance curve constructed and used with the dynamic model.

The QDepth curve may be maintained as now described. An initial QDepth Wall determination may be made. The QDepth curve is initially empty. As performance calibration is performed, performance tests are run starting at QDepth=1 and proceed to successively higher QDepths until a test is observed for which the response time reported is higher than the response time of the previous Q depth test by at least a certain threshold amount AND the projected IOPS is not higher than that associated with the previous Q depth test. Note that calibration of a curve may not considered complete until the QDepth wall for that curve has been identified. It should be noted that the QDepth wall can also be considered as having been reached if a component used to access the external storage becomes heavily loaded. As part of processing described herein such as for validation of the dynamic model, the Q depth wall may be updated. This is handled by repeating the process of cycling through successively higher QDepths so a that QDepth curve is periodically rebuilt. Each time the Qdepth curve is rebuilt the potential exists to identify a new QDepth wall (which will typically only happen if there was a change to the external storage hardware configuration, or to the hardware configuration used to access the external storage).

Processing to calibrate the initial performance curves may be performed aggressively. Once the initial performance curves are obtained, less frequent exploratory I/O testing may be performed in an ongoing continuous manner to validate existing modeled performance curves that may be used in a predictive manner. Such validation testing may include re-performing techniques herein that may be used to adjust existing modeled performance curves. Reperforming may include reperforming the queue depth testing for share testing and at multiple fixed queue depths to determine performance curves. Validation may include reassessing the Q-depth "wall" and other processing described above. Such validation processing may be used to track any changes in performance that may take place over time. In validation processing of a set of obtained performance curves, one or more "new" performance measurements (RT) for a given workload may be obtained and may be used to adjust the existing performance curve(s).

Once a performance curve is calibrated, the model continues to re-run performance tests to check and adjust the calibration of the performance as described generally for validation processing. An embodiment may also smooth out the effects of noise in the measurement arising either from margins of error in the measurements, or small rapid fluctuations in actual performance. One way of doing this is to apply changes to the performance curve related to a validation measurement in a gradual way. As an example, each time a new measurement is obtained with respect to a particular performance curve, processing may be performed for each point in the performance curve and adjust the curve point as follows:

If the new measurement has a greater IOPS and a lower response time that of the curve point, then do not adjust the I/O rate of the point on the performance curve, but adjust the response time of the curve point downwards some fraction of the way towards the response time of the new measurement.

If the new measurement has lower IOPS and lower response time than that of the curve point, then do nothing UNLESS the performance curve point in question is the point with the lowest IOPS rate. In that case, move the point on the curve some fraction of the way towards the new measurement (adjust both the IOPS rate and the response time of the curve point when doing this).

If the new measurement has greater IOPS and greater response time than that associated with the curve point, then do nothing UNLESS the performance curve point in question is the point with the highest IOPS on the curve. In that case, move the point on the curve some fraction of the way towards the new measurement (adjust both the IOPS rate and the response time of the curve point when doing this).

If the new measurement has lower IOPS and higher response time than that associated with the curve point, move the point on the curve some fraction of the way towards the new measurement (adjust both the IOPS rate and the response time of the curve point when doing this).

As described herein, an estimated amount of unreported workload may be determined and maintained for each dynamic model instance having its own set of performance curves used to model performance of a set of external LUNs sharing backend data storage system resources. This unreported workload may represent the unreported workload with respect to the particular set of external LUNs being modeled.

Performance curves determined using techniques just described use observed measurements and also projected IOPS determined using EQUATION 1. The observed performance in terms of RT is based on total workload of such external LUNs (and backing PDs) in the external DS. The total workload may be partitioned into two components including reported workload and unreported workload. Reported workload may be that portion of the workload measured or observed in terms of IOPS through or from the primary DS to the external DS. Reported workload may be due, for example, to I/Os issued by the data storage optimizer for performing data storage system movement optimizations, and may be due to a host I/O issued to a first DS which then issues the I/O to the external DS providing the provisioned storage. A performance curve may be used to model performance of the external LUNs included in the underlying group being modeled. Assuming all external LUNs have the same capacity, the curve may represent the performance on average across a single external LUN.

The unreported workload may be characterized as the workload on the external DS that is not measured or accounted for in connection with I/Os from the primary DS. For example, there may be other consumers or users of external LUNs of the external DS where such external LUNs are being modeled using the performance curves and the other consumers add some workload to the external LUNs being modeled. As a further example, there may be other applications which store data on external LUNs of the external DS being modeled where the applications may execute on another host connected directly to the external DS. As another example, the unreported workload to the external LUNs of the external DS being modeled may be due to devices not managed by modeling using techniques herein. Techniques may be performed to estimate the amount of this unreported workload which is not part of the workload due to I/Os from the primary DS (e.g., either due to host I/Os received at the primary DS which then result indirectly in I/Os to the external DS or I/Os due to data movement by the data storage optimizer). This unreported workload may be further characterized as a base workload which would exist on the external DS and its external LUNs being modeled if I/Os issued to the external DS through the primary DS (e.g., directly or indirectly as with host I/Os received at the primary DS) were eliminated.

Initially, the unreported workload for a set of external LUNs being modeled by a dynamic model instance is assumed to be zero (0). Once the performance curves for the modeled set of external LUNs are initially calibrated (e.g., the performance curves have been determined out to the maximum or wall Q depth), processing may be performed to further adjust the estimate of unreported workload using periodic observations of the average total actual IOP rate and average read RT on the external LUNs underlying the model based on observations of all I/O's (including host I/O requests, data movement I/O and all other I/O types) directed to the LUNs underlying the model via the primary storage system. It should be noted that the average read RT may generally be the average random read RT. For a time period, an observed set of values including average IOPS, average IO size and average random read RT may be determined for a set of external LUNs of the external DS being modeled by a set of performance curves. If the observed read RT is greater than what the performance curves of the model would have predicted, then the model's measure of unreported workload is adjusted upwards. If the observed read RT time is less than what the model would have predicted, then the model's measure of unreported workload is adjusted downwards. This will now be described in more detail.

Figure 14:
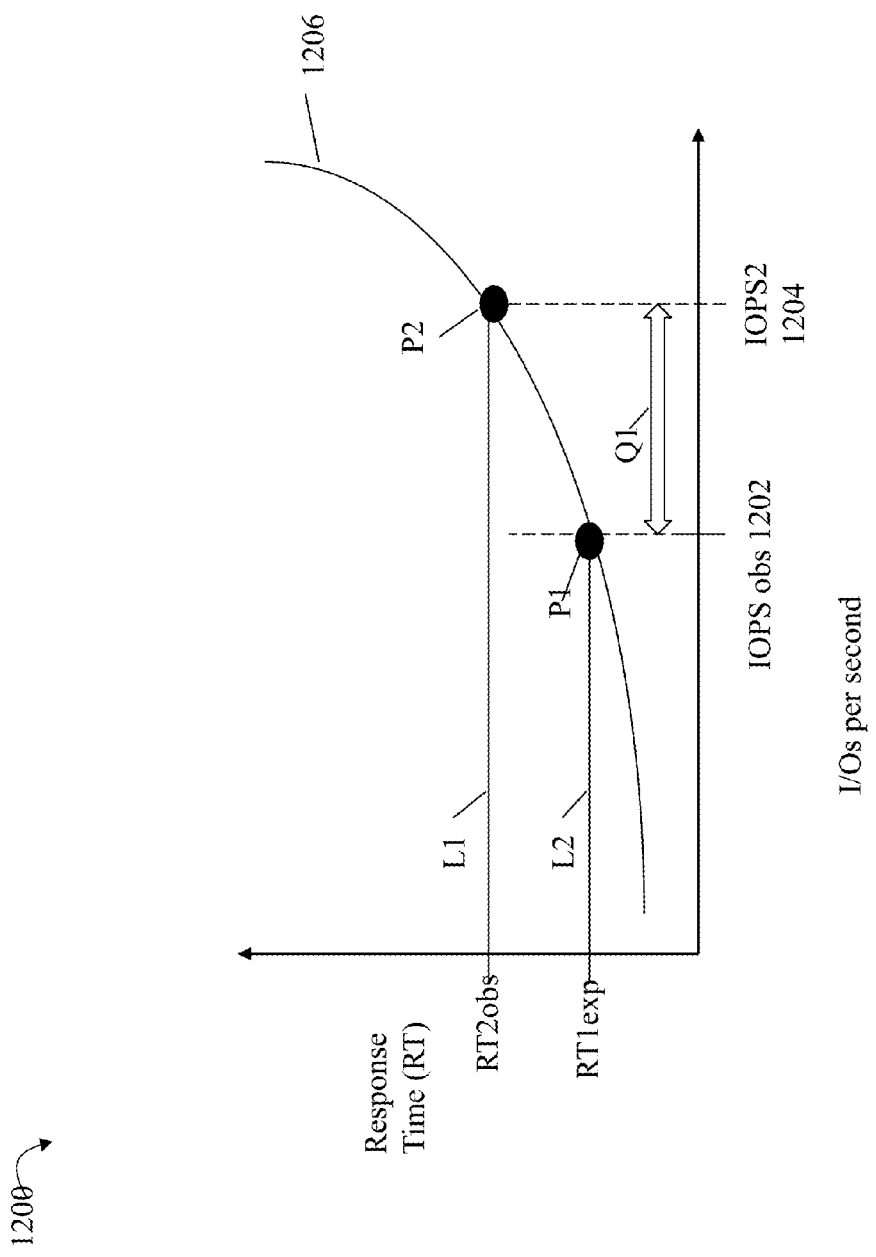

With reference to FIG. 14, let the example curve 1204 of FIG. 14 represent one of the performance curves used to model the set of external LUNs. Now the performance curve of FIG. 14 may be used to determine or predict a modeled RT for the observed workload of average IOPS and average I/O size. The amount of unreported workload may be adjusted based on any difference in workload between the observed RT and the modeled or predicted RT. At a first point in time, let the observed average RT be denoted as RT2obs for an observed workload of IOPS obs. Assume that point P1 represents the point having the X coordinate of IOPS obs 1202 corresponding to the observed average IOPS. Using the performance curve 1206, for point P1 having an IOPS 1202, the model may predict an expected corresponding read RT of RT1exp. However, assume that the actual observed read RT is RT2obs, which is more than RT1exp, and the unreported workload may be accordingly adjusted upwards. The amount of unreported workload may be represented on the graph 1200 by the horizontal distance Q1 between IOPS obs 1202 and IOPS 1204. Line L1 may represent the horizontal line drawn for RT2obs to determine a corresponding point P2 on the curve 1204. Point P2 represents point of the modeled curve 1206 having as the Y coordinate RT2obs (the observed RT) to determine a corresponding workload in terms of IOPS2 1204 represented by the performance curve. Thus, the observed workload IOPS 1202 may be used as an input with modeled curves to determine an expected modeled RT point on the curve as represented by P1. A comparison may be made between the modeled RT value (RT1exp) of point P1 obtained from the curve with the observed RT (R2obs). Any difference in these RTs may be attributed to unreported workload (e.g. difference between observed IOPS 1202 and IOPS 1204 (obtained from curve) corresponding to observed RT coordinate, RT2obs).

An embodiment may adjust the unreported workload to be the amount of IOPS represented by Q1 which is the difference between 1204 and 1202. However, simply updating the unreported workload to a raw value may cause the unreported workload value to undesirably oscillate or change too quickly. In this case an embodiment may choose to adjust or update a current value of unreported workload using a weighting factor that dampens or lessens the amount of change in unreported workload in one iteration. For example, the unreported workload for a dynamic model instance may be adjusted as follows:

$$\text{UnreportedLoad}_{N+1} = \text{UnreportedLoad}_N + ((\text{UnreportedLoad}_{RAW} - \text{UnreportedLoad}_N) * \text{Fraction}) \quad \text{EQUATION 2}$$

where:

Fraction may generally represent the weighting factor; UnreportedLoad$_{N+1}$ may represent the new revised unreported workload being determined for the Nth+1 iteration or adjustment of the unreported workload; UnreportedLoad$_{RAW}$ may represent the quantity Q1 which is the "raw" unadjusted unreported workload currently estimated using the performance curve for the Nth+1 iteration; and UnreportedLoad$_N$ may represent the current unreported workload determined as a result of the previous Nth iteration or adjustment of the unreported workload.

The performance curves consider the total of reported and unreported workload. When the model is asked to perform a performance RT prediction, the unreported workload is added to the reported workload provided. A value for unreported workload may be maintained for each dynamic model instance and adjusted based on such differences between observed and predicted RTs. If there is a difference, it may be assumed that the unreported workload needs to be adjusted from previous estimates. In this manner, the unreported workload for a particular dynamic model instance may be added to any workload for which the model is being asked to perform a prediction in terms of RT performance.

The periodic observations of the average IOPS rate and average read RT on the external LUNs underlying the model used to adjust the unreported workload for dynamic model instance corresponding to a set of external LUNs may be based on I/Os observed for a time period which are non-exploratory. What is important is that the observations include all workloads on the LUNs for which measurements are available. More generally, the periodic observed data used to adjust unreported workload may include information regarding average IOPS for reads and writes, average RTs for reads and write, and average I/O sizes or data transfer rates for reads and writes. Such observations may be based on those received from the host or other client issuing I/Os in the normal course of processing as well as other I/Os to the LUNs from the primary storage system in the context of data movement or some other purpose internal to the primary storage system. In connection with techniques herein, the periodic observed data used in adjusting the unreported workload over time may be the result of performing major/minor measurement processing of actual raw or observed workload data. In other words for a given external LUN set being modeled, the "raw" observed values for workload to the external LUN set may first be processed using the major/minor measurement technique described below to obtain resulting observed workload values used in determining and maintaining the unreported workload as described in connection with FIG. 14.

Figure 15:
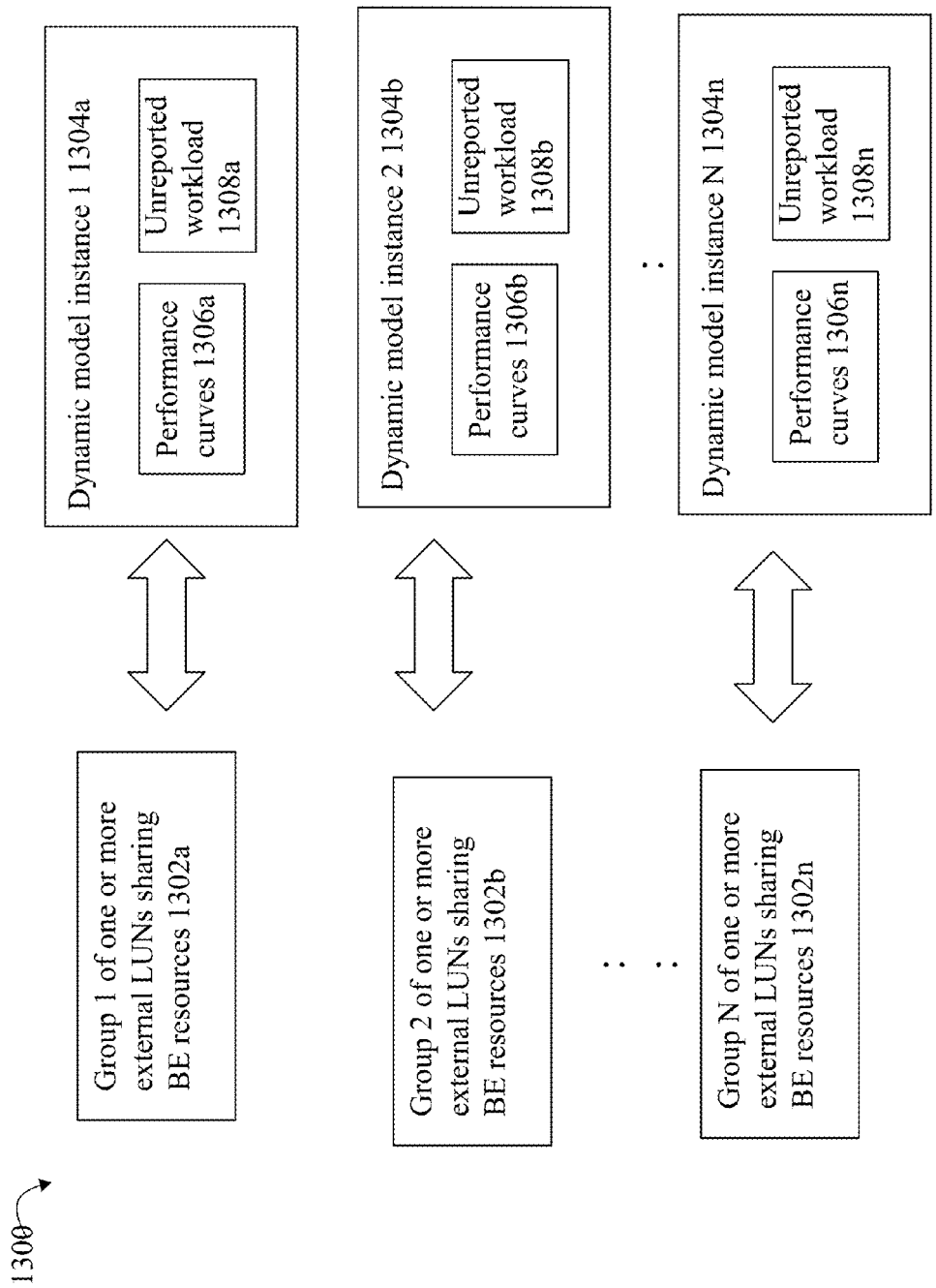
FIG. 15 is an example illustrating device groupings and associated dynamic model instances in an embodiment in accordance with techniques herein.

Before discussing the major/minor measurement technique, reference is made to FIG. 15 illustrating the elements of the dynamic model which may be produced using techniques just described.

Referring to FIG. 15, shown is an example of external LUN groupings 1302a-130n and associated dynamic model instances 1304a-1304n of the dynamic model 820 of FIG. 10. The external LUN groupings 1302a-1302n may be groups of external LUNs that are independent from one another in terms of back end resource sharing. The independent external LUN groupings 1302a-1302n may be determined using the share or structural testing techniques herein, such as described in connection with FIGS. 11 and 12 and using exploratory I/O testing. Each of the external LUN grouping 1302a-n may be associated, respectively, with a different dynamic model instance 1304a-1304n. Each of the dynamic model instances 1304a-n may include, respectively, a set of performance curves 1306a-n and an unreported workload 1308a-n. The performance curves 1304a-1304n may be calibrated and maintained as described herein using exploratory I/O testing at fixed Q depths. The unreported workload 1308a-n for a corresponding dynamic model instance 1304a-n may be determined using the performance curves of the corresponding dynamic model instance 1304a-n and periodic observed workloads (e.g., average IOPs and average I/O size) from non-exploratory I/Os (directed to the underlying LUN group for the model instance) as further processed using the major/minor measurement technique described below.

What will now be described is the major/minor measurement technique that may be used in an embodiment in accordance with techniques herein. As noted above, raw observed workload and performance data may be obtained which is then processed using the major/minor measurement technique to generate a resulting set of workload data. The resulting set of workload data may then be used with the current performance curves of a dynamic model instance to maintain (and possibly adjust) the unreported workload for the dynamic model instance (e.g such as described in connection with FIG. 14). Generally, the major/minor measurement technique may be used when the observed values for the workload (e.g., IOPS for read and/or write, average I/O size(s) for read and/or write or average transfer rate(s) for read and/or write) and corresponding performance (e.g., average RT value(s) such as for read and/or write) are from the perspective of the front end of the data storage system. The major/minor measure technique provides for adjusting such front-end perspective observed values to more accurately model BE performance including the effects of caching write operation data for modeling BE write estimates.

Figure 16:
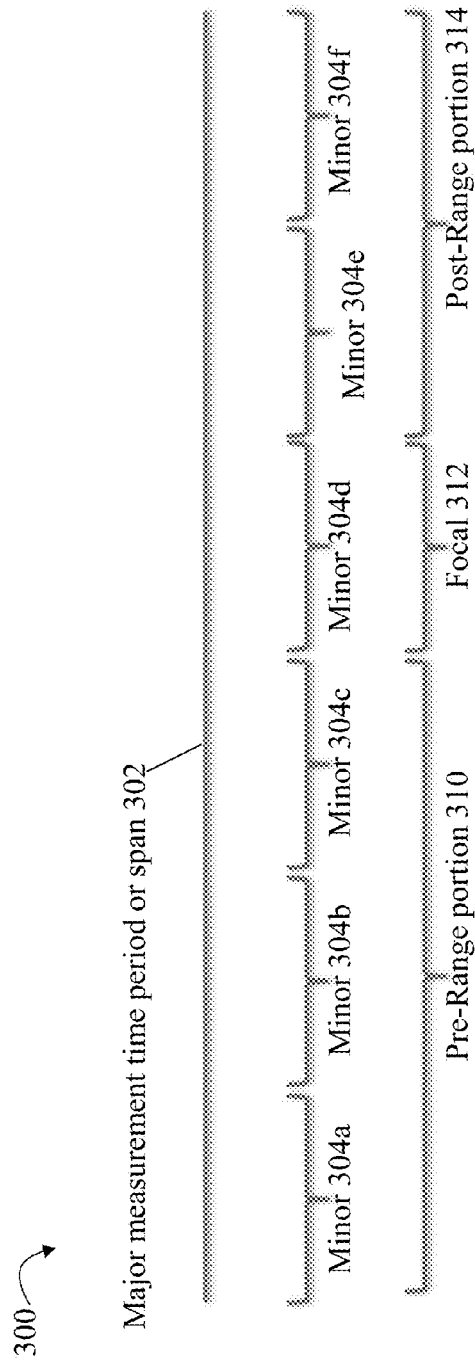
FIG. 16 is an example illustrating use of major and minor measurement time periods in connection with techniques herein.

With reference now to FIG. 16, illustrated in the example 300 is a major measurement time period or span 302 which includes a plurality of minor measure time periods or spans 304a-f. Each minor measure time period 304a-e may span a relatively small period of time, such as 10 minutes, over which observed performance data may be collected. The performance data collected for each minor measurement period 304a-f may include the average IOPS, the average transfer rate for reads, the average transfer rate for writes, the average read RT and the average write RT calculated over the performance data observed during that particular minor measurement time period. Each major measurement period 302 may include any suitable number of minor measurement time periods and associated sets of minor measurements over which a set of major measurements is calculated. In the example 300, the major measurement time period or span 302 is illustrated as including 6 minor measurement periods. If each minor measurement period is 10 minutes as noted above, the major measurement time period may be 1 hour or 60 minutes. The major measurement time period 302 defines a time period over which a set of major measurements are calculated based on, or derived from, a set of minor measurements for a number of consecutive minor measurement time periods. For each major measurement time period 302 including minor measurement time periods 304a-f, one of the minor measurement time periods may be selected as the focal minor measurement 312. Once a focal minor measurement 312 is selected, the one or more minor measurement periods preceding 312 may be grouped into a pre-range portion 310, and the one or more minor measurement periods subsequent to 312 may be grouped into a post-range portion 314. With reference to FIG. 8, the focal 312 is minor measurement period 304d, the pre-range portion includes minor measurement periods 304a-c and the post-range portion 314 includes minor measurement periods 304e, 304f. Thus, the major measurements for 302 represent collected or aggregated performance data for a number of consecutive minor measurement time periods.

For each major measurement time period 302, major measurements may include read and write activity or performance data. The read activity or performance measurements for the major measurement time period are those of the focal minor measurement time period 312. For the major measurement time period, the major read measurements include the average read RT, average IOPS for reads, average data transfer rate for reads which are those of the focal minor measurement period 312.

The write activity for the major measurement time period 302 is based on the minor measurements for 304a-f modified to approximate the back-end write activity. Additionally, a BE write status is determined for each major measurement period 302 where the status is one of the following sustainable, non sustainable/unsustainable, or uncertain. These BE write statuses are described below in more detail. Thus, determining the write activity or performance data for a major measurements may include a first step whereby the BE write status is determined. The BE write status is based on a determination of whether delayed writes have occurred during particular minor measurements of the major measurement time period 302.

A delayed write may be characterized as a write to the external data storage system from the primary data storage system where the write data cannot be immediately cached in the external system (e.g., there is insufficient cache available to store the write data) so there is a delay introduced until a cache location becomes available to store the write data (thereby increasing the RT). Thus, the delayed write may be detected by observing RTs for writes from the primary to the external system whereby the write RT as measured from the primary system is more than the overhead or baseline amount of time to write the data to the external system's cache when a cache location is available to store the write data, and then return an acknowledgement of completion to the primary system. In other words, the baseline amount of time may be defined as the amount of time it takes to transfer the write data from the primary system to the external system, write the data immediately to cache on the external system in an available cache location (assuming write back caching where data is destaged later from cache and cache is available for storing the write data so there is no additional time introduced waiting for a cache location to become available) and return to the primary system. This may be determined in any suitable manner such as through observing an amount of time for writing to the external system under such conditions where the write data would be immediately cached and then return an acknowledgement to the primary system. An embodiment may also estimate this baseline amount of time based on a typical or average expected transfer rate (e.g., a typical amount of time to perform the data transfer between the primary and external systems for a particular type of connection such as a Fibre channel connection).

Returning now to the first step of determining a BE write status, if there are one or more delayed writes in the pre-range portion the BE write status is uncertain. If there are no delayed write in the pre-range portion but there is one or more delayed writes in the post-range or focal, then the BE write status is unsustainable. If there are no delayed writes in any minor measurement time periods, the BE write status is sustainable.

As a second step, averaging of one or selected sets of minor measurements is performed. The particular set(s) of minor measurements selected depends on the BE write status determined in the first step as described above. If the BE write status is uncertain or sustainable, then the selected minor measurements averaged are those for the focal and the post-range whereby the post range is included only if the write rates (e.g., both write IOPS and write data transfer rate) for those minors are both below those of the focal measurement. It should be noted that an embodiment may perform processing to include portions of the post range by traversing the minor measurement(s) of the post range forward in time (with respect to the focal point time) and determining whether each minor measurement in the post range meets the specified criteria of the write IOPs and write data transfer for that minor measurement period being below corresponding values of the focal measurement. The minor measurement of the post range may be included if it meets the above-mentioned criteria. Processing may continue to traverse the minor measurements of the post range marching forward in time until either the end of the post range is reached, or the first minor measurement is encountered in the post range having write IOPS and write data transfer rates which exceed corresponding values for the focal point. Once such a minor measurement in the post range is determined, or the end of the post range is reached, no further minor measurements of the post range are considered.

It should also be noted that the criteria or metrics use may include both the write IOPS and write data transfer rate as noted above. Alternatively, an embodiment may optionally use only write IOPS rather than both write IOPS and write data transfer rates.

If the BE write status is unsustainable, then the selected minor measurements averaged include all minor measurements for all minor measurement time periods in the major measurement time period whereby the measurements from the pre-range are only included if their write rates (e.g., both write IOPS and write data transfer rate) are greater than those of the focal measurement. The post-range is always used for BE write status of unsustainable. It should be noted that an embodiment may perform processing to include portions of the pre-range by traversing the minor measurement(s) of the pre-range backward in time (with respect to the focal point time) and determining whether each minor measurement in the pre-range meets the specified criteria of the write IOPs and write data transfer for that minor measurement period being below corresponding values of the focal measurement. The minor measurement of the pre-range may be included if it meets the above-mentioned criteria. Processing may continue to traverse the minor measurements of the pre-range marching backward in time until either the end of the pre-range is reached, or the first minor measurement is encountered in the pre-range having write IOPS and write data transfer rates which exceed corresponding values for the focal point. Once such a minor measurement in the pre-range is determined, or the end of the pre-range is reached, no further minor measurements are considered. It should also be noted that the criteria or metrics use may include both the write IOPS and write data transfer rate as noted above. Alternatively, an embodiment may optionally use only write IOPS rather than both write IOPS and write data transfer rates.

By averaging the write metrics of the selected minor measurement set(s) for the major measurement time period, values may be determined for the average IOPS for writes, average transfer rate for writes, and the average RT for writes for the major measurement time period.

Figure 17:
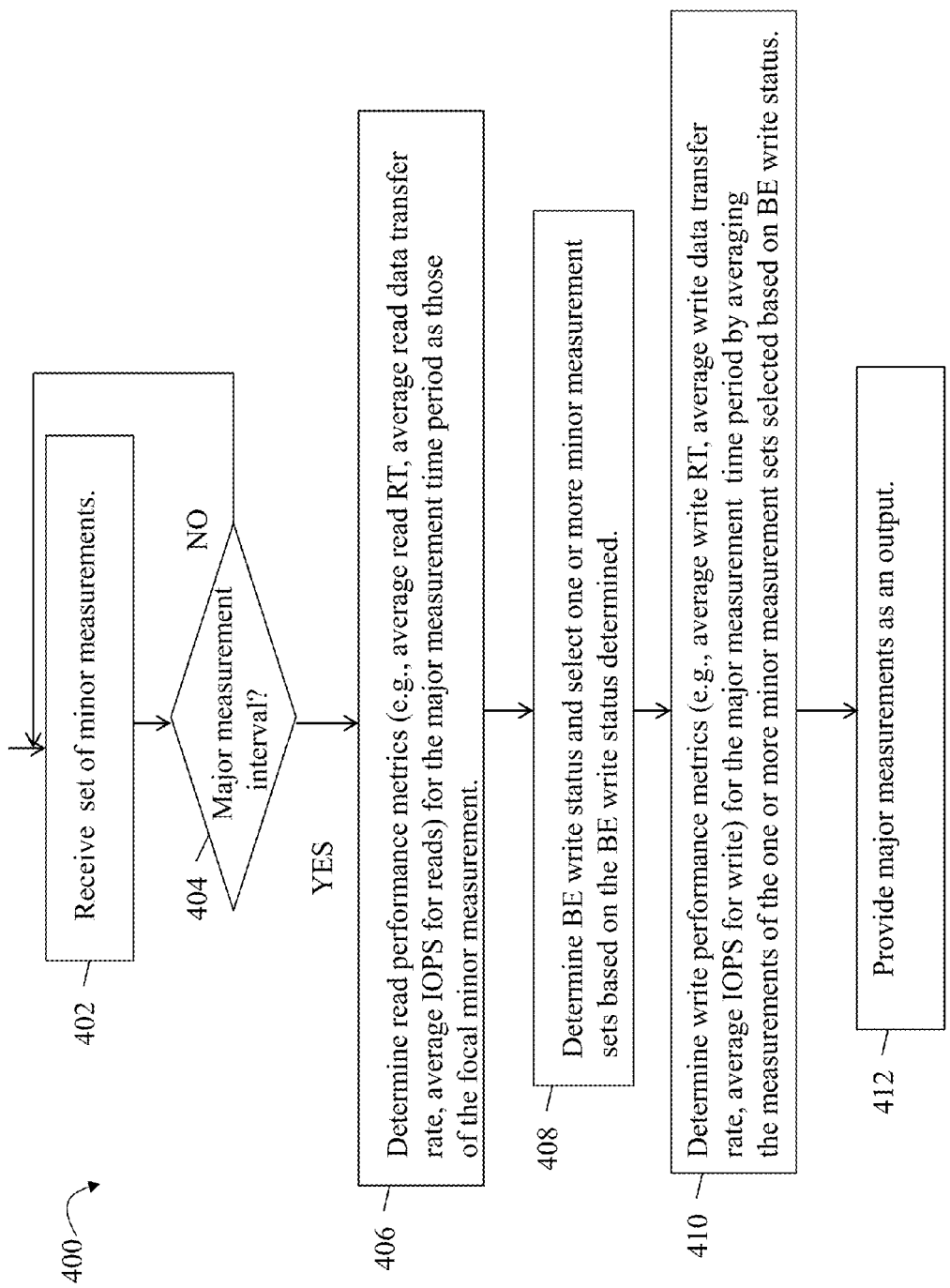
FIGS. 17, 20 and 21 are flowcharts of processing steps that may be performed in an embodiment in accordance with techniques herein.

Referring to FIG. 17, shown is a flowchart of processing steps that may be performed in an embodiment in accordance with techniques herein in accordance with the major/minor measurement technique just described above. As noted above, the steps of the flowchart 400 may be performed in connection with obtaining BE performance related measurements represented as a set of values for a major measurement period. At step 402, a set of minor measurements is received. At step 404, a determination is made as to whether a sufficient number of minor measurements have been received for a next major measurement interval. If step 404 evaluates to no, control proceeds to step 402. If step 404 evaluates to yes, control proceeds to step 406 to determine the read performance metrics for the major measurement period as those of the focal minor measurement. At step 408, a BE write status is determined and one or more minor measurement sets are selected based on the BE write status determined. The minor measurements sets selected based on BE write status and then used in determining the write activity or performance data for the major measurement period are described above in connection with FIG. 8. At step 410, the write performance metrics for the major measurement time period are determined by averaging the write metrics of the one or more minor measurement sets selected based on BE write status in step 408. At step 412, the major measurements may be output for use by the dynamic model in determining and maintaining the unreported workload estimates used with the dynamic model instances.

As described elsewhere herein, each dynamic model instance used for modeling a group of one or more external LUNs, or more generally, a group of one or more devices, may have an associated unreported workload estimate. First data including workload and corresponding performance values for the group of devices may be observed for a time period. The first data may then be further processed by the major/minor measurement technique just described generating second data. The second data may be used in determining and maintaining the unreported workload used in modeling performance of the group of one or more devices. It should be noted that the second data may be further processed prior to being used in determining the unreported workload. Such further processing may include, for example, processing for mapping or converting logical read and/or write operations to corresponding physical data operations such as may depend on the RAID configuration of the underlying PDs. Physical data operations may refer to read and write operations to the physical device. Logical operations may refer to read and/or write operations such as in connection with a requested data operation received from the host. Each logical data operation may be mapped to one or more corresponding physical data operations depending on RAID configuration. For example, a logical write operation to a LUN in a RAID-1 configuration with mirroring results in two physical write operations to write to each physically mirrored copy of the data. As another example, different RAID configurations such as RAID-5 and RAID-6 store user data and also parity information. As a result, a logical data operation to write data may be mapped to one or more physical device reads and also one or more physical device writes. Additionally, such further processing may also include further mapping or conversion so that all logical data operations are expressed in terms of a corresponding number of physical read operations and associated workload and performance values since the performance curves maintained reflect physical device read operations.

With reference back to FIG. 7, logical data operations may be those which are received by FE components such as 212a-c and 214a-d. The major/minor technique described herein may be performed to better model such data operations in a cached environment using cache 216. Thus, the output of the major/minor measurement technique may be generally viewed as modeling I/Os with respect to logical I/Os such as at point 222d. The further processing such as any mapping or conversion performed from logical data operations to physical data operations due to RAID configuration may be viewed as any additional conversion needed to model data operations to PDs such as 220a-f. For example, at point 222d, there may be a single logical write operation to a LUN having its data stored in a RAID-1 configuration. Thus, to complete the logical write operation as described above requires two writes, such as to two PDs 220a and 220b.

As described above, any suitable amount of time may be selected for each minor measurement time period and the major measurement time period. Generally, the amount of time for the major measurement time period may be proportional to the size of the cache. An embodiment may select a major measurement time period, such as an hour, which is sufficient for delayed writes to occur in most caches as based on relevant parameters such as typical or average cache size, RAID configuration and throughput limit or upper bound (e.g., average or typical throughput limit for given I/O size/amount of data and generally how quickly the BE can process or drain cached write data and destage the cached write data to PDs). In connection with modeling, the major measurement time period should be large enough to allow for delayed writes to occur since, if there are no delayed writes, then the write RTs observed do not provide any insight regarding the BE. More formally, the size of the major measurement time period (MAJOR TIME) used in an embodiment may be proportional (e.g., $\propto$) to the above-mentioned parameters and represented as in EQUATION A:

$$\text{MAJOR TIME} \propto \text{Size of cache} * \text{RAID multiplier}/(BE \text{ write throughput limit} * x)$$

where:

Size of cache is a typical or average cache size;

BE write throughput limit is based on the ability of the BE components (e.g., BE CPUs and PDs) to write cached data to PDs;

RAID multiplier is a factor introduced based on a particular RAID configuration which affects the amount of time the BE takes to process cached writes (e.g., drain the cache). For example, RAID 1 may introduce a factor of 2 since there is mirroring/two data writes. RAID-5 or RAID-6 may introduce addition processing for additional reads and writes for parity and user data; and x is some value in the inclusive range of (0 . . . 1) and denotes some degree of locality with respect to the data being written out to PDs. Values of x closer to 1 indicates a higher degree of locality on a same PD.

The foregoing major/minor measurement technique may be used to generate an aggregated set of backend performance data which is a set of values for a major measurement time period. The major/minor measurement technique may be used to process sets of minor measurements where the performance data of the minor measurements is from a FE perspective in order to generate BE performance data. Such major measurement data may then be further subject to additional processing (e.g., for any further conversion or mapping based on RAID configuration and the like) prior to being used for determining the unreported workload. In this manner, the foregoing major/minor measurement technique may be performed to facilitate aggregation of write data for approximating BE write rates. The major/minor measurement technique may be used to aggregate a set of measurements observed for I/Os directed to a particular LUN to collectively represent such measurements for use with modeling BE components of the logical path of components traversed when processing I/Os for the LUN. For example, with reference back to FIG. 7, assume LUN A has its data stored on disk 220a-b. The major/minor measurement technique may be used to aggregate performance data based on observed FE performance data obtained in connection with I/Os directed to LUN A. As an output, the major/minor measurement technique generates major measurement data. In one aspect, the major/minor technique may be characterized as not only aggregating performance data for use in modeling the BE, but also further modeling or simulating BE read and BE write activity from minor measurement performance data which is observed from a FE perspective.

Figure 18:
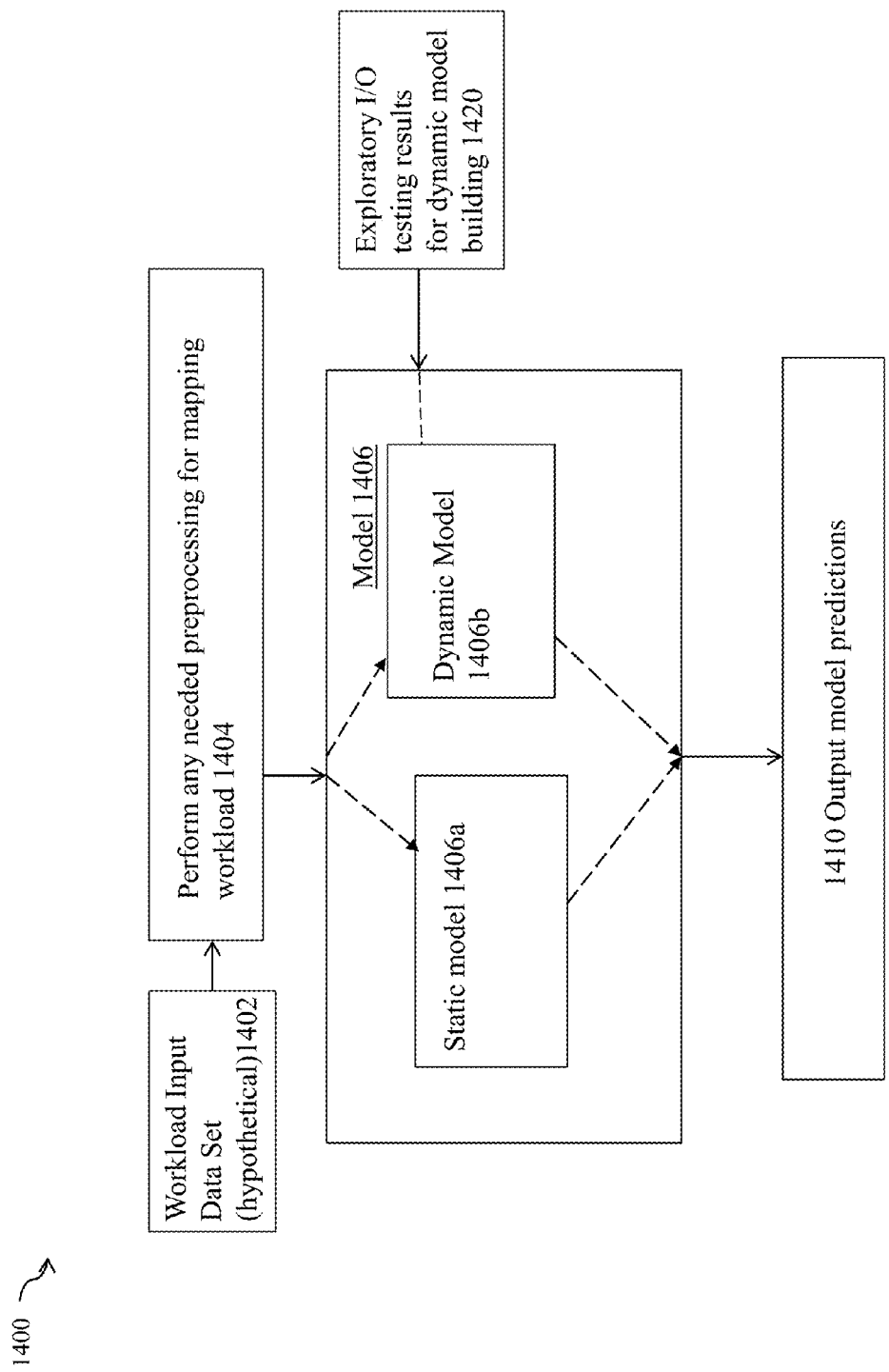
FIGS. 18 and 19 illustrate components and associated data flow processing in an embodiment in accordance with techniques herein.

Referring to FIG. 18 shown is an example of a data flow illustrating use of techniques herein during building or calibrating the performance curves of the dynamic model instances used by the model 1406 for modeling the external data storage system. The example 1400 includes static model 1406a and dynamic model 1406b. Element 1402 may represent the hypothetical workload input data set for which the model 1406 is being asked to model performance predictions. Data of 1402 may include, for example, an average read IOPS rate, an average write IOPS rate, an average read I/O size and an average write I/O size. Alternatively, the data of 1402 may include, for example, an average read IOPS rate, an average write IOPS rate, an average read data transfer rate (e.g., bytes/second) and an average write data transfer rate (whereby the data transfer rates may be used to determine average I/O sizes). The data of 1402 may represent average values for a time period directed to a LUN or a set of LUNs. Multiple sets of the data 1402 may be provided where a single set of the data may represent a hypothetical workload to a single LUN. As denoted in 1404, the data of 1402 may be subjected to any needed preprocessing for mapping the workload. For example, the data of 1402 may be expressed in terms of logical read and write operations to a LUN which are then mapped or converted to physical device data operations (e.g., read and writes to underlying PDs) depending on the particular underlying RAID configuration also being modeled. Different ways of determining or obtaining information identifying the RAID configuration used for modeling are described elsewhere herein. From step 1404, the hypothetical workload being modeled may be input to the model 1406.

The model 1406 may determine whether to use the static model 1406a or the dynamic model 1406b to generate a performance prediction. The model 1406 may output model prediction(s) 1410 for one or more components being modeled. For example, predictions may be output regarding modeled RT for a single external LUN, one or more external LUNs, an external LUN group (e.g., see FIG. 15), and the like. In connection with techniques herein, the model 1406 may be used to model an external data storage system and its external LUNs and thus underlying external PDs. In modeling a proposed data movement, the model 1406 may be used to predict a resulting RT and utilization for one or more external LUNs based on the hypothetical workload of 1402. It should be noted that the predicted or modeled RT included in 1410 may approximate an average modeled RRM RT.

Consistent with description elsewhere herein, the dynamic model 1406b includes the dynamic model instances comprising the performance curves being calibrated. As illustrated by 1420, the dynamic model 1406b may be built using exploratory I/O testing results. Exploratory I/O testing may be used in connection with share testing to determine groups of external LUNs whereby each group does not share BE resources with any external LUNs of any other group. Exploratory I/O testing at various Q depths may be used in connection with calibrating the performance curves of the dynamic model 1406b.

In one embodiment as described herein, while the performance curves are being calibrated, the model 1406 may use the static model 1406a rather than the dynamic model 1406b. The performance curve calibrations may be complete when all performance curves for all groups of external LUNs have been calibrated to the Q depth wall or maximum described elsewhere herein. More generally, the model 1406 may use one or more criteria in connection with deciding which of the static or dynamic models 1406a-b to use when making a prediction of modeled RT and/or modeled utilization. Such criteria may generally be used to assess the confidence with which a prediction may be made using the static and dynamic models at the point in time when a request is made for the prediction. As noted above and elsewhere herein, an embodiment may use the static model 1406a when the performance curves of the dynamic model 1406b have not yet been completely calibrated to the maximum or wall Q depth. Alternatively, while the dynamic model performance curve calibrations are not yet complete, an embodiment may decide whether to use the static or dynamic model in accordance with the particular workload for which the modeling is being requested to predict. For example, the dynamic model may have completed a portion of Q depth exploratory I/O testing such as for Q depths in the range of 1-3 but may not have yet completed all such testing to the wall or maximum Q depth for all performance curves or even for the particular set of curves of the dynamic model instance to be used for modeling. For this partial Q depth range, a portion of the performance curves may have been completed and have a corresponding workload or IOPS range. If the hypothetical workload 1402 provided as an input results in a workload or IOPS value that does not exceed the upper bound of this IOPS range (or is within some threshold of this upper bound) for which calibration has been completed, then the dynamic model may be used to predict the modeled RT and/or utilization. Otherwise, the static model may be used to determine the predicted or modeled outputs.

It should be noted that depending on which of the static or dynamic models is used, step 1404 may also include other processing depending on the particular model and its performance curves. For example, if the dynamic model is used, step 1404 may expressing the workload data of 1402 in terms of physical read operations and associated workload since the performance curves of the dynamic model are expressed in terms of read IOPS and associated RTs.

Consistent with description elsewhere herein, when the dynamic model 1406*b* is used to determine a performance prediction of a hypothetical workload 1402 such as for an external LUN, the unreported workload of the dynamic model instance for that particular LUN may be added to the workload of 1402. Such processing may be represented by step 1404. In this manner, 1402 may represent the reported workload. Until the dynamic model performance curves are completely calibrated, an amount of zero may be used for the unreported workload amounts.

It should be noted that when asking the model to predict utilization and/or response time for a given hypothetical workload, the supplied hypothetical workload must include the workload contributions of all known sources such as all LUNs in the same group. If the need exists to make predictions for a particular LUN, that LUN should be placed in an LLP of its own, so that share testing may be performed to determine the degree to whether that LUN can be modeled separately.

The dashed arrows within 1406 illustrate the different possible processing paths depending on whether the model 1406 uses the static model 1406*a* or the dynamic model 1406*b*.

Figure 19:
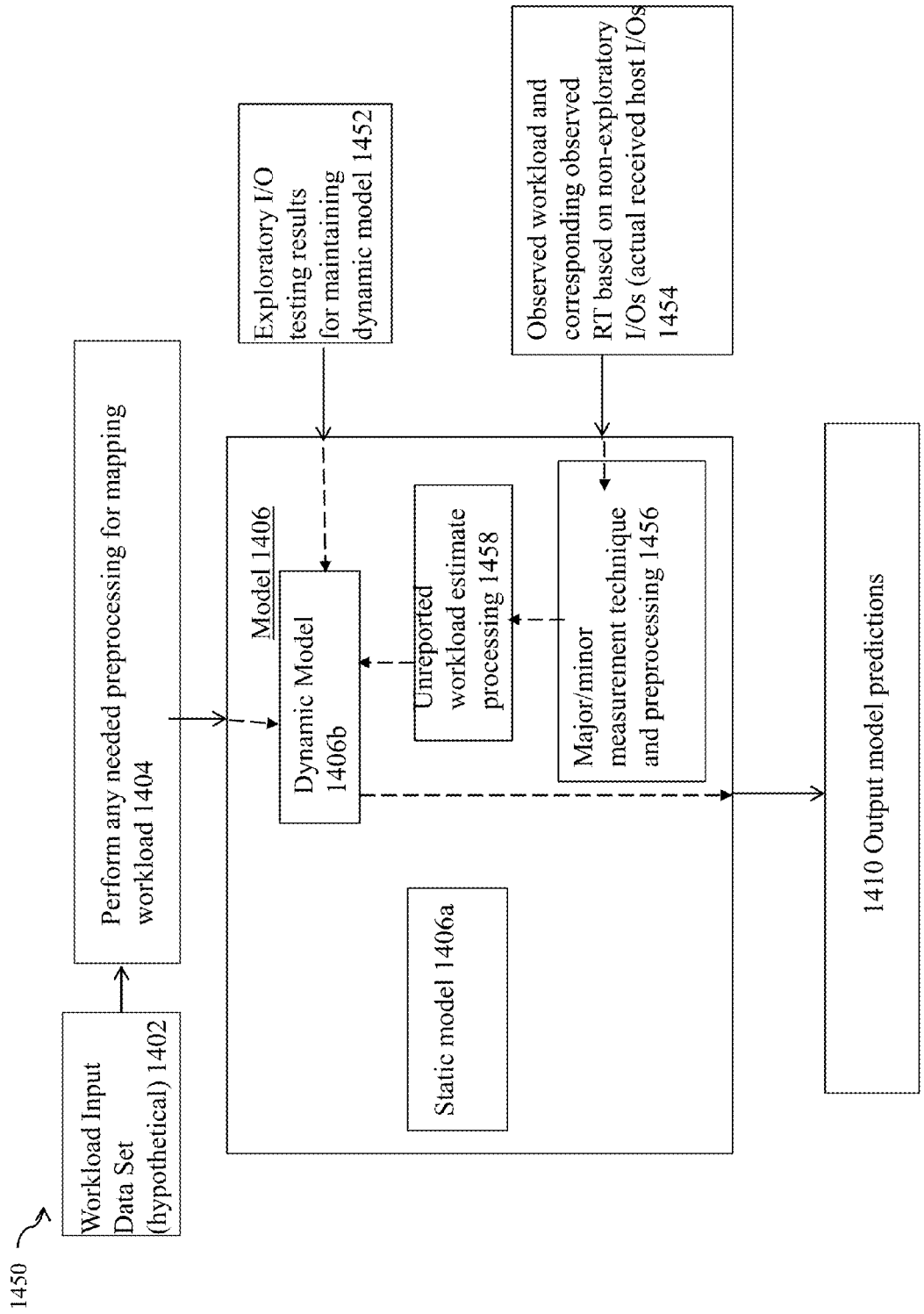

Referring to FIG. 19, shown is an example of a data flow illustrating use of techniques herein during after calibration of the performance curves of the dynamic model instances used by the model 1406 for modeling the external data storage system. The dashed arrows within 1406 illustrate the different possible flow paths between illustrated components. Elements of the example 1450 which are similar to those of the example 1400 are similarly numbered. Additionally, the example 1450 illustrates data flow whereby the dynamic model 1406*b* rather than the static model 1406*a* is used for modeling and additional processing is also performed in connection with continuous ongoing maintenance and validation of the dynamic model 1406*b*. The example 1450 includes element 1452 illustrating that exploratory I/O testing (as described for initially determining performance curves of the dynamic model) is also performed in an ongoing manner as part of validating the dynamic model and making any appropriate modifications or adjustments as described herein.

The data flow path including 1454, 1456, and 1458 outline processing performed for determining and maintaining unreported workload estimates of the dynamic model instances. In 1454, non-exploratory I/Os (based on actual received host I/Os) directed to an external LUN being modeled by 1406*b* are observed for a time period to determine an observed workload and corresponding performance RT information. Data from 1454 is processed in step 1456 using the major/minor measurement technique. As described elsewhere herein, step 1456 may also include performing any additional processing needed to map the data based on RAID configuration of the LUN and also to express the data in terms of reads and associated read IOPS (since the performance curves of the dynamic model are in terms of physical device read operations). At step 1458, unreported workload estimate processing is performed such as described elsewhere herein, for example, in connection with FIG. 14. As a result of step 1458, the unreported workload of the dynamic model instance modeling performance for the particular external LUN may be adjusted as needed.

With reference to both 1400 and 1450, the model predictions 1410 may include RT and also utilization. RT may be determined using the performance curves as described above. Additionally, an embodiment may also output utilization as a percentage value whereby the modeled workload is expressed as a percentage of the total or maximum possible utilization of the particular device, such as a particular physical device. An embodiment may determine the maximum 100% value, MAX, upon which to base utilization for I/Os directed to a single physical device using the obtained performance curves. Generally, the MAX may be characterized as approximating the maximum or upper bound capabilities in terms of I/Os that may be directed to a physical device of a particular LUN group having its own dynamic model instance. MAX may be expressed in terms of IOPS of a particular I/O size determined using the performance curves. For example, assume the model is being asked to model or determine performance predictions for a given hypothetical workload W directed to a physical device having characteristics of X IOPS of size Y. For simplicity, assume that there is a performance curve for IOPS of size Y such as illustrated in FIG. 13. An embodiment may determine MAX representing the 100% utilization as the number of IOPS at the wall or maximum Q depth of the performance curve for I/Os of size Y. In this case, modeled utilization may be represented as X/MAX. Alternatively, it may be the case that the size Y of the hypothetical workload does not exactly match an I/O size of a performance curve and interpolation or extrapolation techniques may be used with existing performance curves to determine a value for MAX. For example, consider the following in which interpolation is used. Assume there is a first performance curve for I/Os of size Y/2 and a second performance curve for I/Os of size 2Y. A first IOPS value may be determined as the number of IOPS of the first performance curve at the wall or maximum Q depth. A second IOPS value may be determined as the number of IOPS of the second performance curve at the wall or maximum Q depth. Using interpolation, the value for MAX may be determined as first IOPS value/second IOPS value since the size Y of the hypothetical workload corresponds to a size midway between Y and 2Y.

Figure 20:
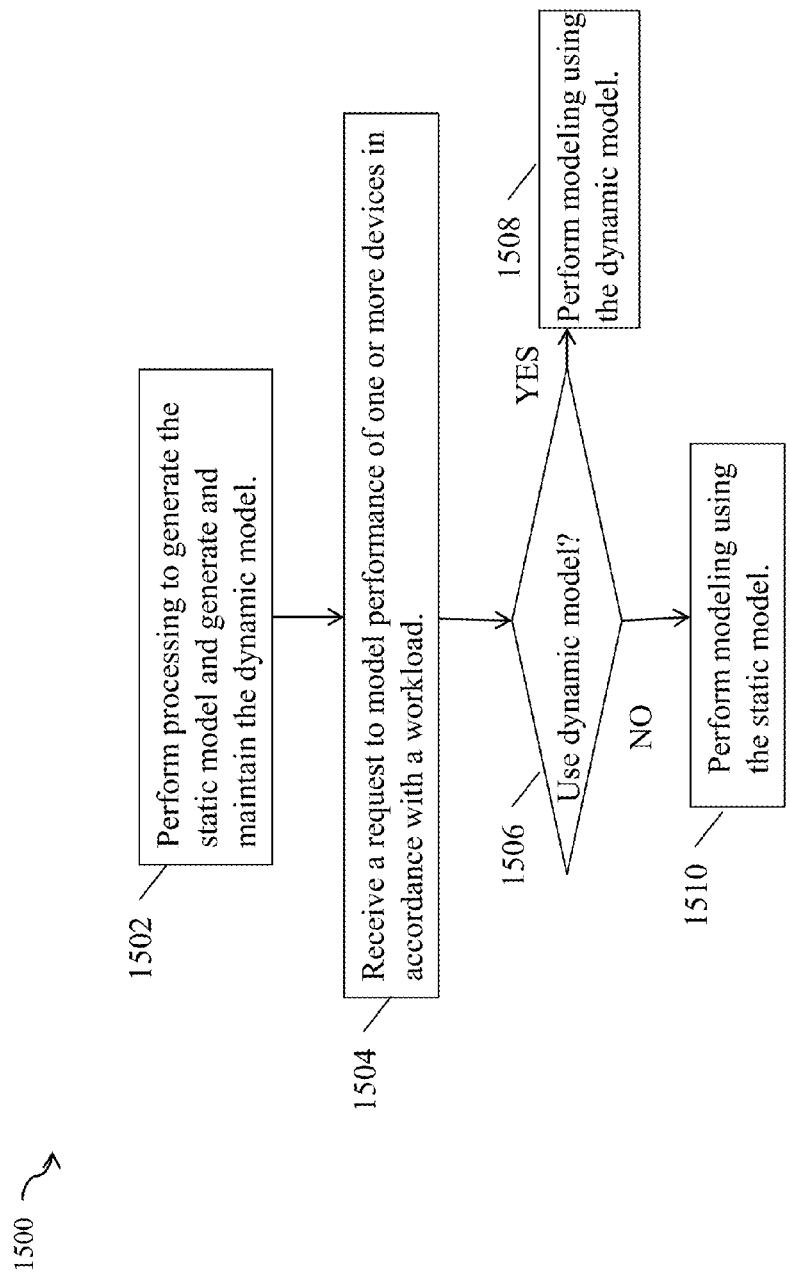
Figure 21:
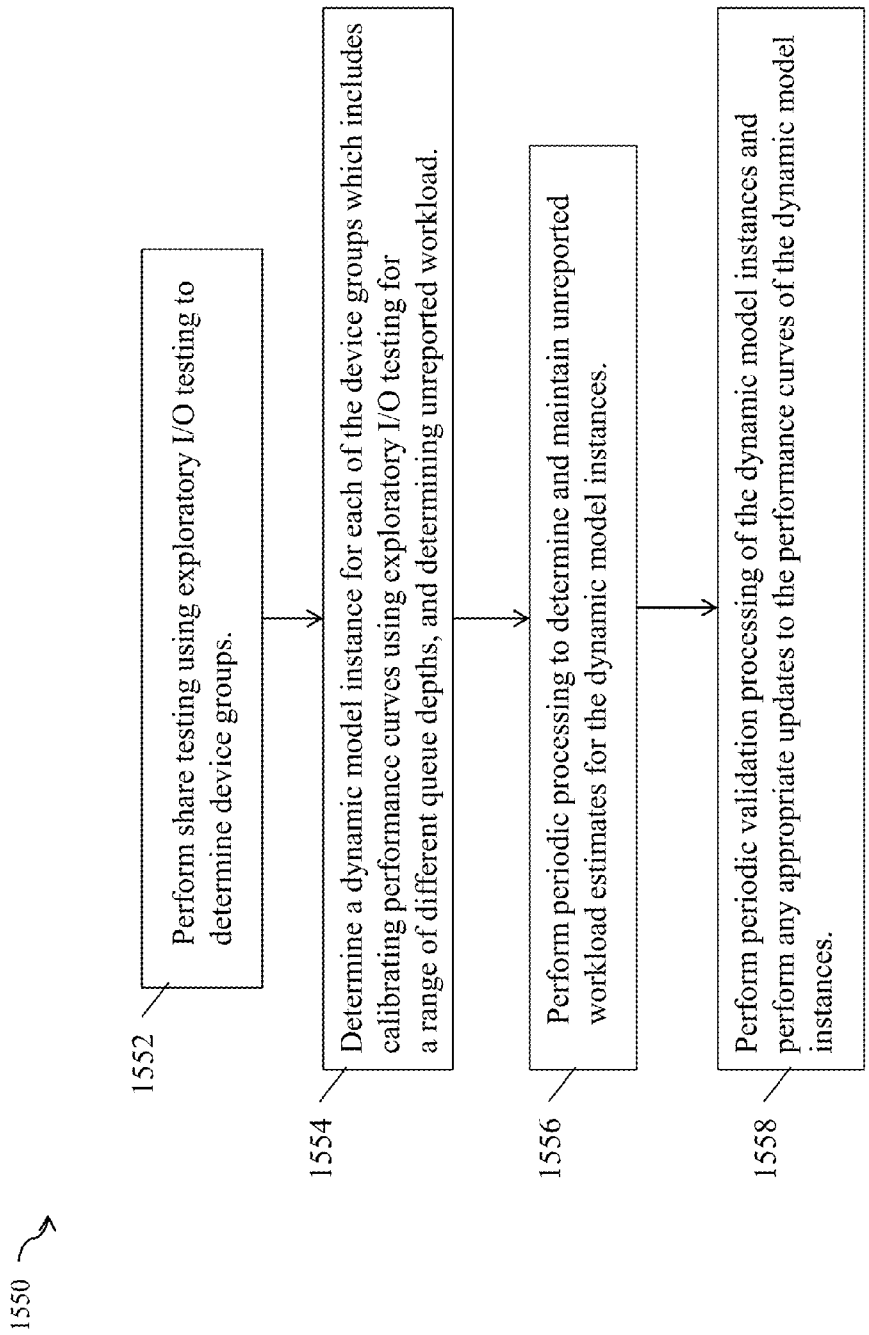

Referring now to FIGS. 20 and 21, shown are flowcharts summarizing processing described above. In the flowchart 1500 of FIG. 20, at step 1502, processing is performed to generate the static model and generate and maintain the dynamic model. In step 1504, a request may be received to model performance of one or more devices in accordance with a workload. At step 1506, a determination is made as to whether to use the dynamic model. The determination of step 1506 may generally be made in accordance with one or more criteria as described herein. If step 1506 evaluates to yes, control proceeds to step 1508 to perform modeling using the dynamic model. If step 1506 evaluates to no, control proceeds to step 1510 to perform modeling using the static model.

With reference to flowchart 1550 of FIG. 21, illustrated are processing steps that may be performed in connection with dynamic model building and maintenance. At step 1552, share testing using exploratory I/Os may be performed to determine independent device groupings with respect to BE resource sharing such as illustrated in FIG. 15. At step 1554, a dynamic model instance may be determined for each of the independent device groupings. Step 1554 may include calibrating performance curves using exploratory I/O testing for a range of different Q depths. Step 1554 may also include determining a first unreported workload for each dynamic model instance. At step 1556, processing may be performed periodically to determine and maintain unreported workload estimates for the dynamic model instances. At step 1558, processing may be performed periodically to validate the dynamic model instances and perform any appropriate updates to the performance curves of the dynamic model instances.

With reference back to FIGS. 5 and 6, the techniques herein for modeling the external data storage system may be performed by the data storage optimizer or other component used by the data storage optimizer such as included, for example, in the first data storage system 2804 of FIG. 5 and the appliance 2904 (which may also generally be referred to as a data storage system) of FIG. 6. Information predicted by the model may be used by the data storage optimizer in connection with performing data storage optimizations. For example, as described elsewhere herein, the one or more LUNs and backing external PDs of the external storage system may include some or all of the provisioned storage for a set of one or more logical devices to which I/Os are directed. Techniques herein may be used to construct a model for the one or more external PDs whereby the model is then used to predict subsequent performance such as in terms of modeled RTs of the one or more PDs of the external storage system. Such information may be used in connection with determining whether to perform a data movement optimization.

The techniques herein may be used in an embodiment where the optimizations such as data movements are performed external with respect to the data storage system including the data storage optimizer and/or model. Performing such techniques on a primary data storage system or other component other than the data storage systems being managed provides for a global view whereby the data movement optimizations may be performed viewing multiple data storage systems as a single entity for data movement where the source may be any device location in the single entity or aggregated view, and the target may be any device location in the single entity or aggregated view (e.g. may perform data movement optimizations within a single or same DS and/or across or between different DSs within a data center or federation).

As described herein, an embodiment in accordance with techniques herein may perform any one or more of the above-mentioned techniques alone, or in combination with others. For example, an embodiment may use the techniques for data storage optimizations described herein such as to evaluate which data portions are subject to data movements in connection with storage on one or more data storage systems where the optimizer performing such optimizations is located on a host, or more generally, any component external from the data storage system(s) to which the optimizations are being applied. In some embodiments, the data storage systems may be further characterized as different unitary storage systems, and the data storage movements and evaluation of candidate data portions for such data movements may be include performing such optimizations spanning multiple physical data storage systems, such as data storage arrays. The different physical data storage systems to which the data movement optimization may be applied may be heterogeneous such as from different data storage vendors, having different PD technologies and performance classifications, and the like. As also described herein, an embodiment may have the primary data storage system model an external data storage system whereby the primary data storage system may store data on the external data storage system and may also perform data storage optimizations with respect to its local PDs and also those PDs of the external system.

With reference to FIGS. 5 and 6, although techniques herein are described with reference to modeling an external data storage system having external LUNs and backing external PDs whose performance characterizations are unknown or incomplete, more generally, techniques herein may be used to model any PD whose performance characterizations are unknown or incomplete. For example with reference to FIG. 5, it may be that PDs within the primary DS 2804 also have unknown or incomplete performance characterizations. More generally, the techniques herein may also be used to model performance of other components besides PDs where performance may be measured in terms of other metrics besides RT. For example, techniques herein may be used to model performance of other physical components such as DAs, FAs, and the like, with appropriate performance metrics that may vary with the component.

It should generally be noted that the static model may obtain information from other sources besides being user supplied depending on the particular component being modeled and for which performance characteristics are being discovered such as using the exploratory I/Os. For example, if the PDs for which performance characteristics are being determined are included in the same data storage system as the code performing the processing described herein, it may be that additional information regarding the configuration of the LUNs being modeled is available such as the actual number of PDs providing backing physical storage for the LUNs rather than rely on the assumed ratio of PDs to LUNs as noted above.

In connection with techniques herein where processing is performed for modeling based on RAID configuration, such information may be obtained or presumed for modeling in a variety of different ways. For example, a user making a request to model performance of a hypothetical workload may specify an assumed RAID configuration as an input. The RAID configuration may also be based on available actual configuration information. The RAID configuration may also be modeled based on an expected or worse-case assumption. For example, it may be known that the external data storage system may support the following RAID configurations: RAID-1 and RAID-5. The modeling techniques herein may select one of the following RAID configuration as the default to use when modeling such as selection of the RAID configuration providing the worst case performance impact (e.g., RAID-5).

In connection with an embodiment in which techniques herein are used by a data storage optimizer in a multi-tiered storage environment, the data storage optimizer may classify the external LUNs and underlying external PDs based on the modeled performance characteristics. The optimizer may then use the modeled performance characteristics of the performance curves, such as RTs, to rank the external LUNs and backing external PDs relative to the RTs of other PDs having known performance characteristics. For example, a data storage system may include PDs of three storage tiers—EFD, FC 10 RPM rotating disk drives and SATA rotating disk drives.

Each of these three storage tiers have PDs with known performance capabilities and expected ranges of RTs. The techniques herein may be used to obtain the performance curves for external LUNs and the data storage optimizer may then use such discovered modeled performance information to further rank or classify the external LUNs in terms of performance capabilities relative to the other three storage tiers. This information regarding relative ranking may be used in determining what data portions having particular levels of activity to place on which PDs of the three storage tiers in combination with the external LUNs and backing external PDs.

The techniques herein may be performed by executing code which is stored on any one or more different forms of computer-readable media. Computer-readable media may include different forms of volatile (e.g., RAM) and nonvolatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of modeling comprising:
    performing first processing to build a dynamic model that models performance of components of a data storage system, the components including a plurality of storage devices, the dynamic model including a plurality of groups, wherein each of the plurality of groups does not share back-end resources with any other of the plurality of groups and each of the plurality of groups includes at least one of the plurality of storage devices, the first processing including:
        determining the plurality of groups in accordance with differences in I/O throughput obtained when issuing I/O operations to the plurality of storage devices, wherein each of the differences is determined between a first I/O throughput for a first portion of the plurality of storage devices and a second I/O throughput for the first portion, wherein the first I/O throughput is determined when issuing I/O operations to the first portion and the second I/O throughput is determined when issuing I/O operations during a same time period to the first portion and a second portion of the plurality of storage devices;
    using the dynamic model to model performance of the components; and
    performing a data movement optimization based on information including first information indicating modeled performance of the components, said data movement optimization including any of: moving data from one of the plurality of storage devices and moving data to one of the plurality of storage devices.

2. The method of claim 1, further comprising:
    selecting, in accordance with one or more criteria, one of the dynamic model and a static model to model performance of the one or more components; and
    responsive to selecting the dynamic model, modeling performance of the one or more components using the dynamic model, and otherwise using the static model to model performance of the one or more components.

3. The method of claim 2, wherein the plurality of groups includes a first group and the one or more criteria includes any of: using the dynamic model rather than the static model if calibration of the dynamic model is complete, and evaluating whether to use the dynamic model or the static model in accordance with a given workload of data operations directed to the first group of one or more of the storage devices for which performance is being modeled and in accordance with what portion of a set of one or more performance curves used by the dynamic model to model the first group of one or more storage devices has been calibrated.

4. The method of claim 3, wherein the steps of said first processing, said selecting and said modeling are performed by code executing on a first data storage system that is connected to a second data storage system, and wherein the second data storage system includes the first group of one or more storage devices being modeled.

5. The method of claim 4, wherein said first processing includes generating the set of one or more performance curves to model response time of the first group of one or more storage devices for the given workload of data operations directed to the first group of one or more storage devices.

6. The method of claim 5, wherein the one or more criteria includes a status indicator and the status indicator denotes that calibration of the dynamic model is complete when performance curves have been generated that model response time for the plurality of storage devices.

7. The method of claim 5, wherein said first processing includes:
    performing exploratory I/O testing for a plurality of queue depths and a plurality of I/O sizes to determine the set of one or more performance curves, wherein each of said plurality of queue depths represents an average number of I/O operations waiting to be serviced.

8. The method of claim 7, wherein said back-end resources include any of a same physical storage device and a same disk adapter.

9. The method of claim 8, wherein a plurality of sets of one or more performance curves are generated corresponding to the plurality of groups, each of the plurality of groups including one or more storage devices of the second data storage system, each of the plurality of sets representing performance curves modeling performance for a different one of the plurality of groups.

10. The method of claim 9, wherein a different unreported workload estimate is maintained for each of the plurality of sets of performance curves.

11. The method of claim 5, wherein the set of one or more performance curves is used to predict a response time for a given workload.

12. The method of claim 11, wherein any of interpolation and extrapolation are performed using the set of one or more performance curves to predict the response time for the given workload.

13. The method of claim 5, wherein validation testing is performed periodically to determine whether any adjustments to the set of one or more performance curves are needed.

14. A method of modeling comprising:
    determining, in accordance with one or more criteria, whether to use a dynamic model or a static model to model performance of one or more components of a data storage system; and
    modeling performance of the one or more components using the dynamic model if said determining indicates to use the dynamic model, and otherwise using the static model to model performance of the one or more components, wherein the one or more components includes a first set of one or more storage devices, and the one or more criteria includes any of: using the dynamic model rather than the static model if calibration of the dynamic model is complete, and evaluating whether to use the dynamic model or the static model in accordance with a given workload of data operations directed to the first set of one or more of the storage devices for which performance is being modeled and in accordance with what portion of a set of one or more performance curves used by the dynamic model to model the first set of one or more storage devices has been calibrated, and wherein the steps of said determining and said modeling are performed by code executing on a first data storage system that is connected to a second data storage system, and wherein the second data storage system includes the first set of one or more storage devices being modeled, wherein the dynamic model is generated by performing first processing, where said first processing includes generating the set of one or more performance curves to model response time of the first set of one or more storage devices for the given workload of data operations to the first set of one or more storage devices, and wherein said first processing includes:

performing exploratory I/O testing for a plurality of queue depths and a plurality of I/O sizes to determine the set of one or more performance curves, wherein each of said plurality of queue depths represents an average number of I/O operations waiting to be serviced; and determining whether the first set of one or more storage devices shares back-end resources of the second data storage system with a second set of one or more storage devices, said back-end resources including any of a same physical storage device and a same disk adapter, and wherein said determining whether the first set of one or more storage devices shares back-end resources with the second set of one or more storage devices includes:

issuing, for a first time period, I/O operations to the first set of one or more storage devices at a rate to maintain an average predetermined queue depth;

obtaining a first average observed response time representing an average response time for I/O operations directed to the first set of one or more storage devices for the first time period;

issuing, for a second time period, I/O operations to the first set of one or more storage devices and the second set of one or more storage devices at a rate to maintain the average predetermined queue depth for each of the first set of one or more storage devices and the second set of one or more storage devices;

obtaining for the second period of time a second average observed response time representing an average response time for I/O operations directed to the first set of one or more storage devices for the second time period;

determining a first quantity in accordance with the average predetermined queue depth and the first average observed response time, said first quantity representing modeled I/O throughput for the first time period for the first set of one or more storage devices;

determining a second quantity in accordance with the average predetermined queue depth and the second average observed response time, said second quantity representing modeled I/O throughput for the second time period for the first set of one or more storage devices; and determining whether a difference between the first quantity and the second quantity is less than a predetermined threshold.

15. The method of claim 14, wherein if the difference is less than the predetermined threshold, determining that the first set of one or more storage devices does not share back-end resources of the second data storage system with the second set of one or more storage devices.

16. The method of claim 14, wherein if the difference is not less than the predetermined threshold, determining that the first set of one or more storage devices does share back-end resources of the second data storage system with the second set of one or more storage devices.

17. A system comprising:

a first data storage system;

a set of one or more hosts issuing data operations to the first data storage system;

a second data storage system connected to the first data storage system, wherein the second data storage system includes a plurality of storage devices; and wherein the first data storage system includes a computer readable medium, the computer readable medium including first code stored thereon and second code stored thereon, said first code including code that performs processing in connection with data storage movement optimizations using one or more models including a dynamic model, and wherein said second code includes code that generates and maintains the dynamic model used to model performance of storage devices, wherein the first code comprises code that, when executed, performs a method comprising:

selecting, in accordance with one or more criteria, one of the dynamic model and a static model used to model performance of the plurality of storage devices of the second data storage system; and responsive to selecting the dynamic model, modeling performance of the plurality of storage devices using the dynamic model, and otherwise using the static model to model performance of the plurality of storage devices; and the second code comprising code that, when executed, performs a method comprising:

performing first processing that determines a plurality of device sets in accordance with differences in I/O throughput obtained when issuing I/O operations to the plurality of storage devices, each of the device sets including one or more of the plurality of storage devices of the second data storage system, wherein each of the plurality of device sets is determined as not sharing back-end resources of the second data storage system with any other of the plurality of device sets, each of the differences is determined between a first I/O throughput for a first portion of the plurality of storage devices and a second I/O throughput for the first portion, wherein the first I/O throughput is determined when issuing I/O operations to the first portion and the second I/O throughput is determined when issuing I/O operations during a same time period to the first portion and a second portion of the plurality of storage devices; and performing second processing that determines a plurality of sets of performance curves corresponding to the plurality of device sets, each of the plurality of sets of performance curves representing performance curves modeling performance for a different one of the plurality of device sets.

18. The system of claim 17, wherein said second processing includes performing exploratory I/O testing for a plurality of queue depths and a plurality of I/O sizes to determine to the plurality of sets of performance curves, wherein each of said plurality of queue depths represents an average number of I/O operations waiting to be serviced.

19. A system comprising:
a first data storage system;
a set of one or more hosts issuing data operations to the first data storage system;
a second data storage system connected to the first data storage system, wherein the second data storage system includes a plurality of storage devices; and
wherein the first data storage system includes a computer readable medium, the computer readable medium including first code stored thereon and second code stored thereon, said first code including code that performs processing in connection with data storage movement optimizations using one or more models including a dynamic model, and wherein said second code includes code that generates and maintains the dynamic model used to model performance of storage devices, the second code comprising code that, when executed, performs a method comprising:
  performing first processing that determines a plurality of device sets, each of the device sets including one or more of the plurality of storage devices of the second data storage system, wherein each of the plurality of device sets is determined as not sharing back-end resources of the second data storage system with any other of the plurality of device sets; and
  performing second processing that determines a plurality of sets of performance curves corresponding to the plurality of device sets, each of the plurality of sets of performance curves representing performance curves modeling performance for a different one of the plurality of device sets, wherein each of the plurality of device sets is determined as not sharing back-end resources of the second data storage system with any other of the plurality of device sets, wherein said back-end resources include any of a same physical storage device and a same disk adapter and wherein the first processing includes:
issuing, for a first time period, I/O operations to a first of the plurality of device sets at a rate to maintain an average predetermined queue depth;
obtaining a first average observed response time representing an average response time for I/O operations directed to the first device set of one or more storage devices for the first time period;
issuing, for a second time period, I/O operations to the first device set and a second of the plurality of device sets at a rate to maintain the average predetermined queue depth for each of the first device set and the second device set;
obtaining for the second period of time a second average observed response time representing an average response time for I/O operations directed to the first device set for the second time period;
determining a first quantity in accordance with the average predetermined queue depth and the first average observed response time, said first quantity representing modeled I/O throughput for the first time period for the first device set;
determining a second quantity in accordance with the average predetermined queue depth and the second average observed response time, said second quantity representing modeled I/O throughput for the second time period for the first device set;
determining whether a difference between the first quantity and the second quantity is less than a predetermined threshold; and
determining that the difference is less than the predetermined threshold thereby indicating that the first device set does not share back-end resources of the second data storage system with the second device set of one or more storage devices.

20. A system comprising:
a first data storage system;
a set of one or more hosts issuing data operations to the first data storage system;
a second data storage system connected to the first data storage system, wherein the second data storage system includes a plurality of storage devices; and
wherein the first data storage system includes a computer readable medium, the computer readable medium including first code stored thereon and second code stored thereon, said first code including code that performs processing in connection with data storage movement optimizations using one or more models including a dynamic model, and wherein said second code includes code that generates and maintains the dynamic model used to model performance of storage devices, the second code comprising code that, when executed, performs a method comprising:
  performing first processing that determines a plurality of device sets, each of the device sets including one or more of the plurality of storage devices of the second data storage system, wherein each of the plurality of device sets is determined as not sharing back-end resources of the second data storage system with any other of the plurality of device sets; and
  performing second processing that determines a plurality of sets of performance curves corresponding to the plurality of device sets, each of the plurality of sets of performance curves representing performance curves modeling performance for a different one of the plurality of device sets, wherein each of the plurality of device sets is determined as not sharing back-end resources of the second data storage system with any other of the plurality of device sets, wherein said second processing includes performing exploratory I/O testing for a plurality of queue depths and a plurality of I/O sizes to determine to the plurality of sets of performance curves, wherein each of said plurality of queue depths represents an average number of I/O operations waiting to be serviced, and wherein said second processing includes generating a first of the plurality of sets of performance curves for a first of the plurality of device sets, said generating comprising:
issuing, for a plurality of time periods, I/O operations to the first device set, wherein for each of the plurality of time periods, I/O operations are issued at a rate to maintain a different average queue depth;
obtaining, for each of the plurality of time periods, an average observed response time representing an average response time for I/O operations directed to the first device set for said each time period;
determining, for each of the plurality of time periods, a first quantity that in accordance with the average queue depth maintained while issuing I/O operations during said each time period and in accordance with the average observed response time for said each time period, said first quantity representing modeled I/O throughput for said each time period for the first device set;
determining a plurality of data points, each of said plurality of data points representing the average observed response time and the first quantity for one of the plurality of time periods; and producing one of the performance curves of the first set using the plurality of data points, wherein the I/O operations issued during said issuing are read operations expected to cause a cache miss and each of the I/O operations are of a same size.

21. A non-transitory computer readable medium comprising code stored thereon that, when executed, performs a method for modeling comprising:

performing first processing to build a dynamic model that models performance of components of a data storage system, the components including a plurality of storage devices, the dynamic model including a plurality of groups, wherein each of the plurality of groups does not share back-end resources with any other of the plurality of groups and each of the plurality of groups includes at least one of the plurality of storage devices, the first processing including:

determining the plurality of groups in accordance with differences in I/O throughput obtained when issuing I/O operations to the plurality of storage devices, wherein each of the differences is determined between a first I/O throughput for a first portion of the plurality of storage devices and a second I/O throughput for the first portion, wherein the first I/O throughput is determined when issuing I/O operations to the first portion and the second I/O throughput is determined when issuing I/O operations during a same time period to the first portion and a second portion of the plurality of storage devices;

using the dynamic model to model performance of the components; and performing a data movement optimization based on information including first information indicating modeled performance of the components, said data movement optimization including any of: moving data from one of the plurality of storage devices and moving data to one of the plurality of storage devices.

* * * * *